(12) United States Patent
Honjo

(10) Patent No.: US 12,419,128 B2
(45) Date of Patent: Sep. 16, 2025

(54) SOLID-STATE IMAGING ELEMENT AND VIDEO RECORDING APPARATUS

(71) Applicant: SONY SEMICONDUCTOR SOLUTIONS CORPORATION, Kanagawa (JP)

(72) Inventor: Akiko Honjo, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/631,370

(22) Filed: Apr. 10, 2024

(65) Prior Publication Data

US 2024/0258355 A1    Aug. 1, 2024

Related U.S. Application Data

(63) Continuation of application No. 17/298,875, filed as application No. PCT/JP2019/044659 on Nov. 14, 2019, now Pat. No. 11,984,466.

(30) Foreign Application Priority Data

Dec. 13, 2018   (JP) ................................ 2018-233437

(51) Int. Cl.
  *H04N 25/76*   (2023.01)
  *H10F 39/00*   (2025.01)
  *H10F 39/18*   (2025.01)

(52) U.S. Cl.
  CPC .......... *H10F 39/809* (2025.01); *H04N 25/76* (2023.01); *H10F 39/18* (2025.01);
  (Continued)

(58) Field of Classification Search
  CPC ...... H04N 25/77; H04N 25/779; H04N 25/78; H04N 25/79; H10F 39/80373
  (Continued)

(56) References Cited

U.S. PATENT DOCUMENTS 10,791,292 B1 * 9/2020 Geurts ................ H04N 25/771
2011/0155893 A1 6/2011 Endo et al.
(Continued)

FOREIGN PATENT DOCUMENTS

CN   102668081 A   9/2012
CN   102683410 A   9/2012
(Continued)

OTHER PUBLICATIONS

International Search Report and Written Opinion for International (PCT) Patent Application No. PCT/JP2019/044659, dated Feb. 4, 2020, 6 pages.
(Continued)

*Primary Examiner* — Anthony J Daniels

(74) *Attorney, Agent, or Firm* — SHERIDAN ROSS P.C.

(57) ABSTRACT

A solid-state imaging element according to the present disclosure includes: a first semiconductor substrate that includes a floating diffusion that temporarily holds an electric signal output from a photoelectric conversion element; and a second semiconductor substrate that faces the first semiconductor substrate, in which the second semiconductor substrate includes a first transistor disposed on a side facing the first semiconductor substrate, the first transistor including: a channel extending along a thickness direction of the second semiconductor substrate; and a multi-gate extending along the thickness direction of the second semiconductor substrate and sandwiching the channel, and the multi-gate of the first transistor is connected to the floating diffusion.

20 Claims, 36 Drawing Sheets

(52) U.S. Cl.
    CPC ..... *H10F 39/80373* (2025.01); *H10F 39/811* (2025.01); *H10F 39/813* (2025.01)

(58) Field of Classification Search
    USPC .......................................................... 348/294
    See application file for complete search history.

(56) References Cited

U.S. PATENT DOCUMENTS

| | | | |
|---|---|---|---|
| 2012/0228682 | A1 | 9/2012 | Yoshida |
| 2014/0327059 | A1 | 11/2014 | Ammo |
| 2015/0179691 | A1* | 6/2015 | Yanagita ............. H01L 27/1469 257/292 |
| 2016/0056201 | A1* | 2/2016 | Yamashita .......... H01L 27/1464 257/292 |
| 2016/0118425 | A1 | 4/2016 | Kurokawa |
| 2017/0200757 | A1 | 7/2017 | Ihara |
| 2019/0123079 | A1 | 4/2019 | Kudoh |
| 2019/0297292 | A1 | 9/2019 | Hynecek |
| 2022/0059595 | A1 | 2/2022 | Honjo |

FOREIGN PATENT DOCUMENTS

| | | |
|---|---|---|
| CN | 103797579 A | 5/2014 |
| CN | 103959468 A | 7/2014 |
| CN | 205752180 U | 11/2016 |
| CN | 108886046 A | 11/2018 |
| EP | 2518768 | 10/2012 |
| EP | 3349250 | 7/2018 |
| EP | 3439040 | 2/2019 |
| JP | 2010-245506 | 10/2010 |
| JP | 2014-022561 | 2/2014 |
| JP | 2015-032687 | 2/2015 |
| JP | 2017-183636 | 10/2017 |
| JP | 2018-195803 | 12/2018 |
| KR | 10-2014-0113633 | 9/2014 |
| KR | 10-2015-0037812 | 4/2015 |
| TW | 201320317 | 5/2013 |
| WO | WO 2011/077580 | 6/2011 |
| WO | WO 2013/094430 | 6/2013 |
| WO | WO 2014/013696 | 1/2014 |
| WO | WO-2015016140 A1 | 2/2015 |
| WO | WO 2017/169884 | 10/2017 |
| WO | WO 2018/173754 | 9/2018 |
| WO | WO 2018/198690 | 11/2018 |

OTHER PUBLICATIONS

Official Action for U.S. Appl. No. 17/298,875, dated Sep. 21, 2023, 11 pages.

Notice of Allowance for U.S. Appl. No. 17/298,875, dated Jan. 12, 2024, 7 pages.

Notice of Allowance for U.S. Appl. No. 17/298,875, dated Mar. 5, 2024, 2 pages.

* cited by examiner (a)

(b)

SOLID-STATE IMAGING ELEMENT AND VIDEO RECORDING APPARATUS

CROSS REFERENCE TO RELATED APPLICATIONS

This application is a continuation of U.S. patent application Ser. No. 17/298,875, filed Jun. 1, 2021, which is a national stage application under 35 U.S.C. 371 and claims the benefit of PCT Application No. PCT/JP2019/044659, having an international filing date of Nov. 14, 2019, which designated the United States, which PCT application claimed the benefit of Japanese Patent Application No. 2018-233437 filed Dec. 13, 2018, the entire disclosures of each of which are incorporated herein by reference.

TECHNICAL FIELD

The present disclosure relates to a solid-state imaging element and a video recording apparatus.

BACKGROUND ART

There is a three-dimensional packaging technology for stacking a plurality of semiconductor substrates. For example, a solid-state imaging element having a known configuration includes a first semiconductor substrate on which a pixel region is formed and a second semiconductor substrate on which a logic circuit is formed (see Patent Document 1, for example).

CITATION LIST

Patent Document

Patent Document 1: Japanese Patent Application Laid-Open No. 2010-245506

SUMMARY OF THE INVENTION

Problems to be Solved by the Invention

The solid-state imaging element disclosed in Patent Document 1 fails to secure a sufficient space for a pixel transistor to be disposed. Then, a conceivable solution may be, for example, sub-dividing a substrate into a substrate on which a photoelectric conversion element is formed and a substrate on which a pixel transistor is formed, and stacking these substrates.

However, such a configuration may need a longer wiring that connects the substrate on which the photoelectric conversion element is formed and the substrate on which the pixel transistor is formed, resulting in a reduced photoelectric conversion efficiency of the photoelectric conversion element.

Therefore, the present disclosure proposes a solid-state imaging element and a video recording apparatus that are capable of improving the photoelectric conversion efficiency of the photoelectric conversion element by reducing the length of the wiring between stacked substrates.

Solutions to Problems

A solid-state imaging element according to the present disclosure includes: a first semiconductor substrate that includes a floating diffusion that temporarily holds an electric signal output from a photoelectric conversion element; and a second semiconductor substrate that faces the first semiconductor substrate, in which the second semiconductor substrate includes a first transistor disposed on a side facing the first semiconductor substrate, the first transistor including: a channel extending along a thickness direction of the second semiconductor substrate; and a multi-gate extending along the thickness direction of the second semiconductor substrate and sandwiching the channel, and the multi-gate of the first transistor is connected to the floating diffusion.

MODE FOR CARRYING OUT THE INVENTION

Figure 1:
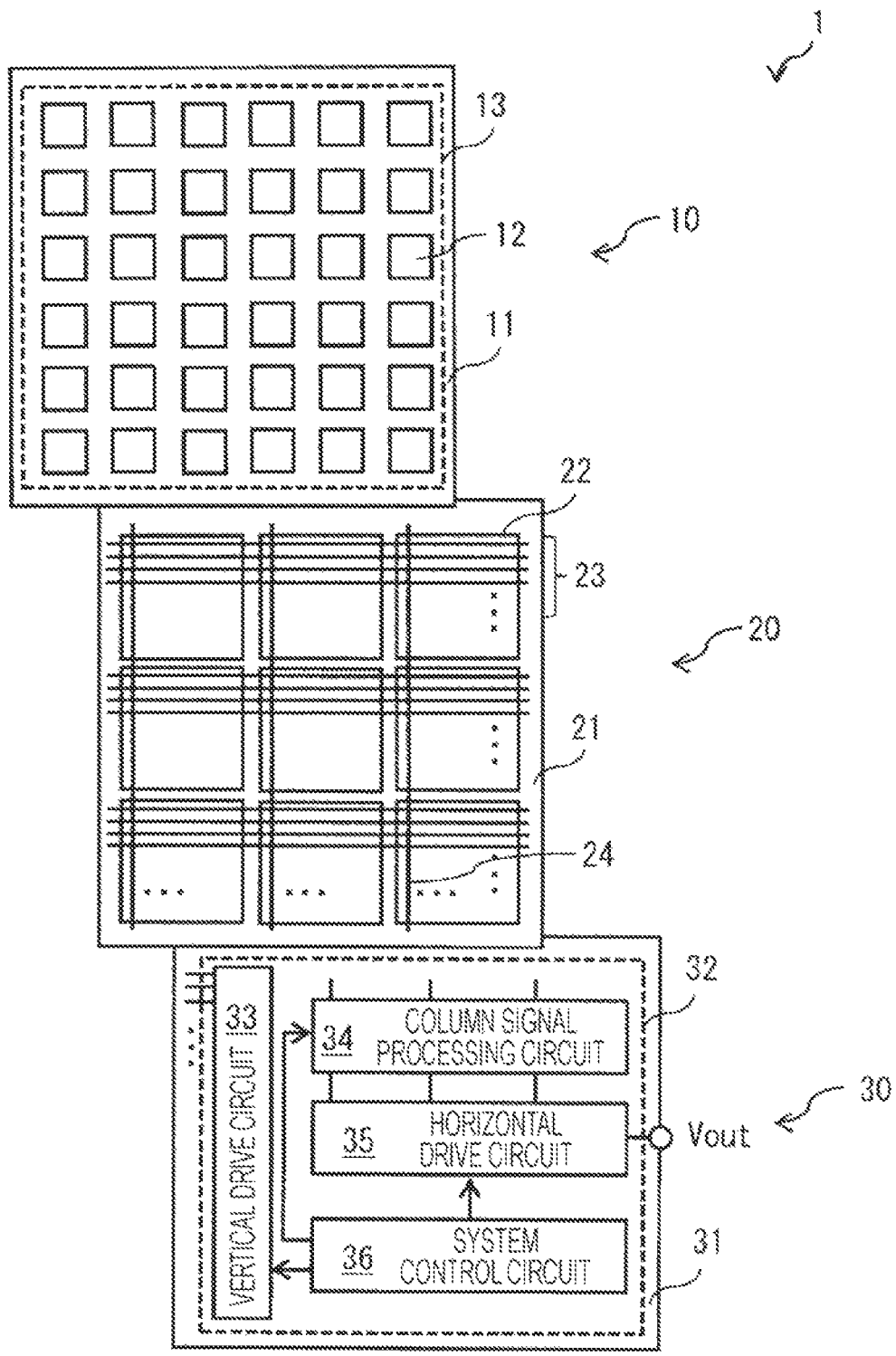
FIG. 1 is a diagram illustrating an example schematic configuration of a solid-state imaging element applied to embodiments of the present disclosure.

Embodiments of the present disclosure will now be described in detail on the basis of the drawings. In the following individual embodiments, identical reference numerals are given to identical parts, and duplicate descriptions are omitted.

[Example Schematic Configuration of Solid-State Imaging Element]

The following describes an example schematic configuration of a solid-state imaging element with reference to FIGS. 1 to 19.

(Example Circuitry Configuration of Solid-State Imaging Element)

FIG. 1 is a diagram illustrating an example schematic configuration of a solid-state imaging element 1 applied to embodiments of the present disclosure. The solid-state imaging element 1 converts received light into an electric signal and outputs the electric signal as a pixel signal. In the illustrated example, the solid-state imaging element 1 is formed to be a complementary metal oxide semiconductor (CMOS) image sensor.

As illustrated in FIG. 1, the solid-state imaging element 1 includes three substrates: a first substrate 10, a second substrate 20, and a third substrate 30. The solid-state imaging element 1 is an imaging device having a three-dimensional structure in which these three substrates are stuck together. The first substrate 10, the second substrate 20, and the third substrate 30 are stacked in the order mentioned.

The first substrate 10 includes a plurality of sensor pixels 12 disposed on a semiconductor substrate 11 to perform photoelectric conversion. The plurality of sensor pixels 12 is provided in a matrix within a pixel region 13 of the first substrate 10. The second substrate 20 includes readout circuits 22 disposed on a semiconductor substrate 21 to output pixel signals based on the electric charge output from the sensor pixels 12, where every single readout circuit 22 is disposed for four sensor pixels 12. The second substrate 20 includes a plurality of pixel drive lines 23 extending along the row direction and a plurality of vertical signal lines 24 extending along the column direction. The third substrate 30 includes a logic circuit 32 disposed on a semiconductor substrate 31 to process pixel signals. The logic circuit 32 includes, for example, a vertical drive circuit 33, a column signal processing circuit 34, a horizontal drive circuit 35, and a system control circuit 36. The logic circuit 32, or more specifically the horizontal drive circuit 35, outputs an output voltage Vout for each sensor pixel 12 to the outside. In the logic circuit 32, for example, a low resistance region including a silicide formed by using a self-aligned silicide (SALICIDE) process, such as $CoSi_2$ or NiSi, may be formed on a surface of the dopant diffusion region in contact with the source electrode and the drain electrode.

The vertical drive circuit 33 selects, for example, a plurality of sensor pixels 12 sequentially row by row. The column signal processing circuit 34 performs, for example, correlated double sampling (CDS) processing on the pixel signals output from the individual sensor pixels 12 in the row selected by the vertical drive circuit 33. For example, the column signal processing circuit 34 extracts signal levels of the pixel signals by performing the CDS processing and holds pixel data corresponding to the amount of light received by each sensor pixel 12. The horizontal drive circuit 35 outputs, for example, the pixel data held in the column signal processing circuit 34 to the outside sequentially. The system control circuit 36 controls, for example, driving of the individual blocks: the vertical drive circuit 33, the column signal processing circuit 34, and the horizontal drive circuit 35 in the logic circuit 32.

FIGS. 2 to 5 each illustrate an example of the sensor pixel 12 and readout circuit 22. Description is given below regarding a case where a single readout circuit 22 is shared by four sensor pixels 12. The term "shared" here represents that outputs from the four sensor pixels 12 are input to the readout circuit 22 used in common. Note that, however, the unit of sharing is not limited to a specific number of pixels. For example, an output from one sensor pixel 12 may be input to one readout circuit 22. Furthermore, outputs from four sensor pixels 12 may be input to one readout circuit 22, as in the present example.

Figure 2:
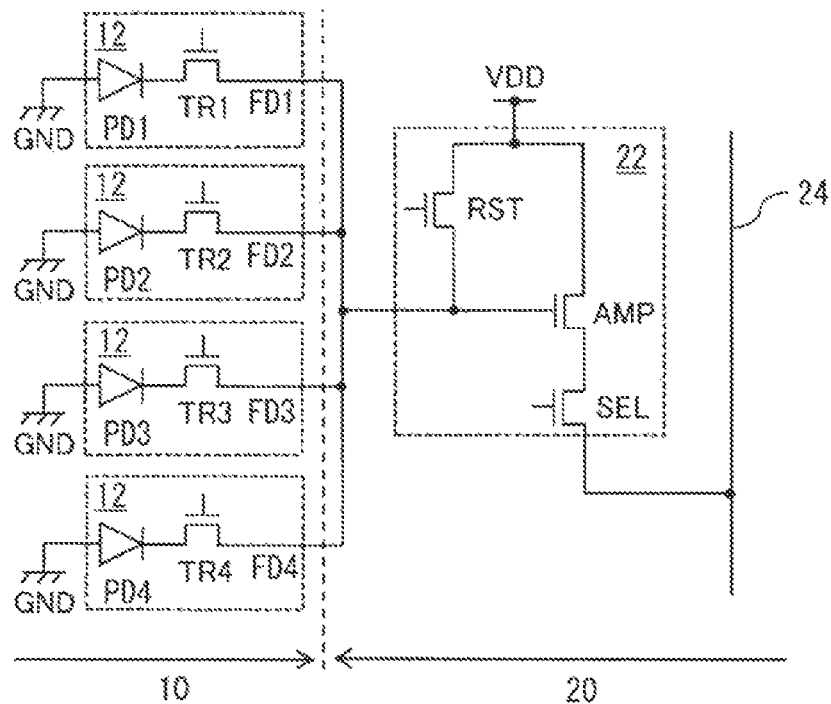
FIG. 2 is a diagram illustrating an example of the sensor pixel and readout circuit in FIG. 1.

As illustrated in FIG. 2, each sensor pixel 12 includes components in common with other sensor pixels 12. In FIG. 2, in order to distinguish components among the individual sensor pixels 12, an identification number 1, 2, 3, or 4 is suffixed to the reference symbol of the component of each sensor pixel 12. An identification number is hereinafter suffixed to the reference symbol of a component of each sensor pixel 12 when components need to be distinguished among the individual sensor pixels 12. An identification number to be suffixed to the reference symbol of a component of each sensor pixel 12 is omitted when components do not need to be distinguished among the individual sensor pixels 12.

Each sensor pixel 12 includes, for example, a photodiode PD, a transfer transistor TR that is electrically connected to the photodiode PD, and a floating diffusion FD that temporarily holds the electric charge output from the photodiode PD via the transfer transistor TR. The photodiode PD corresponds to a specific example of a "photoelectric conversion element" of the present disclosure. The photodiode PD performs photoelectric conversion to generate electric charge in accordance with the amount of received light. The cathode of the photodiode PD is electrically connected to the source of the transfer transistor TR, and the anode of the photodiode PD is electrically connected to a reference potential line such as a ground line (GND). The drain of the transfer transistor TR is electrically connected to the floating diffusion FD, and the gate of the transfer transistor TR is electrically connected to the pixel drive line 23 (see FIG. 1). The transfer transistor TR is, for example, a CMOS transistor.

The individual floating diffusions FD of the sensor pixels 12 sharing one readout circuit 22 are electrically connected to one another while being electrically connected to an input terminal of the shared readout circuit 22. The readout circuit 22 includes, for example, a reset transistor RST, a selection transistor SEL, and an amplification transistor AMP. Note that the selection transistor SEL may be omitted if necessary. The source of the reset transistor RST, the source being the input terminal of the readout circuit 22, is electrically connected to the floating diffusion FD, and the drain of the reset transistor RST is electrically connected to a power supply line VDD and to the drain of the amplification transistor AMP. The gate of the reset transistor RST is electrically connected to the pixel drive line 23 (see FIG. 1). The source of the amplification transistor AMP is electrically connected to the drain of the selection transistor SEL, and the gate of the amplification transistor AMP is electrically connected to the source of the reset transistor RST. The source of the selection transistor SEL, the source being the output terminal of the readout circuit 22, is electrically connected to the vertical signal line 24, and the gate of the selection transistor SEL is electrically connected to the pixel drive line 23 (see FIG. 1).

When the transfer transistor TR is turned on, the electric charge in the photodiode PD is transferred to the floating diffusion FD. The reset transistor RST resets the potential of the floating diffusion FD to a predetermined potential. When the reset transistor RST is turned on, the potential of the floating diffusion FD is reset to the potential of the power supply line VDD. The selection transistor SEL controls the timing of outputting a pixel signal from the readout circuit 22. The amplification transistor AMP generates, as a pixel signal, a signal of a voltage corresponding to the level of the electric charge held in the floating diffusion FD. The amplification transistor AMP, which is included in a source-follower type amplifier, outputs a pixel signal of a voltage corresponding to the level of the electric charge generated in the photodiode PD. When the selection transistor SEL is turned on, the amplification transistor AMP amplifies the potential of the floating diffusion FD and outputs a voltage corresponding to the potential to the column signal processing circuit 34 via the vertical signal line 24. The reset transistor RST, the amplification transistor AMP, and the selection transistor SEL are, for example, CMOS transistors.

Figure 3:
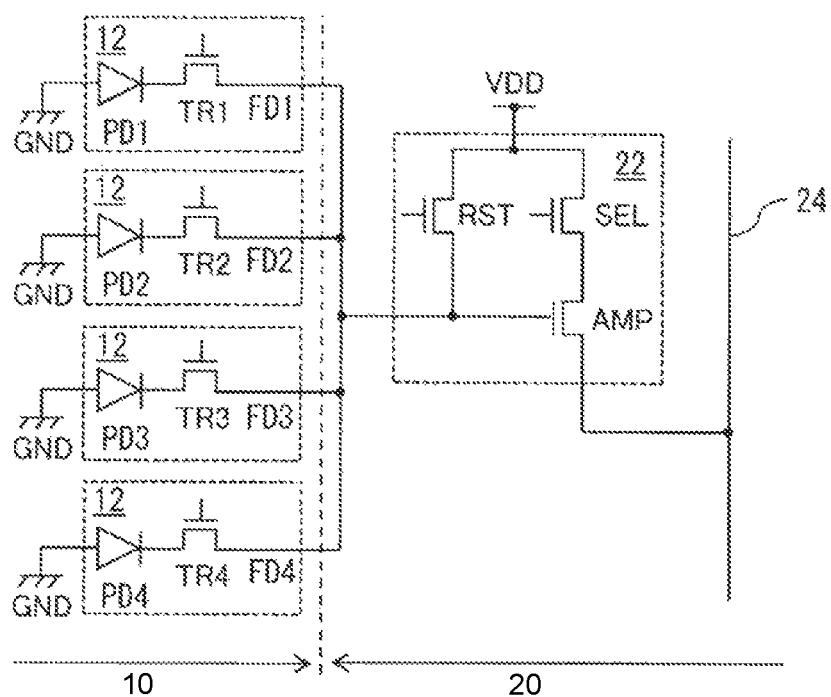
FIG. 3 is a diagram illustrating an example of the sensor pixel and readout circuit in FIG. 1.

Note that the selection transistor SEL may be disposed between the power supply line VDD and the amplification transistor AMP, as shown in FIG. 3. In this case, the drain of the reset transistor RST is electrically connected to the power supply line VDD and to the drain of the selection transistor SEL. The source of the selection transistor SEL is electrically connected to the drain of the amplification transistor AMP, and the gate of the selection transistor SEL is electrically connected to the pixel drive line 23 (see FIG. 1). The source of the amplification transistor AMP, the source being the output terminal of the readout circuit 22, is electrically connected to the vertical signal line 24, and the gate of the amplification transistor AMP is electrically connected to the source of the reset transistor RST.

Figure 4:
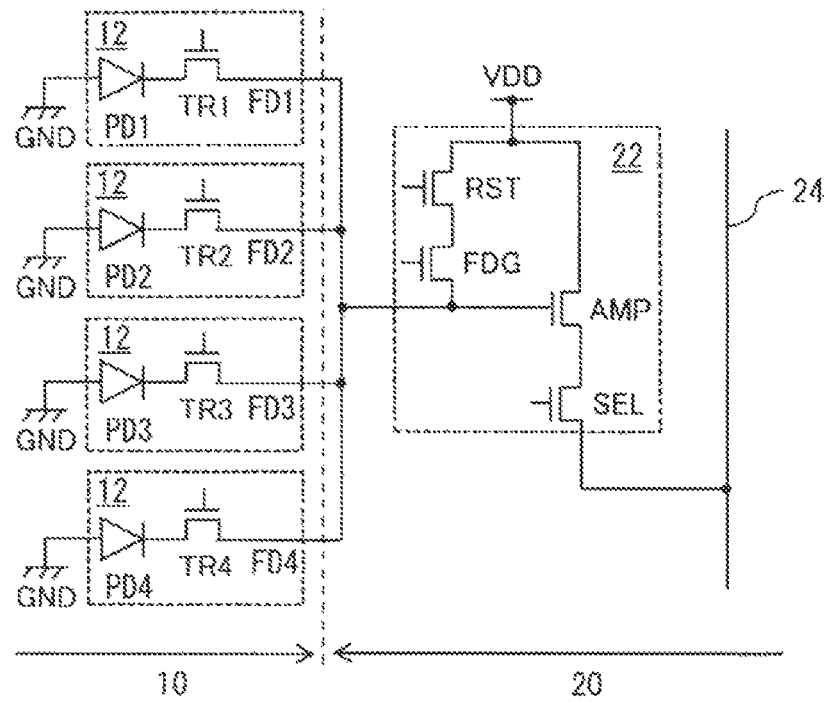
FIG. 4 is a diagram illustrating an example of the sensor pixel and readout circuit in FIG. 1.
Figure 5:
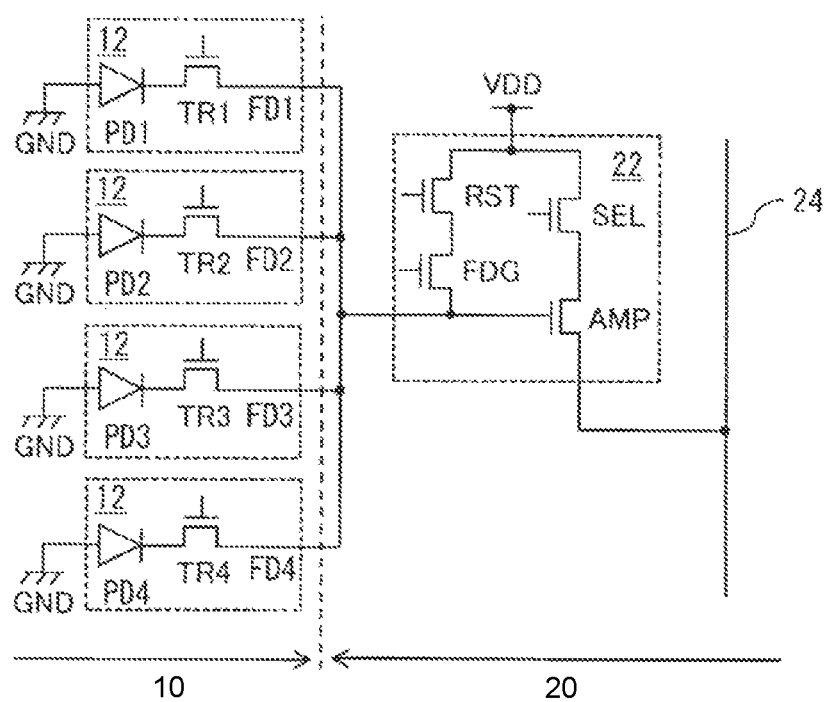
FIG. 5 is a diagram illustrating an example of the sensor pixel and readout circuit in FIG. 1.

Furthermore, as illustrated in FIGS. 4 and 5, an FD transfer transistor FDG may be provided between the source of the reset transistor RST and the gate of the amplification transistor AMP. The FD transfer transistor FDG is used for switching the conversion efficiency. In general, low-level pixel signals are generated during imaging in a dark place. On the basis of Q=CV, during charge-voltage conversion, a lower voltage V will be generated through conversion in the amplification transistor AMP as the capacitance C of the floating diffusion FD is larger. In contrast, high-level pixel signals are generated during imaging in a bright place, and thus the floating diffusion FD will fail to accept all the electric charge from the photodiode PD unless the FD capacitance C is large. Furthermore, the FD capacitance C needs to be large enough to prevent the voltage V generated through conversion in the amplification transistor AMP from being too high. In view of these matters, when the FD transfer transistor FDG is turned on, the total FD capacitance C is increased due to an additional gate capacitance of the FD transfer transistor FDG. In contrast, when the FD transfer transistor FDG is turned off, the total FD capacitance C is decreased. In this way, by turning on/off the FD transfer transistor FDG, the FD capacitance C can be made variable to switch the conversion efficiency.

Figure 6:
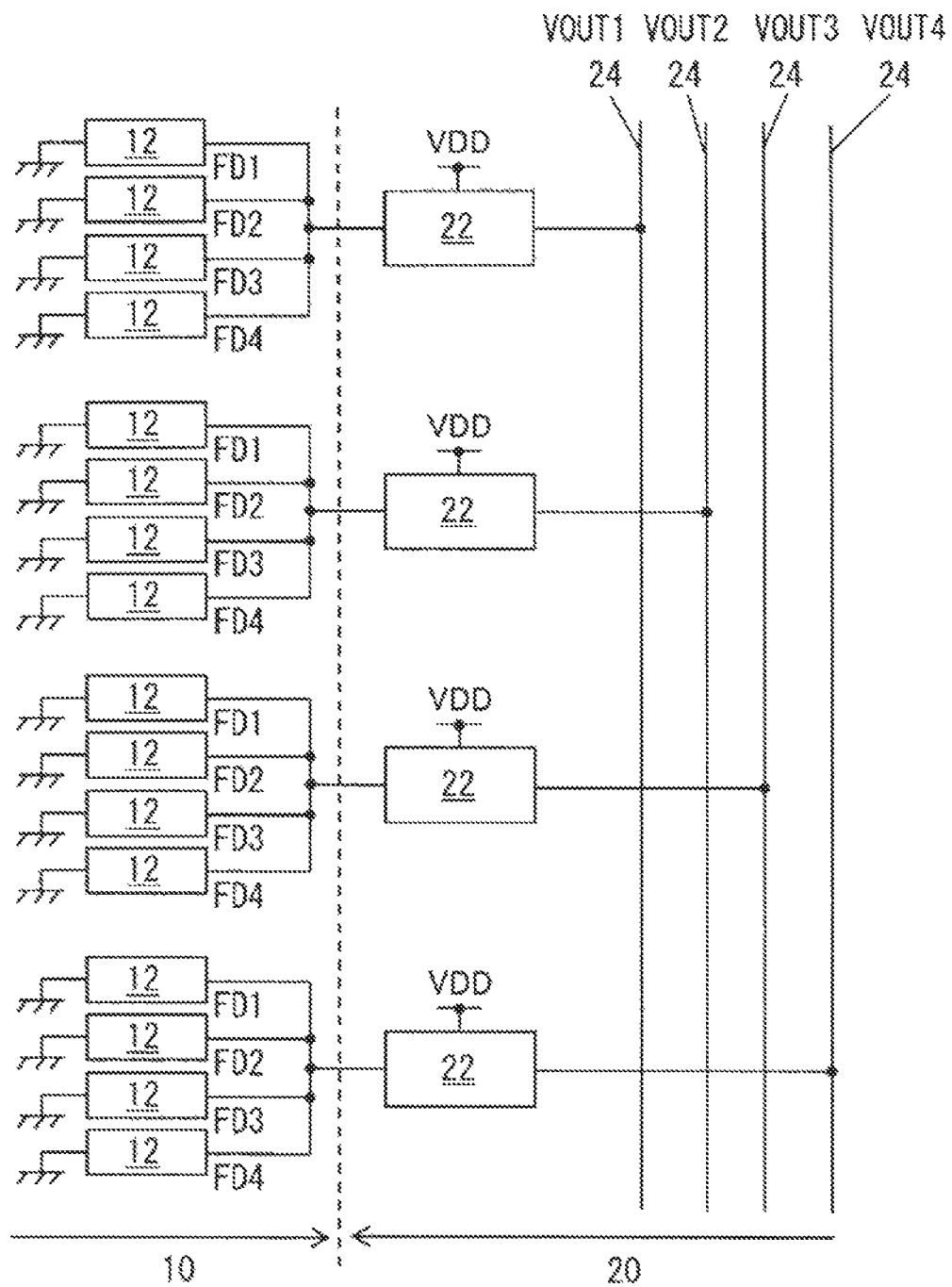
FIG. 6 is a diagram illustrating an example of a connection mode between a plurality of readout circuits and a plurality of vertical signal lines.

FIG. 6 is a diagram illustrating an example of a connection mode between a plurality of readout circuits 22 and a plurality of vertical signal lines 24. In a case where the plurality of readout circuits 22 is arranged along the column direction in which the vertical signal line 24 extends, each of the plurality of vertical signal lines 24 may be assigned to the readout circuit 22 on a one-to-one basis. For example, as illustrated in FIG. 6, in a case where four readout circuits 22 are arranged along the direction in which the vertical signal line 24 extends, the four vertical signal lines 24 may be assigned to the readout circuits 22 on a one-to-one basis. Note that each of the vertical signal lines 24 in FIG. 6 is given an identification number 1, 2, 3, or 4 suffixed to the reference symbol for the purpose of distinguishing the vertical signal lines 24 from one another.

(Example Physical Configuration of Solid-State Imaging Element)

Figure 7:
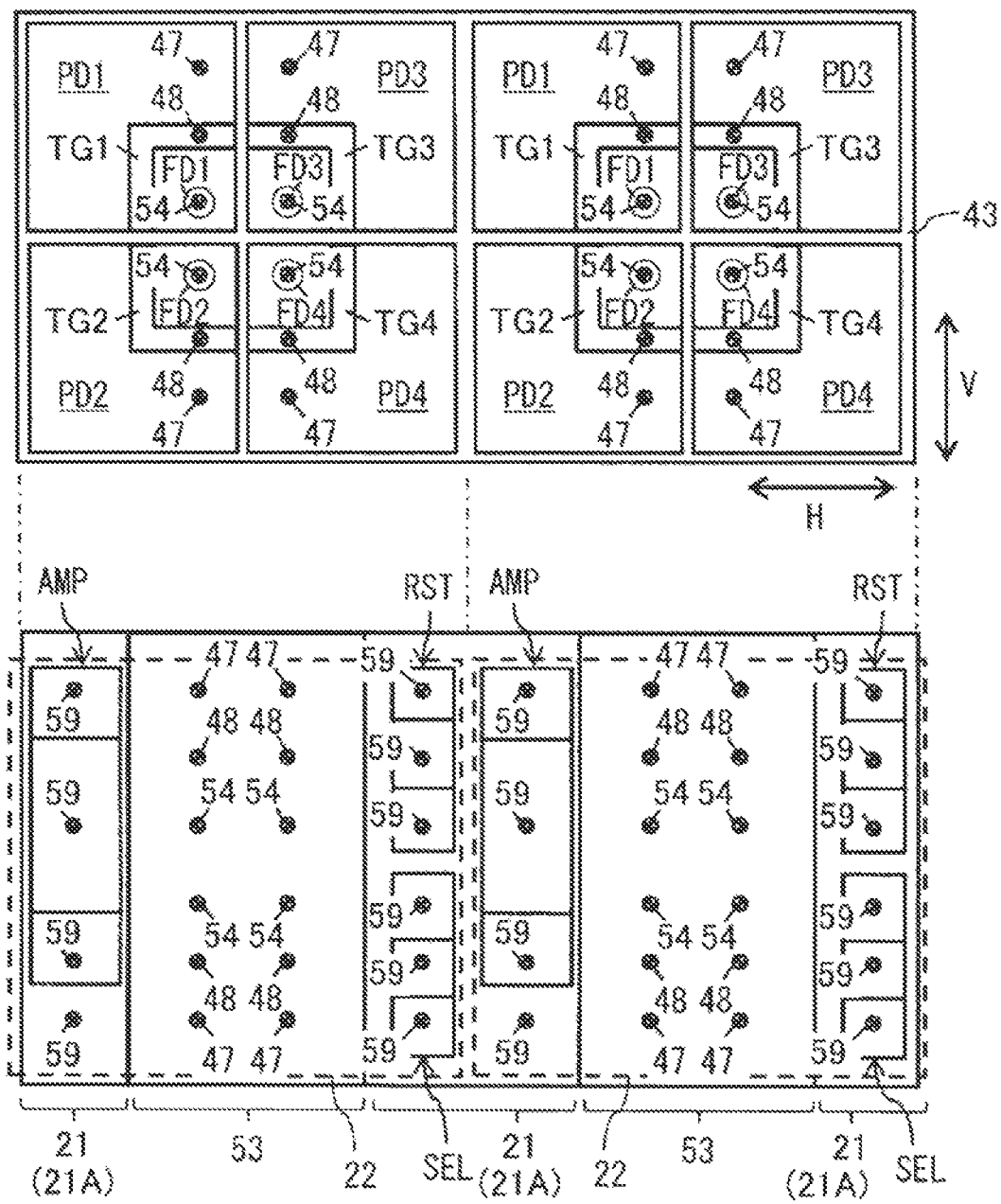
FIG. 7 is a diagram illustrating an example of a horizontal cross-sectional configuration of the solid-state imaging element in FIG. 1.
Figure 8:
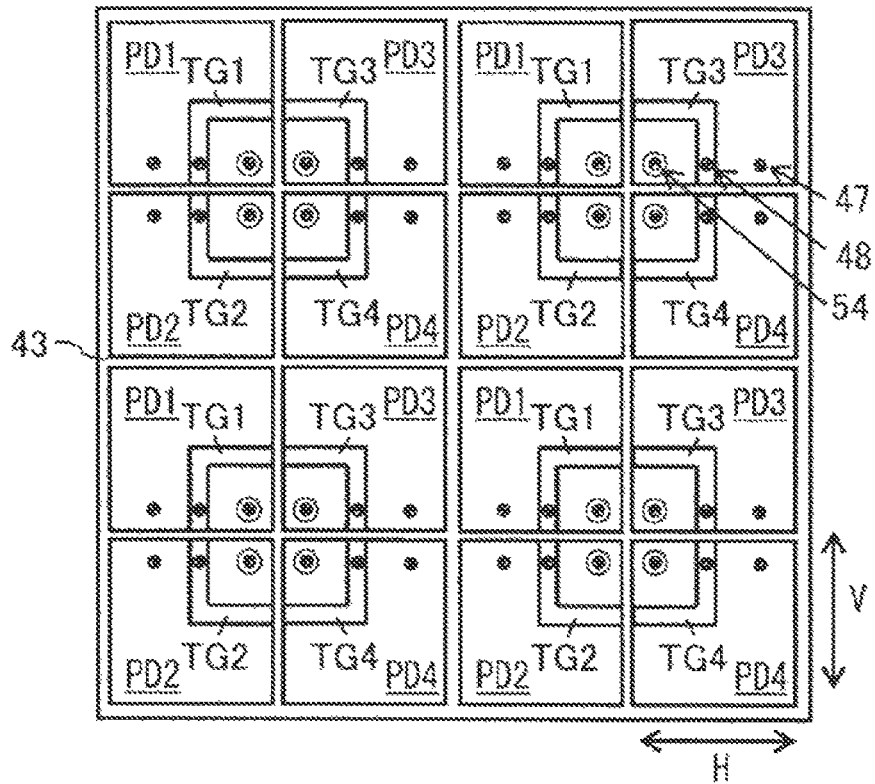
FIG. 8 is a diagram illustrating an example of a horizontal cross-sectional configuration of the solid-state imaging element in FIG. 1.
Figure 8:
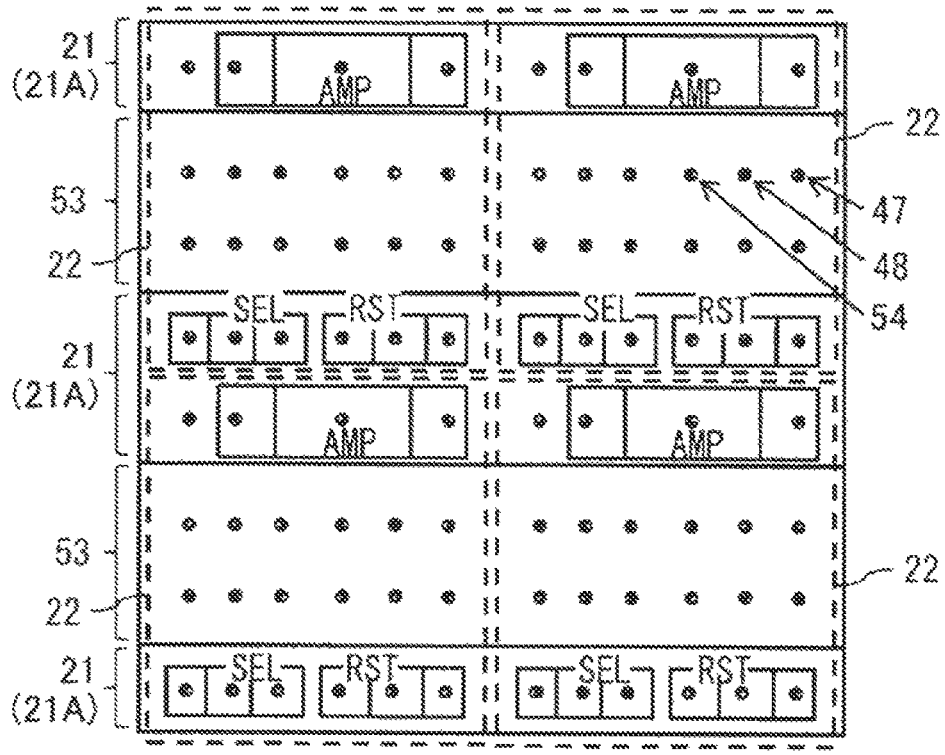

FIGS. 7 and 8 are diagrams each illustrating an example of a horizontal cross-sectional configuration of the solid-state imaging element 1. The upper figure in each of FIGS. 7 and 8 illustrates an example of a horizontal cross-sectional configuration of the first substrate 10 in FIG. 1. The lower figure in each of FIGS. 7 and 8 illustrates an example of a horizontal cross-sectional configuration of the second substrate 20 in FIG. 1. FIG. 7 illustrates an example configuration in which two sets of 2×2 four sensor pixels 12 are arranged along a second direction H, while FIG. 8 illustrates an example configuration in which four sets of 2×2 four sensor pixels 12 are arranged along a first direction V and the second direction H. Note that the upper cross-sectional view in each of FIGS. 7 and 8 shows an example of a horizontal cross-sectional configuration of the first substrate 10 in FIG. 1 overlaid with an example of a surface configuration of the semiconductor substrate 11. Furthermore, the lower cross-sectional view in each of FIGS. 7 and 8 shows an example of a horizontal cross-sectional configuration of the second substrate 20 in FIG. 1 overlaid with an example of a surface configuration of the semiconductor substrate 21.

As illustrated in FIGS. 7 and 8, a plurality of through wirings 54, a plurality of through wirings 48, and a plurality of through wirings 47 are arranged zonally in a plane of the first substrate 10 along the first direction V, that is, the vertical direction in FIG. 7, or the second direction H, that is, the horizontal direction in FIG. 8. Note that FIGS. 7 and 8 illustrate a case where the plurality of through wirings 54, the plurality of through wirings 48, and the plurality of through wirings 47 are arranged in two rows along the first direction V or the second direction H. The first direction V or the second direction H is parallel to, for example, one of the row direction and the column direction, which are the two arrangement directions of the plurality of sensor pixels 12 disposed in a matrix. In the four sensor pixels 12 sharing the readout circuit 22, the four floating diffusions FD are placed close to one another across a pixel separator 43, for example. In the four sensor pixels 12 sharing the readout circuit 22, the gate electrodes TG of the four transfer transistors TR are disposed so as to surround the four floating diffusions FD. For example, the four gate electrodes TG form an annular shape.

An insulating layer 53 present around the above-described plurality of through wirings 54 passing through the semiconductor substrate 21 includes a plurality of blocks extending along the first direction V or the second direction H. The semiconductor substrate 21 includes a plurality of island-like blocks 21A that extends along the first direction V or the second direction H and is arranged across the above-mentioned insulating layer 53 along the first direction V or the second direction H orthogonal to each other. In each block 21A, there is provided, for example, a plurality of sets of reset transistors RST, amplification transistors AMP, and selection transistors SEL. One readout circuit 22 shared by four sensor pixels 12 includes, for example, the reset transistor RST, the amplification transistor AMP, and the selection transistor SEL that are disposed in a region facing the four sensor pixels 12. One readout circuit 22 shared by four sensor pixels 12 includes, for example, the amplification transistor AMP within the block 21A immediately to the left of the aforementioned insulating layer 53, and the reset transistor RST and the selection transistor SEL within the block 21A immediately to the right of the aforementioned insulating layer 53.

FIGS. 9 to 12 are diagrams each illustrating an example of a wiring layout within a horizontal plane in the solid-state imaging element 1. FIGS. 9 to 12 each illustrate an example in which one readout circuit 22 shared by four sensor pixels 12 is disposed within a region facing the four sensor pixels 12. The wirings illustrated in FIGS. 9 to 12 are disposed, for example, in layers different from one another within a wiring layer (not illustrated) provided on the aforementioned pixel transistors. The wiring layer includes, for example, a plurality of pixel drive lines 23, a plurality of vertical signal lines 24, and a pad electrode (not illustrated) that is exposed on a surface of the wiring layer and used for electrical connection between the second substrate 20 and the third substrate 30.

Figure 9:
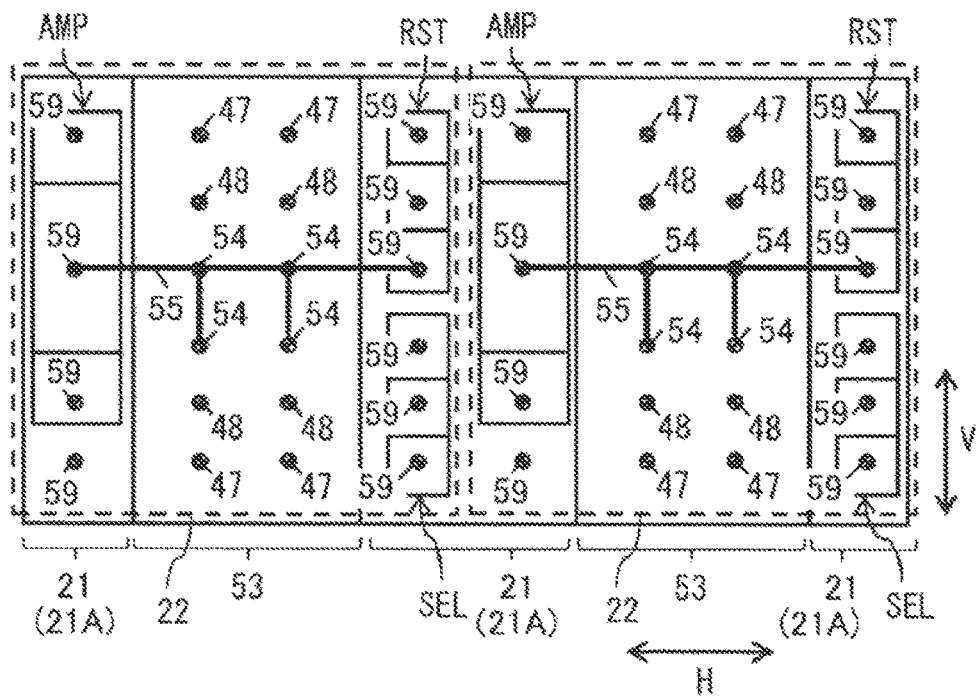
FIG. 9 is a diagram illustrating an example of a wiring layout within a horizontal plane in the solid-state imaging element in FIG. 1.

The four through wirings 54 adjacent to one another are electrically connected to, for example, a connection wiring 55, as illustrated in FIG. 9. The four through wirings 54 adjacent to one another are further electrically connected to the gate of the amplification transistor AMP included in the block 21A immediately to the left of the insulating layer 53 and to the gate of the reset transistor RST included in the block 21A immediately to the right of the insulating layer 53 via, for example, the connection wiring 55 and the connection part 59.

Figure 10:
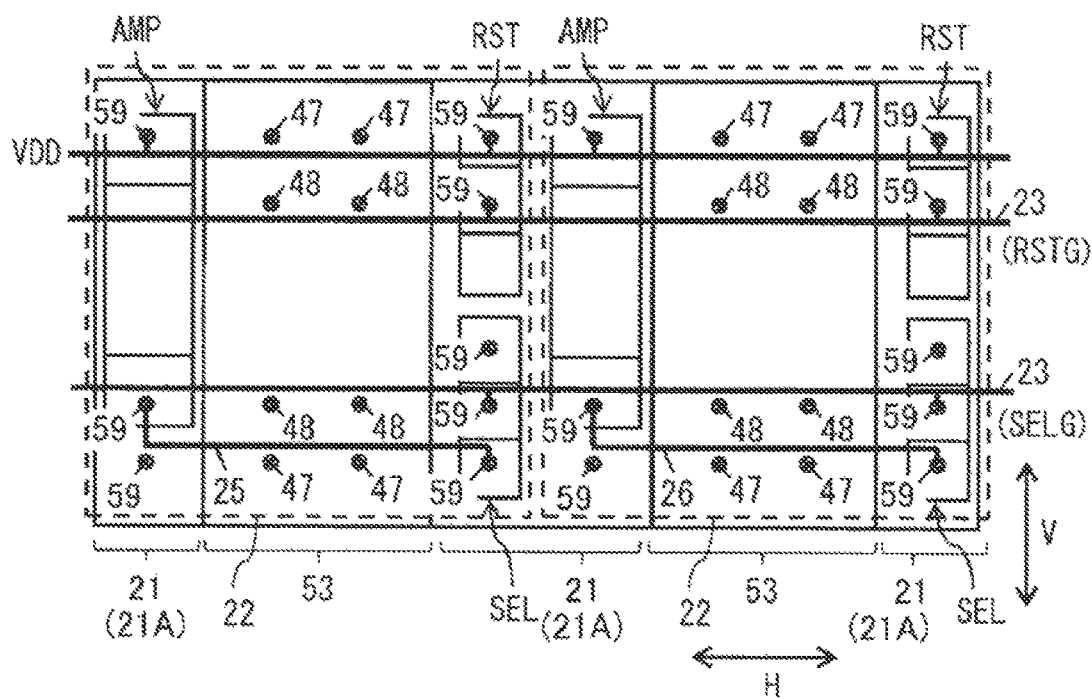
FIG. 10 is a diagram illustrating an example of a wiring layout within a horizontal plane in the solid-state imaging element in FIG. 1.

The power supply line VDD is disposed at, for example, a position facing each of the readout circuits 22 arranged along the second direction H, as illustrated in FIG. 10. The power supply line VDD is electrically connected to the drain of the amplification transistor AMP and the drain of the reset transistor RST of each of the readout circuits 22 arranged along the second direction H via, for example, the connection part 59. Two pixel drive lines 23 are each disposed at, for example, a position facing each of the readout circuits 22 arranged along the second direction H. One of the pixel drive lines 23 is, for example, a wiring RSTG electrically connected to the gate of the reset transistor RST of each of the readout circuits 22 arranged along the second direction H. The other pixel drive line 23 is, for example, a wiring SELG electrically connected to the gate of the selection transistor SEL of each of the readout circuits 22 arranged along the second direction H. In each readout circuit 22, the source of the amplification transistor AMP and the drain of the selection transistor SEL are electrically connected to each other via, for example, a wiring 25.

Figure 11:
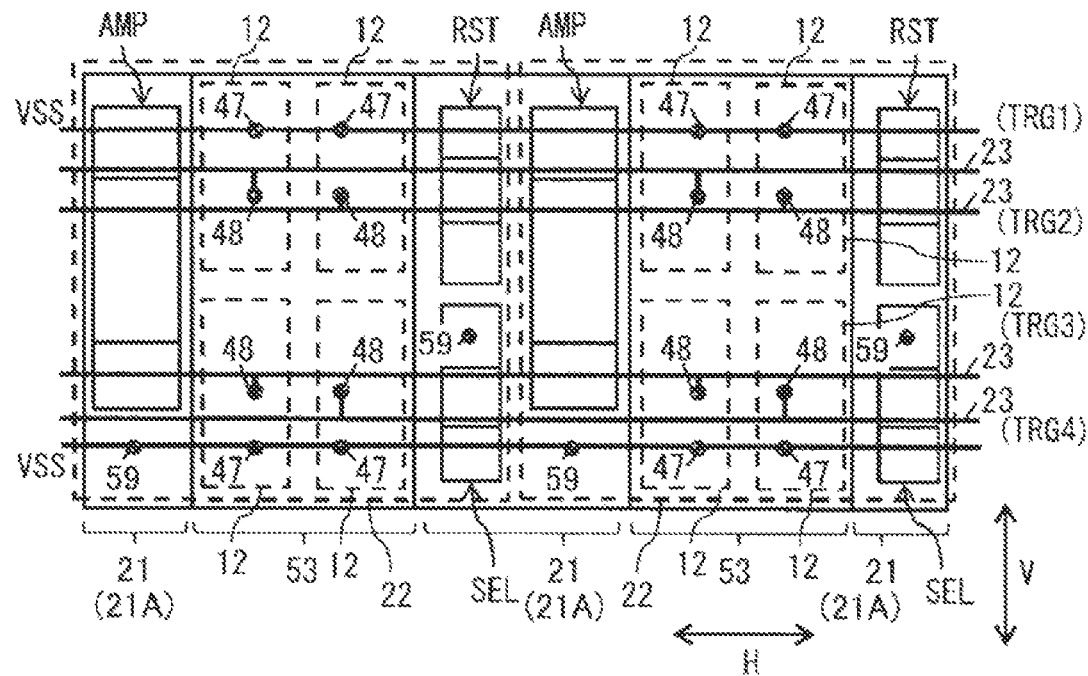
FIG. 11 is a diagram illustrating an example of a wiring layout within a horizontal plane in the solid-state imaging element in FIG. 1.

As illustrated in FIG. 11, two power supply lines VSS are each disposed at, for example, a position facing each of the readout circuits 22 arranged along the second direction H. Each power supply line VSS is electrically connected to a plurality of through wirings 47 at, for example, a position facing each of the sensor pixels 12 arranged along the second direction H. Four pixel drive lines 23 are each disposed at, for example, a position facing each of the readout circuits 22 arranged along the second direction H.

Each of the four pixel drive lines 23 is, for example, a wiring TRG electrically connected to the through wiring 48 for a single sensor pixel 12, which is one of the four sensor pixels 12 corresponding to one of the readout circuits 22 arranged along the second direction H. That is, the four pixel drive lines 23, which function as control lines, are each electrically connected to the gate electrode TG of the transfer transistor TR for each of the sensor pixels 12 arranged along the second direction H. Note that an identification number 1, 2, 3, or 4 is suffixed to each of the wirings TRG in FIG. 11 for the purpose of distinguishing the wirings TRG from one another.

Figure 12:
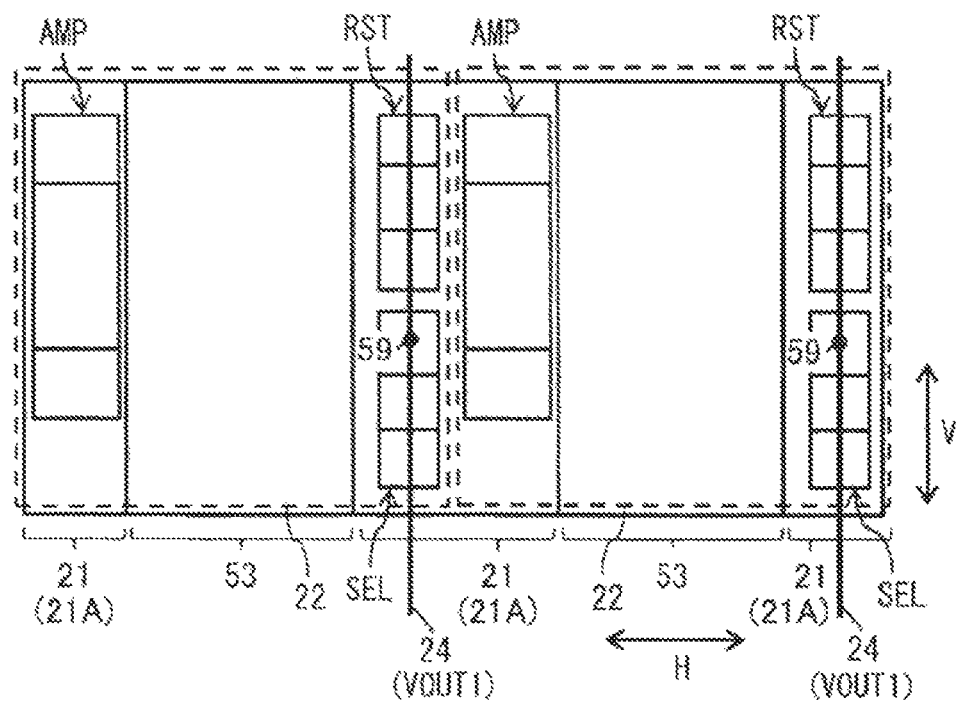
FIG. 12 is a diagram illustrating an example of a wiring layout within a horizontal plane in the solid-state imaging element in FIG. 1.

As illustrated in FIG. 12, the vertical signal line 24 is disposed at, for example, a position facing each of the readout circuits 22 arranged along the first direction V. The vertical signal line 24, which functions as an output line, is electrically connected to, for example, the source of the amplification transistor AMP, the source being an output terminal of each of the readout circuits 22 arranged along the first direction V.

First Modification

Figure 13:
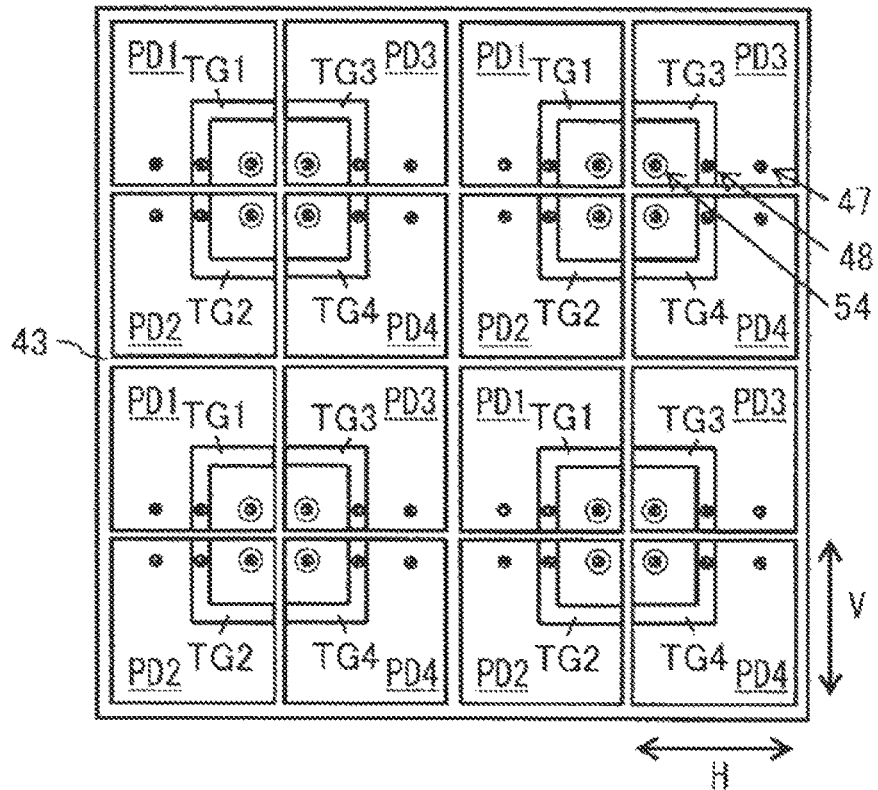
FIG. 13 is a diagram illustrating a modification of the horizontal cross-sectional configuration of the solid-state imaging element in FIG. 1.
Figure 13:
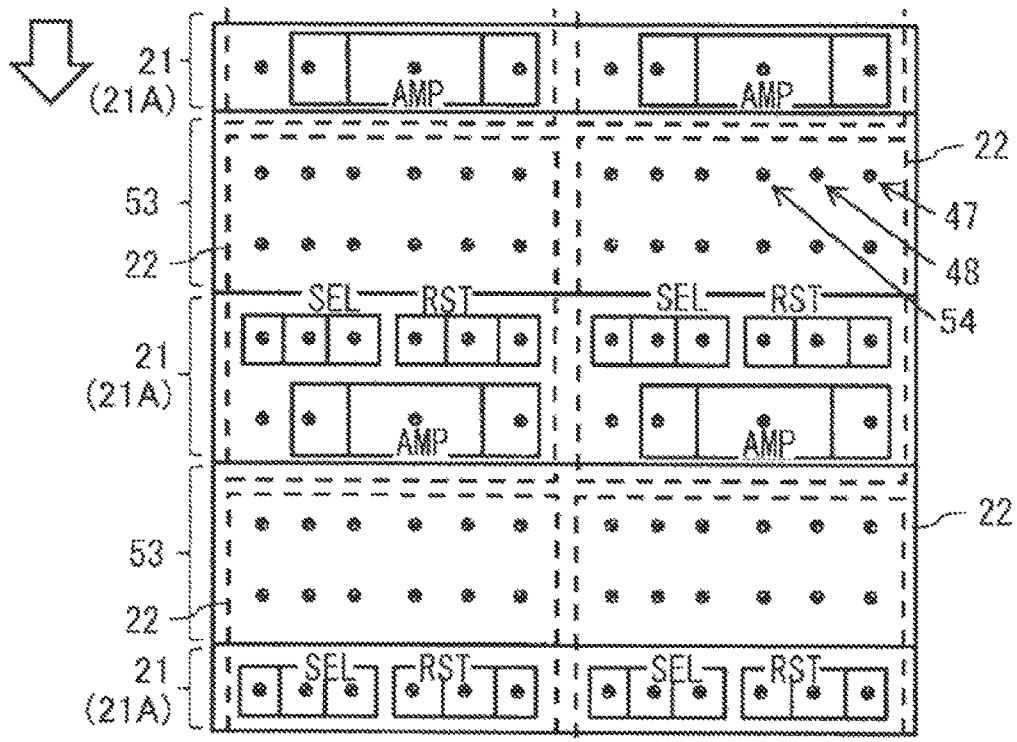
Figure 14:
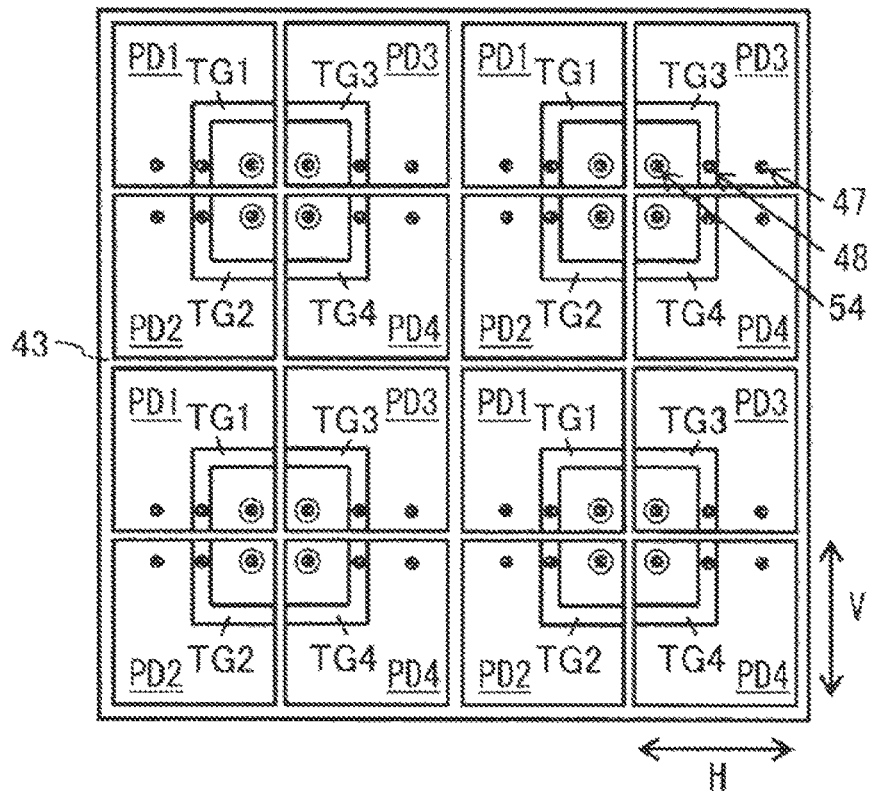
FIG. 14 is a diagram illustrating a modification of the horizontal cross-sectional configuration of the solid-state imaging element in FIG. 1.
Figure 14:
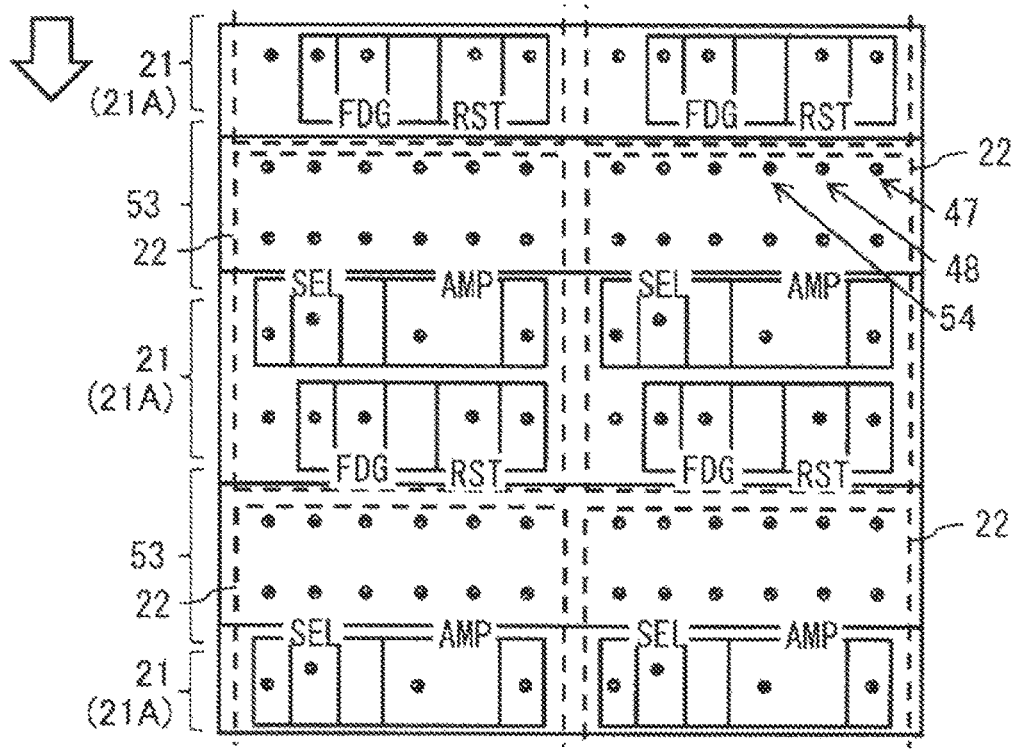

FIGS. 13 and 14 are diagrams each illustrating a modification of the horizontal cross-sectional configuration of the solid-state imaging element 1 described above. The upper figure in each of FIGS. 13 and 14 illustrates a modification of the horizontal cross-sectional configuration of the first substrate 10 in FIG. 1, and the lower figure in FIG. 13 illustrates a modification of the horizontal cross-sectional configuration of the second substrate 20 in FIG. 1. Note that the upper cross-sectional view in each of FIGS. 13 and 14 shows a modification of the horizontal cross-sectional configuration of the first substrate 10 in FIG. 1 overlaid with a modification of the surface configuration of the semiconductor substrate 11 in FIG. 1. Furthermore, the lower cross-sectional view in each of FIGS. 13 and 14 shows a modification of the horizontal cross-sectional configuration of the second substrate 20 in FIG. 1 overlaid with a modification of the surface configuration of the semiconductor substrate 21.

As illustrated in FIGS. 13 and 14, the plurality of through wirings 54, the plurality of through wirings 48, and the plurality of through wirings 47, which are arranged in a matrix in the form of a plurality of dots, are arranged in a plane of the first substrate 10 zonally along the first direction H, which is the horizontal direction in FIGS. 13 and 14. Note that FIGS. 13 and 14 illustrate a case where the plurality of through wirings 54, the plurality of through wirings 48, and the plurality of through wirings 47 are arranged in two rows along the second direction H. In the four sensor pixels 12 sharing the readout circuit 22, the four floating diffusions FD are placed close to one another across a pixel separator 43, for example. In the four sensor pixels 12 sharing the readout circuit 22, the four transfer electrodes TG1, TG2, TG3, and TG4 are disposed so as to surround the four floating diffusions FD. For example, the four transfer gates TG form an annular shape.

The insulating layer 53 includes a plurality of blocks extending along the second direction H. The semiconductor substrate 21 includes a plurality of island-like blocks 21A that extends along the second direction H and is arranged across the insulating layer 53 along the first direction V orthogonal to the second direction H. In each block 21A, there are provided, for example, the reset transistor RST, the amplification transistor AMP, and the selection transistor SEL. One readout circuit 22 shared by four sensor pixels 12 is disposed, for example, not to entirely face the four sensor pixels 12 but to be shifted along the first direction V.

In FIG. 13, one readout circuit 22 shared by four sensor pixels 12 includes, on the second substrate 20, the reset transistor RST, the amplification transistor AMP, and the selection transistor SEL that are disposed in a region shifted along the first direction V from the region facing the four sensor pixels 12. One readout circuit 22 shared by four sensor pixels 12 includes, for example, the amplification transistor AMP, the reset transistor RST, and the selection transistor SEL that are disposed in a single block 21A.

In FIG. 14, one readout circuit 22 shared by four sensor pixels 12 includes, on the second substrate 20, the reset transistor RST, the amplification transistor AMP, the selection transistor SEL, and the FD transfer transistor FDG that are disposed in a region shifted along the first direction V from the region facing the four sensor pixels 12. One readout circuit 22 shared by four sensor pixels 12 includes, for example, the amplification transistor AMP, the reset transistor RST, the selection transistor SEL, and the FD transfer transistor FDG that are disposed in a single block 21A.

In the present modification, one readout circuit 22 shared by four sensor pixels 12 is disposed, for example, not to entirely face the four sensor pixels 12 but is shifted along the first direction V from a position where the readout circuit 22 entirely faces the four sensor pixels 12. In this case, the wiring 25 (see FIG. 10) can be shortened, or the wiring 25 can be omitted and a shared doped region may include the source of the amplification transistor AMP and the drain of the selection transistor SEL. As a result, the readout circuit 22 can be made smaller-sized, or other portions in the readout circuit 22 can be made larger-sized.

Second Modification

Figure 15:
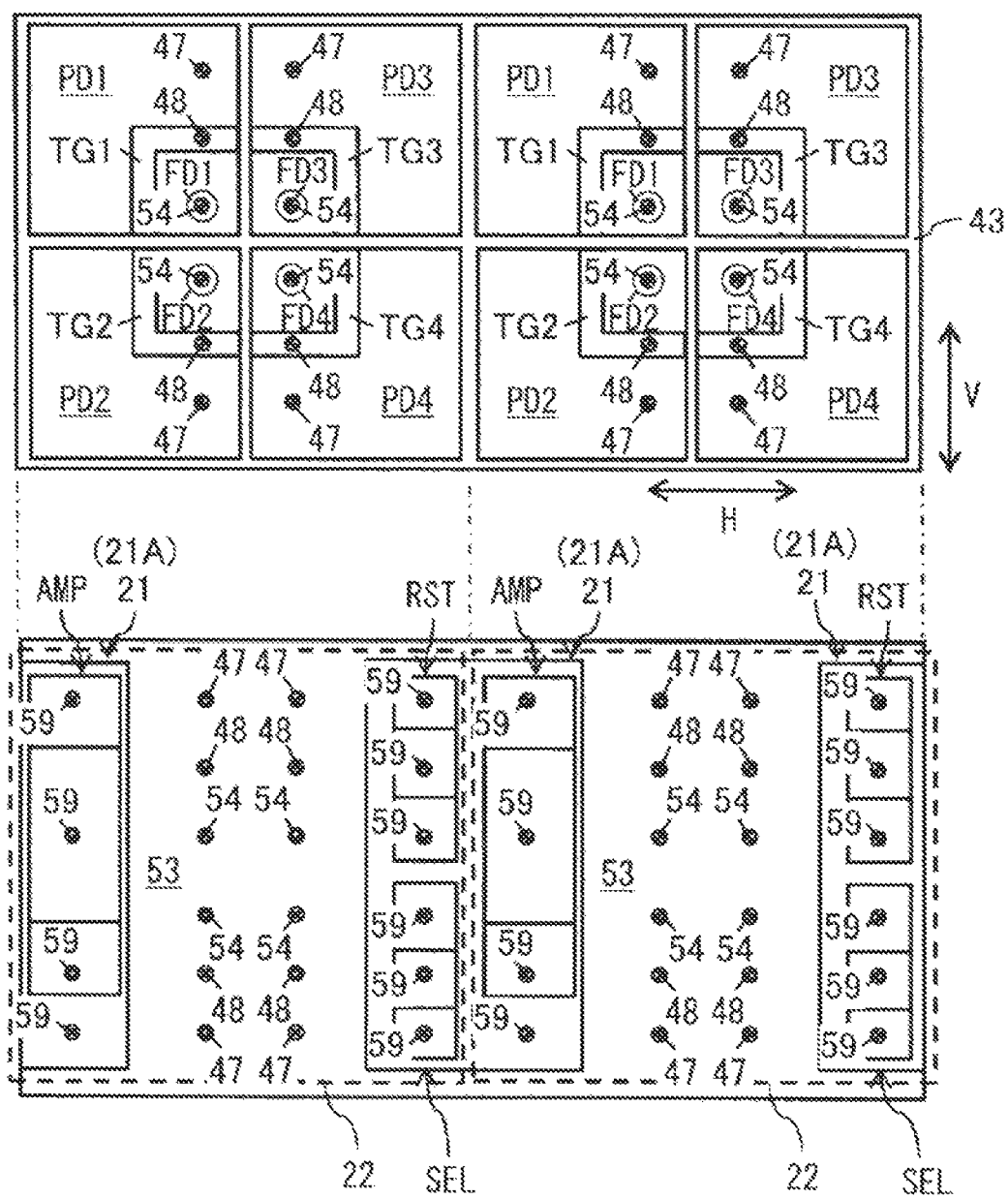
FIG. 15 is a diagram illustrating a modification of the horizontal cross-sectional configuration of the solid-state imaging element in FIG. 1.

FIG. 15 is a diagram illustrating a modification of the horizontal cross-sectional configuration of the solid-state imaging element 1 described above. FIG. 15 illustrates a modification of the cross-sectional configuration in FIG. 7.

In the present modification, the semiconductor substrate 21 includes a plurality of island-like blocks 21A arranged along the first direction V and the second direction H across the insulating layer 53. In each block 21A, there is disposed, for example, a single set of the reset transistor RST, the amplification transistor AMP, and the selection transistors SEL. In this case, crosstalk that may occur between readout circuits 22 adjacent to each other can be reduced by the insulating layer 53 to suppress lowering of resolution on a reproduced image or impairing of image quality due to color mixture.

Third Modification

Figure 16:
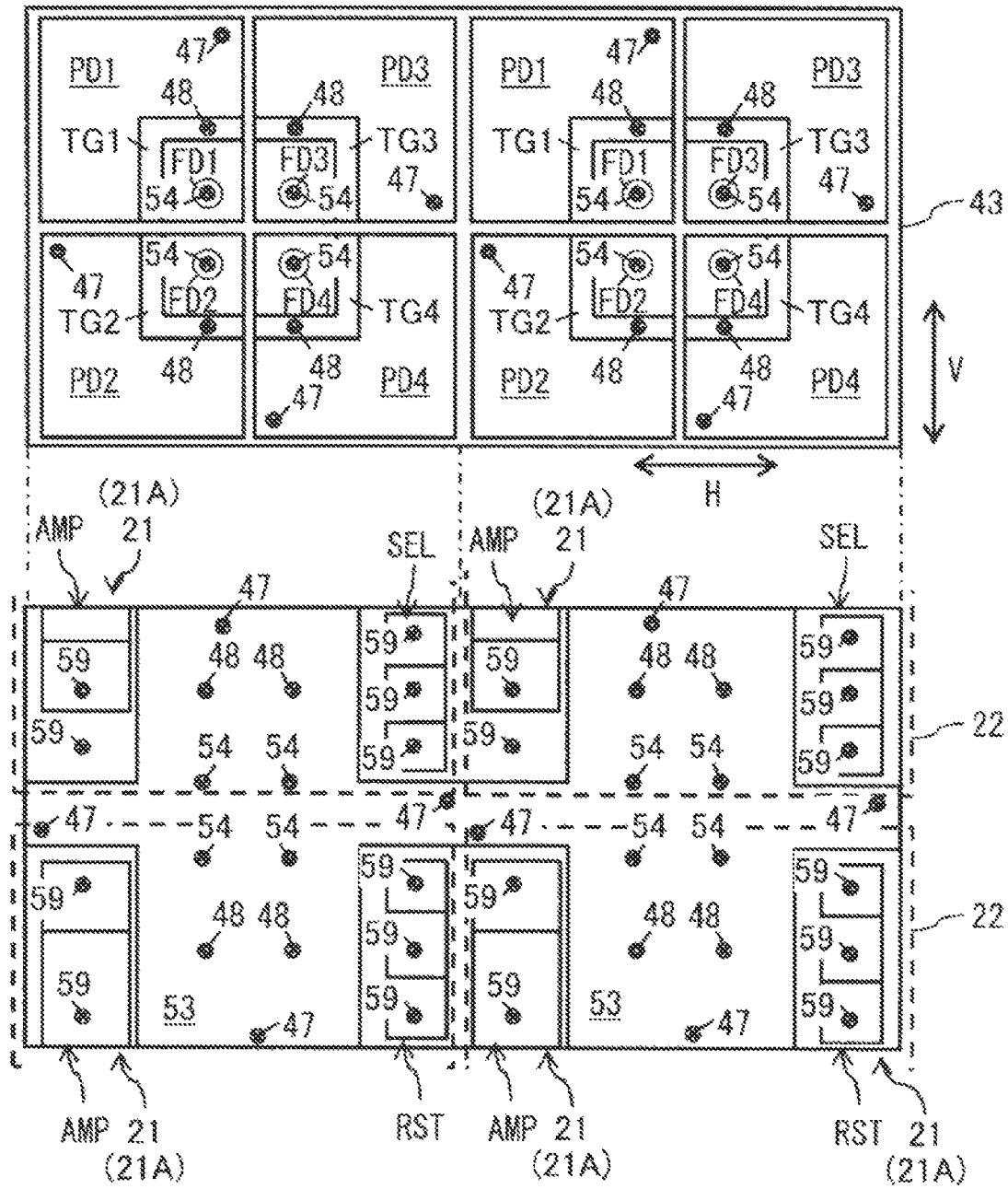
FIG. 16 is a diagram illustrating a modification of the horizontal cross-sectional configuration of the solid-state imaging element in FIG. 1.

FIG. 16 is a diagram illustrating a modification of the horizontal cross-sectional configuration of the solid-state imaging element 1 described above. FIG. 16 illustrates a modification of the cross-sectional configuration in FIG. 15.

In the present modification, one readout circuit 22 shared by four sensor pixels 12 is disposed, for example, not to entirely face the four sensor pixels 12 but to be shifted along the first direction V. In addition, in the present modification, the semiconductor substrate 21 includes a plurality of island-like blocks 21A arranged along the first direction V and the second direction H across the insulating layer 53, as in the second modification. In each block 21A, there is disposed, for example, a single set of the reset transistor RST, the amplification transistor AMP, and the selection transistors SEL. In the present modification, a plurality of the through wirings 47 and a plurality of the through wirings 54 are further arranged along the second direction H. Specifically, the plurality of through wirings 47 is disposed between four through wirings 54 sharing a certain readout circuit 22 and four through wirings 54 sharing another readout circuit 22 adjacent to the certain readout circuit 22 along the second direction H. In this case, crosstalk that may occur between readout circuits 22 adjacent to each other can be reduced by the insulating layer 53 and the through wirings 47 to suppress lowering of resolution on a reproduced image or impairing of image quality due to color mixture.

Fourth Modification

Figure 17:
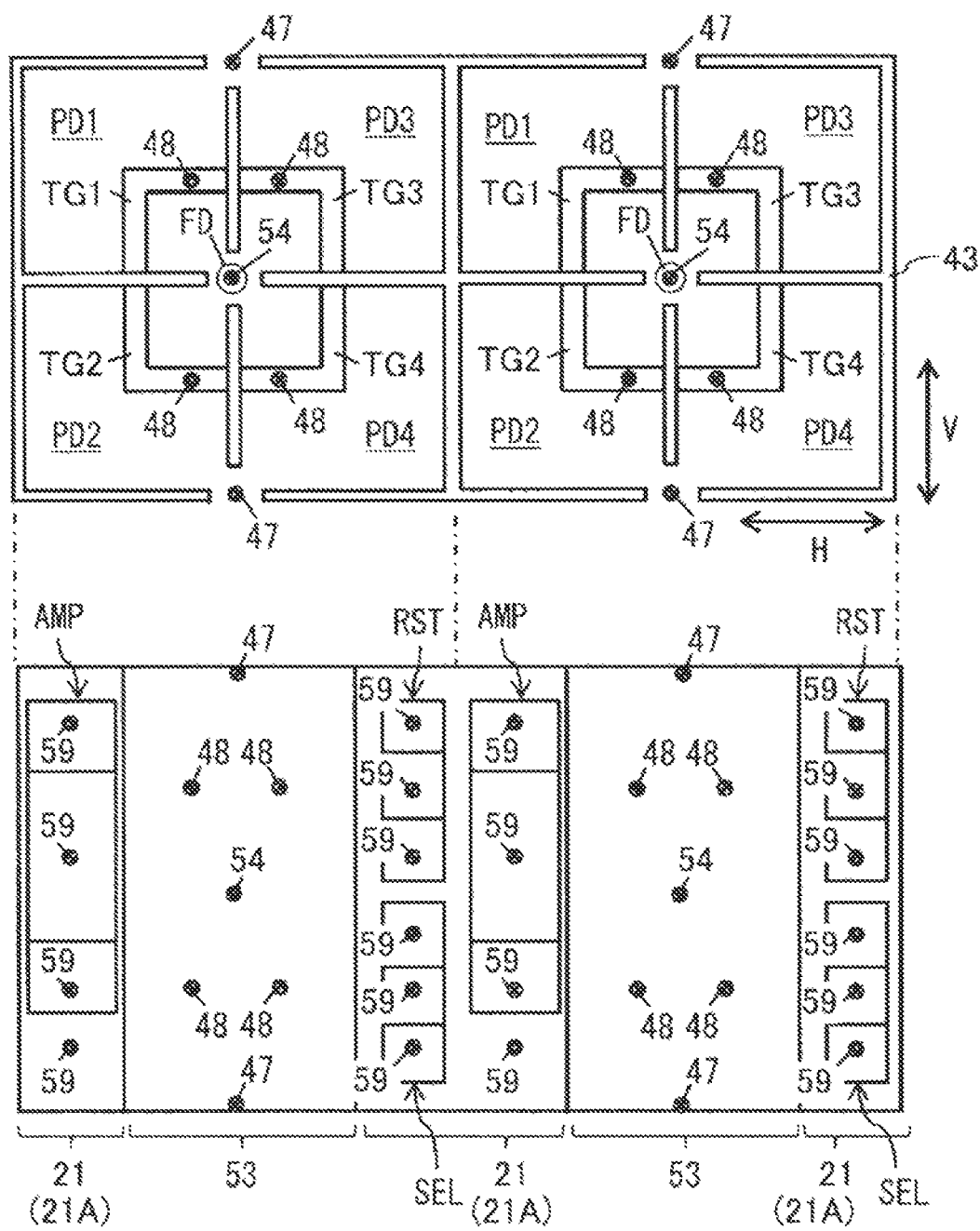
FIG. 17 is a diagram illustrating a modification of the horizontal cross-sectional configuration of the solid-state imaging element in FIG. 1.

FIG. 17 is a diagram illustrating an example of a horizontal cross-sectional configuration of the solid-state imaging element 1 described above. FIG. 17 illustrates a modification of the cross-sectional configuration in FIG. 7.

In the present modification, the first substrate 10 has the photodiode PD and the transfer transistor TR disposed for every sensor pixel 12, and shares the floating diffusion FD for every four sensor pixels 12. Accordingly, in the present modification, one through wiring 54 is disposed for every four sensor pixels 12.

Among the plurality of sensor pixels 12 arranged in a matrix, the four sensor pixels 12 corresponding to the region that is obtained by shifting the unit region by a single sensor pixel 12 along the first direction V, the unit region corresponding to the four sensor pixels 12 sharing one floating diffusion FD, are referred to as four sensor pixels 12A for convenience. Then, in the present modification, the first substrate 10 has the through wiring 47 shared by every four sensor pixels 12A. Accordingly, in the present modification, one through wiring 47 is disposed for every four sensor pixels 12A.

In the present modification, the first substrate 10 includes the pixel separator 43 that separates the photodiodes PD and the transfer transistors TR for each sensor pixel 12. The pixel separator 43 does not completely surround the sensor pixel 12 when viewed from the direction normal to the semiconductor substrate 11, but includes gaps, which are unformed regions, near the through wiring 54 connected to the floating diffusion FD and near the through wiring 47. Then, these gaps enable four sensor pixels 12 to share one through wiring 54 and also enable four sensor pixels 12A to share one through wiring 47. In the present modification, the second substrate 20 includes the readout circuit 22 for every four sensor pixels 12 sharing the floating diffusion FD.

Figure 18:
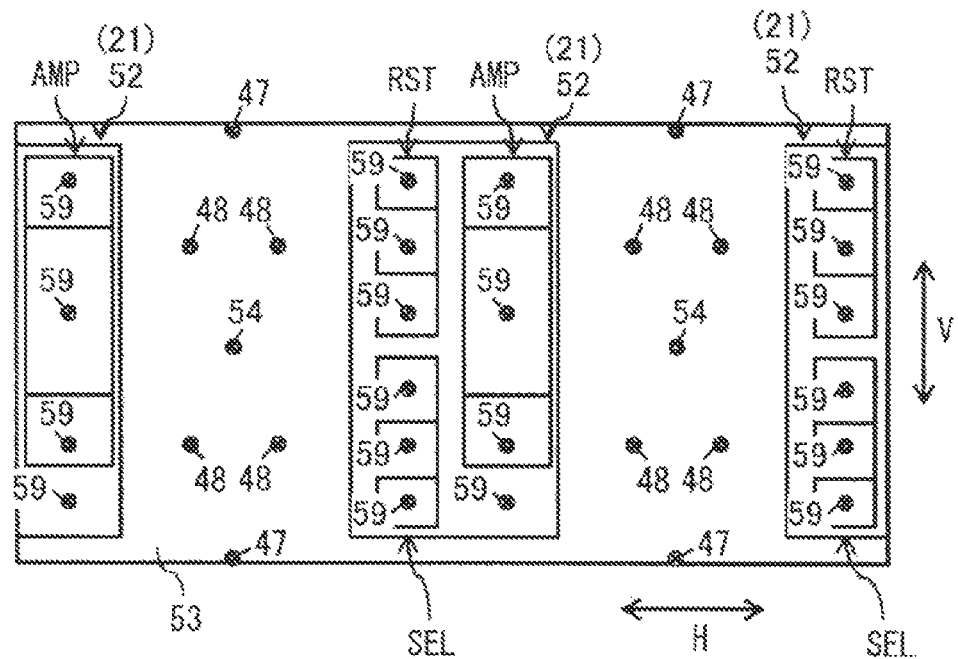
FIG. 18 is a diagram illustrating a modification of the horizontal cross-sectional configuration of the solid-state imaging element in FIG. 1.

FIG. 18 is a diagram illustrating an example of a horizontal cross-sectional configuration of the solid-state imaging element 1 according to the present modification. FIG. 18 illustrates a modification of the cross-sectional configuration in FIG. 15. In the present modification, the first substrate 10 has the photodiode PD and the transfer transistor TR disposed for every sensor pixel 12, and shares the floating diffusion FD for every four sensor pixels 12. Moreover, the first substrate 10 includes the pixel separator 43 that separates the photodiodes PD and the transfer transistors TR for each sensor pixel 12.

Figure 19:
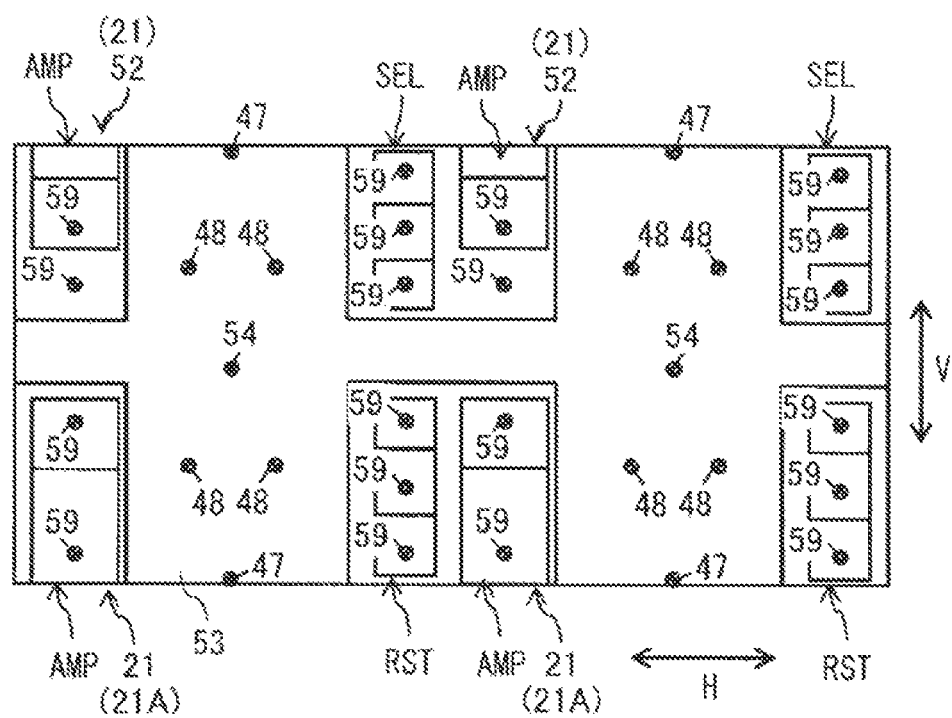
FIG. 19 is a diagram illustrating a modification of the horizontal cross-sectional configuration of the solid-state imaging element in FIG. 1.

FIG. 19 is a diagram illustrating an example of a horizontal cross-sectional configuration of the solid-state imaging element 1 according to the present modification. FIG. 19 illustrates a modification of the cross-sectional configuration in FIG. 16. In the present modification, the first substrate 10 has the photodiode PD and the transfer transistor TR disposed for every sensor pixel 12, and shares the floating diffusion FD for every four sensor pixels 12. Moreover, the first substrate 10 includes the pixel separator 43 that separates the photodiodes PD and the transfer transistors TR for each sensor pixel 12.

Fifth Modification

Figure 20:
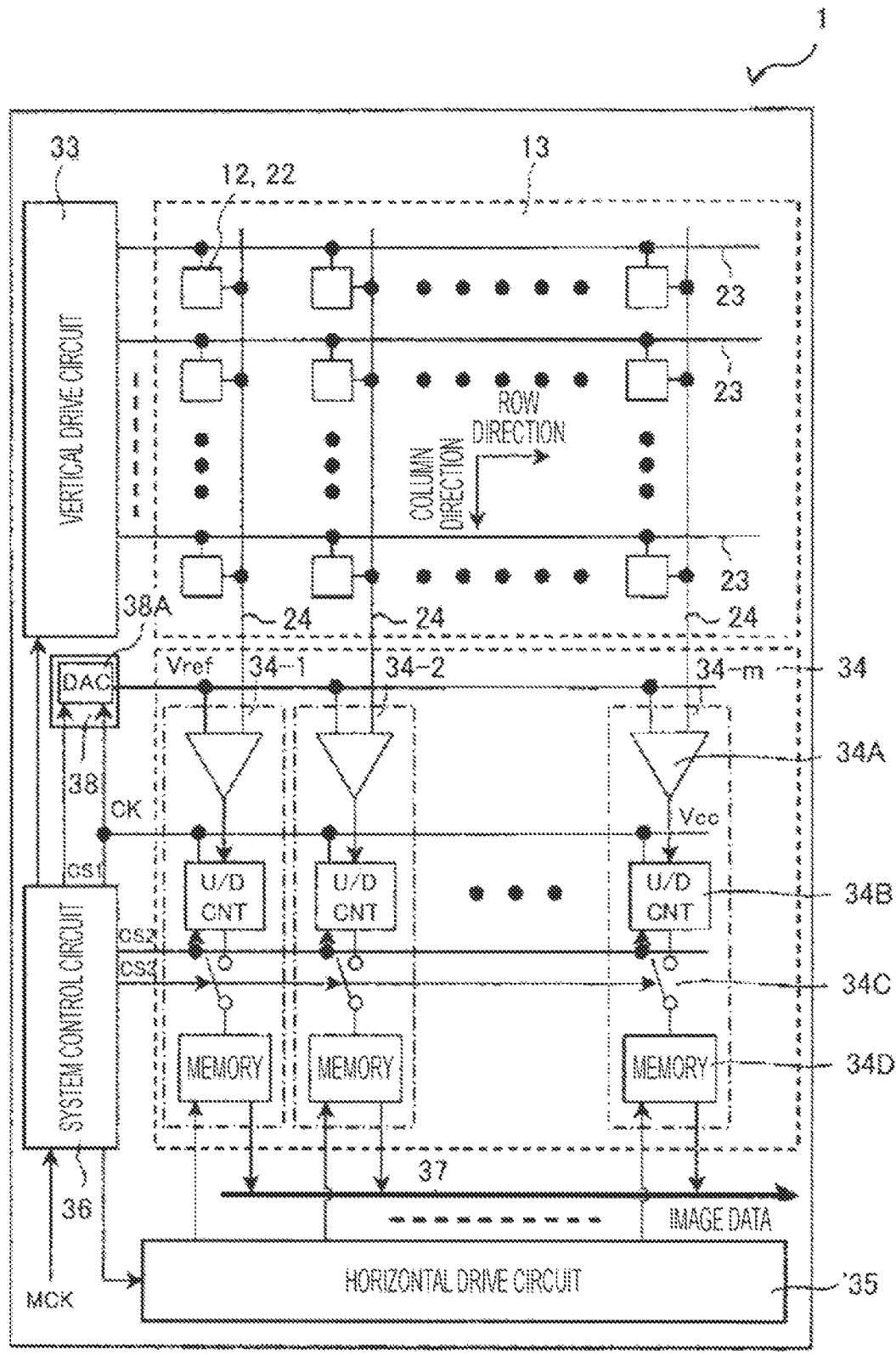
FIG. 20 is a diagram illustrating a modification of the circuitry configuration of the solid-state imaging element configured as in FIG. 1 or according to any of modifications thereof.

FIG. 20 is a diagram illustrating an example of the circuitry configuration of the solid-state imaging element 1 according to a modification. The solid-state imaging element 1 according to the present modification is a CMOS image sensor equipped with a column-parallel ADC.

As illustrated in FIG. 20, the solid-state imaging element 1 according to the present modification includes the vertical drive circuit 33, the column signal processing circuit 34, a reference voltage supply unit 38, the horizontal drive circuit 35, a horizontal output line 37, and the system control circuit 36, in addition to the pixel region 13 in which the plurality of sensor pixels 12 including photoelectric conversion elements is two-dimensionally arranged in a matrix.

In this system configuration, the system control circuit 36 generates, on the basis of a master clock MCK, clock signals serving as references for operations of the vertical drive circuit 33, the column signal processing circuit 34, the reference voltage supply unit 38, the horizontal drive circuit 35, and the like, as well as control signals and the like, and supplies the clock signals, the control signals, and the like to the vertical drive circuit 33, the column signal processing circuit 34, the reference voltage supply unit 38, the horizontal drive circuit 35, and the like.

In addition, the vertical drive circuit 33 is formed on the first substrate 10 together with the sensor pixels 12 in the pixel region 13, and is further formed on the second substrate 20 on which the readout circuit 22 is formed. The column signal processing circuit 34, the reference voltage supply unit 38, the horizontal drive circuit 35, the horizontal output line 37, and the system control circuit 36 are formed on the third substrate 30.

Although not illustrated here, a configuration that may be used for the sensor pixel 12 includes the photodiode PD and further includes, for example, the transfer transistor TR that transfers the electric charge obtained by photoelectric conversion in the photodiode PD to the floating diffusion FD. In addition, although not illustrated here, a configuration that may be used for the readout circuit 22 includes, for example, a three-transistor configuration in which the reset transistor RST that controls the potential of the floating diffusion FD, the amplification transistor AMP that outputs a signal in accordance with the potential of the floating diffusion FD, and the selection transistor SEL for selecting a pixel are disposed.

In the pixel region 13, the sensor pixels 12 are two-dimensionally arranged, and to the m rows by n columns arrangement, the pixel drive line 23 is wired for each row and the vertical signal line 24 is wired for each column. One end of each of the plurality of pixel drive lines 23 is connected to each output end corresponding to each row in the vertical drive circuit 33. The vertical drive circuit 33, which includes a shift register and others, controls row addresses and row scanning in the pixel region 13 through the plurality of pixel drive lines 23.

The column signal processing circuit 34 includes, for example, analog-to-digital conversion circuits (ADCs) 34-1 to 34-$m$ each provided for each pixel column in the pixel region 13, that is, for each vertical signal line 24, to convert an analog signal output from each sensor pixel 12 in each column in the pixel region 13 into a digital signal and outputs the digital signal.

The reference voltage supply unit 38 includes, for example, a digital-to-analog conversion circuit (DAC) 38A as a method for generating a reference voltage Vref having a so-called ramp (RAMP) waveform in which the level varies in an inclined manner over time. Note that the method for generating a reference voltage Vref having a ramp waveform is not limited to the DAC 38A.

Under the control of control signals CS1 given by the system control circuit 36, the DAC 38A generates a reference voltage Vref having a ramp waveform on the basis of the clock CK given by the system control circuit 36, and supplies the reference voltage Vref to the ADCs 34-1 to 34-$m$ of the column processing unit 15.

Note that each of the ADCs 34-1 to 34-$m$ is configured to be able to selectively perform the AD conversion operation in an operation mode supporting both the normal frame rate mode in which all the information in the sensor pixel 12 is read by using a progressive scan method and the high-speed frame mode in which the frame rate is N-fold (double, for example) as compared with the normal frame mode by setting the exposure time of the sensor pixel 12 to 1/N. The operation mode is switched under the control of control signals CS2 and CS3 given by the system control circuit 36. Furthermore, to the system control circuit 36, instruction information for switching the operation mode between the normal frame rate mode and the high-speed frame rate mode is given by an external system controller (not illustrated).

The ADCs 34-1 to 34-$m$ each have the same configuration, and thus the description below takes the ADC 34-$m$ as an example. The ADC 34-$m$ includes a comparator 34A, an up/down counter (U/D CNT) 34B, which is an example of counting means, a transfer switch 34C, and a memory device 34D.

The comparator 34A compares the signal voltage Vx of the vertical signal line 24 with the reference voltage Vref, where the signal voltage Vx corresponds to a signal output from each sensor pixel 12 in the n-th column in the pixel region 13 and the reference voltage Vref has a ramp waveform and is supplied from the reference voltage supply unit 38. For example, when the reference voltage Vref is higher than the signal voltage Vx, the output Vco is the "H" level, and when the reference voltage Vref is equal to or lower than the signal voltage Vx, the output Vco is the "L" level.

The up/down counter 34B, which is an asynchronous counter, is given the clock CK by the system control circuit 36 at the same time as the DAC 18A under the control of control signals CS2 given by the system control circuit 36, and counts down (DOWN) or counts up (UP) in synchronization with the clock CK to measure the comparison time period from the start to the end of a comparison operation performed by the comparator 34A.

Specifically, in the normal frame rate mode, for the operation of reading out a signal from one sensor pixel 12, the up/down counter 34B counts down during the first readout operation to measure the comparison time in the first readout operation, and counts up during the second readout operation to measure the comparison time in the second readout operation.

On the other hand, in the high-speed frame rate mode, the count result with respect to the sensor pixel 12 in a certain row is held, and subsequently, with respect to the sensor pixel 12 in the next row, the up/down counter 34B counts down from the previous count result during the first readout operation to measure the comparison time in the first readout operation, and counts up during the second readout operation to measure the comparison time in the second readout operation.

In the normal frame rate mode, upon completion of the count operation by the up/down counter 34B with respect to the sensor pixel 12 in a certain row, the transfer switch 34C is turned on (closed) and transfers the result of counting by the up/down counter 34B to the memory device 34D, under the control of control signals CS3 given by the system control circuit 36.

On the other hand, in the high-speed frame rate of, for example, N=2, when the count operation by the up/down counter 34B is completed with respect to the sensor pixel 12 in a certain row, the transfer switch 34C remains off (open). Subsequently, when the count operation by the up/down counter 34B is completed with respect to the sensor pixel 12 in the next row, the transfer switch 34C is turned on and transfers the result of counting by the up/down counter 34B for the vertical two pixels to the memory device 34D.

In this way, an analog signal supplied from each sensor pixel 12 in the pixel region 13 column by column through the vertical signal lines 24 is converted into an N-bit digital signal through operations by the comparator 34A and the up/down counter 34B in each of the ADCs 34-1 to 34-$m$, and the digital signal is stored in the memory device 34D.

The horizontal drive circuit 35, which includes a shift register and others, controls column addresses and column scanning on ADCs 34-1 to 34-$m$ in the column signal processing circuit 34. Under the control of the horizontal drive circuit 35, N-bit digital signals resulting from AD conversion in the individual ADCs 34-1 to 34-$m$ are sequentially read out to the horizontal output line 37, and then output as imaging data through the horizontal output line 37.

In addition to the above-described components, there may be provided, for example, a circuit (not illustrated because the circuit is not directly related to the present disclosure) that performs various types of signal processing on the imaging data that is output through the horizontal output line 37.

In the solid-state imaging element 1 equipped with the column-parallel ADC according to the present modification configured as above, the result of counting by the up/down counter 34B can be selectively transferred to the memory device 34D through the transfer switch 34C, and therefore, the count operation by the up/down counter 34B and the operation of reading out the result of counting by the up/down counter 34B to the horizontal output line 37 can be independently controlled.

Figure 21:
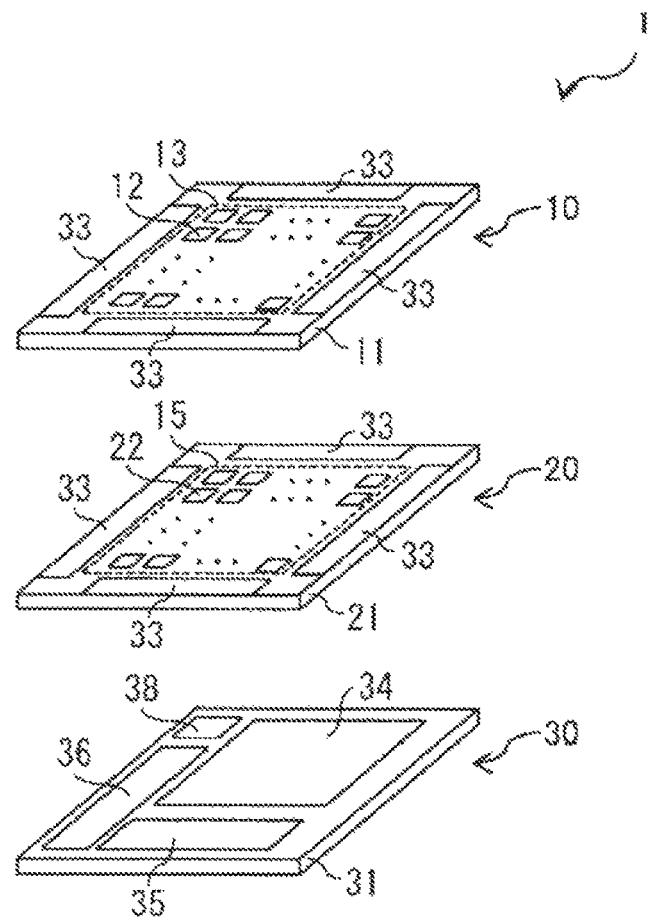
FIG. 21 is a diagram illustrating an example of the solid-state imaging element in FIG. 20 including three stacked substrates.

FIG. 21 illustrates an example of the solid-state imaging element 1 in FIG. 20 including stacked substrates: the first substrate 10, the second substrate 20, and the third substrate 30.

In the present modification, the pixel region 13 including the plurality of sensor pixels 12 is formed in a central portion on the first substrate 10, and the vertical drive circuit 33 is formed around the pixel region 13.

In addition, on the second substrate 20, the readout circuit region 15 including the plurality of readout circuits 22 is formed in a central portion and the vertical drive circuit 33 is formed around the readout circuit region 15.

Furthermore, on the third substrate 30, the column signal processing circuit 34, the horizontal drive circuit 35, the system control circuit 36, the horizontal output line 37, and the reference voltage supply unit 38 are formed.

Owing to the configuration above, as in the aforementioned configuration in FIG. 1 and modifications thereof, there is no increase in chip size or no inhibition on making the area per pixel much smaller, which may be caused by a structure in which substrates are electrically connected. As a result, the solid-state imaging element 1 in a three-layer structure can be provided on a chip equal to conventional chips in size without inhibiting the area per pixel from being much smaller. Note that the vertical drive circuit 33 may be formed only on the first substrate 10 or only on the second substrate 20.

Sixth Modification

Figure 22:
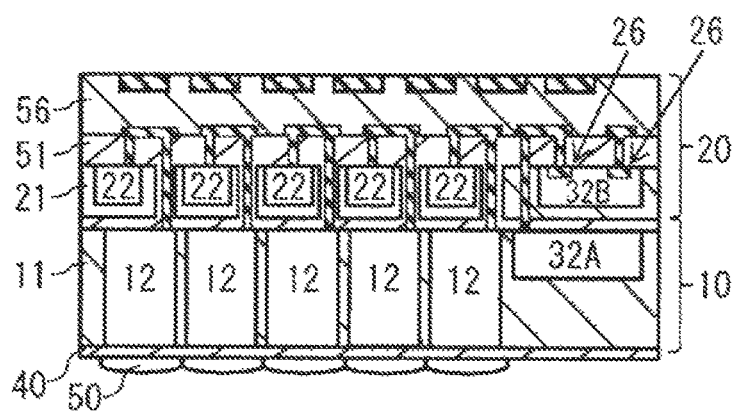
FIG. 22 is a diagram illustrating an example in which the logic circuit is divided to be formed on the substrate on which sensor pixels are disposed and on the substrate on which readout circuits are disposed.

FIG. 22 illustrates a modification of the cross-sectional configuration of the solid-state imaging element 1 according to the present modification. In the aforementioned configuration in FIG. 1 and modifications thereof, the solid-state imaging element 1 includes three stacked substrates: the first substrate 10, the second substrate 20, and the third substrate 30. However, in the above configuration in FIG. 1 and modifications thereof, the solid-state imaging element 1 may include two stacked substrates: the first substrate 10 and the second substrate 20.

In this case, the logic circuit 32 is, for example, formed separately on the first substrate 10 and the second substrate 20 as illustrated in FIG. 22. Note here that, in a circuit 32A of the logic circuit 32 disposed on the first substrate 10 side, there is provided a transistor having a gate structure in which a high dielectric constant film including a material being able to withstand a high-temperature process (high-k, for example) and a metal gate electrode are stacked. On the other hand, in a circuit 32B disposed on the second substrate 20 side, a low resistance region including a silicide formed by using a self-aligned silicide (SALICIDE) process, such as $CoSi_2$ or NiSi, is formed on a surface of the dopant diffusion region in contact with the source electrode and the drain electrode. The low resistance region containing a silicide thus includes a compound of the material of the semiconductor substrate and a metal.

Therefore, a high-temperature process such as thermal oxidation can be used to form the sensor pixel 12. Furthermore, in a case where the low resistance region 26 containing a silicide is disposed on a surface of the dopant diffusion region in contact with the source electrode and the drain electrode in the circuit 32B, which is part of the logic circuit 32 and disposed on the second substrate 20 side, the contact resistance can be reduced. As a result, calculations in the logic circuit 32 can be performed at higher speed.

Figure 23:
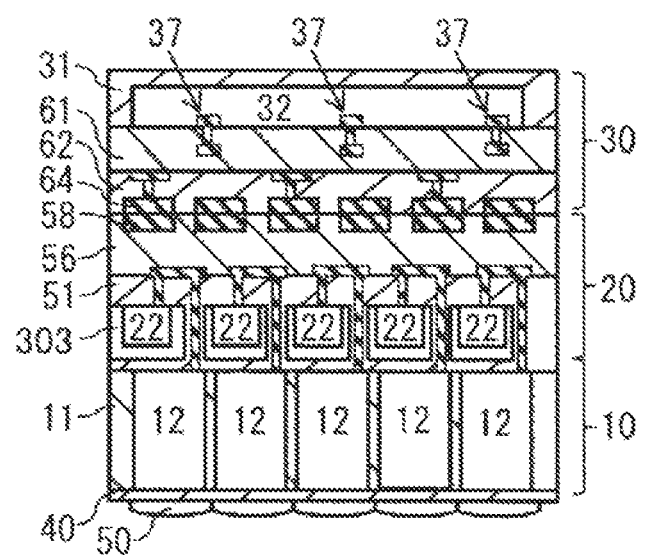
FIG. 23 is a diagram illustrating an example in which the logic circuit is formed on a third substrate.

FIG. 23 is a diagram illustrating a modification of the cross-sectional configuration of the solid-state imaging element 1 configured as in FIG. 1 or according to any of modifications thereof as described above. In the logic circuit 32 on the third substrate 30 configured as in FIG. 1 or according to any of modifications thereof as described above, a low resistance region 37 containing a silicide formed by using a self-aligned silicide (SALICIDE) process, such as $CoSi_2$ or NiSi, may be formed on a surface of the dopant diffusion region in contact with the source electrode and the drain electrode. Therefore, a high-temperature process such as thermal oxidation can be used to form the sensor pixel 12. Furthermore, in a case where the low resistance region 37 containing a silicide is disposed on a surface of the dopant diffusion region in contact with the source electrode and the drain electrode in the logic circuit 32, the contact resistance can be reduced. As a result, calculations in the logic circuit 32 can be performed at higher speed.

First Embodiment

A solid-state imaging element of a first embodiment will now be described with reference to FIGS. 24 to 33.

(Example Overall Configuration of Solid-State Imaging Element)

Figure 24:
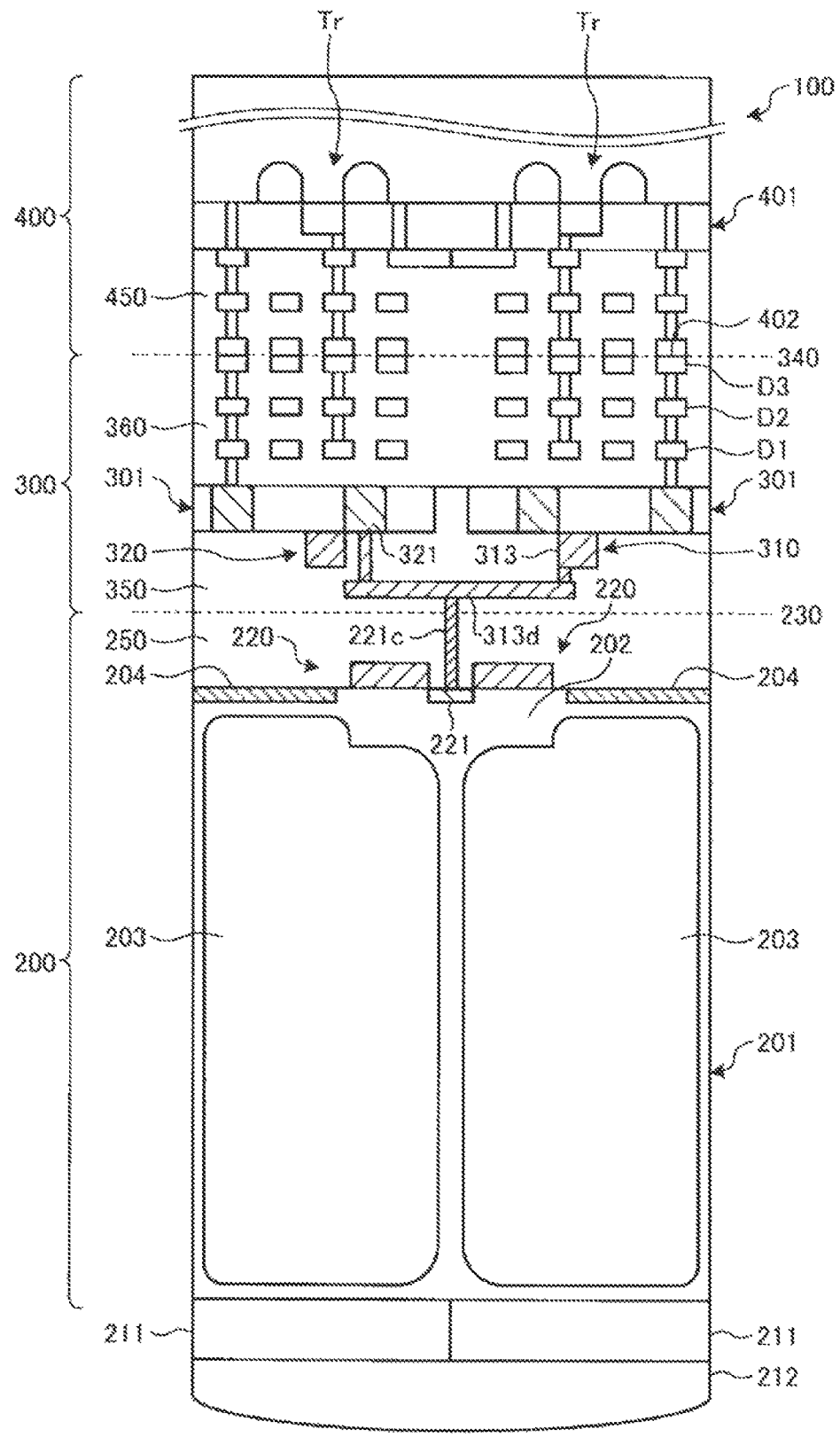
FIG. 24 is a diagram illustrating part of a cross section of a solid-state imaging element according to a first embodiment of the present disclosure.

FIG. 24 is a diagram illustrating part of a cross section of a solid-state imaging element 100 according to the first embodiment of the present disclosure. As illustrated in FIG. 24, the solid-state imaging element 100 has a structure in which a stacked body 200, a stacked body 300, and a stacked body 400 are stuck together. A plane 230 shown in FIG. 24 is the plane on which the stacked body 200 and the stacked body 300 are stuck together. Furthermore, a plane 340 shown in FIG. 24 is the plane on which the stacked body 300 and the stacked body 400 are stuck together. These stacked bodies 200 to 400 are electrically connected to one another.

A color filter 211 is disposed below the stacked bodies 200 to 400, that is, on the bottom of the stacked body 200. An on-chip lens 212 is disposed under the color filter 211. The on-chip lens 212 condenses the incident light. The condensed light is guided through the color filter 211 to a photoelectric conversion element 203 included in the stacked body 200.

The stacked body 200 has a structure in which multiple films including a transistor and others are stacked on a substrate 201. The substrate 201 is a semiconductor substrate such as an N-type silicon substrate. On the substrate 200, a P-type semiconductor region 202 (P well), for example, is formed. An N-type semiconductor region is formed in the semiconductor region 202, whereby the photoelectric conversion element 203, such as a photodiode having a PN junction, is formed. The photoelectric conversion element 203 converts, through photoelectric conversion, the received light into an electric signal corresponding to the amount of the received light.

A hole accumulation diode (HAD) 204, which is a $P^+$ type semiconductor region, is formed above the photoelectric conversion element 203. The HAD 204 functions as a hole accumulation layer to suppress a dark current generated on the surface of the photoelectric conversion element 203, which is an N-type photodiode.

On the substrate 201, an N-type transfer transistor 220 is disposed. The transfer transistor 220 includes a floating diffusion (FD) 221, which is an N-type source region. The transfer transistor 220 transfers an electric signal, which is output from the photoelectric conversion element 203, to a pixel transistor. The FD 221 temporarily holds an electric signal output from the photoelectric conversion element 203.

Both the transfer transistor 220 including the FD 221 and the HAD 204 are covered with an insulating film 250.

The stacked body 300 has a structure in which multiple films including a transistor and others are stacked on a substrate 301. The substrate 301 is a semiconductor substrate such as a P-type silicon substrate. The stacked body 300 is turned upside down and stuck on the insulating film 250 in the stacked body 200.

On the substrate 301, that is, on the side of the substrate 301 facing the substrate 201, pixel transistors including an amplification transistor 310 of N type, a reset transistor 320 of N type, and a selection transistor of N type (not illustrated) are disposed. The pixel transistors perform a process of reading out an electric signal corresponding to the amount of light received by the photoelectric conversion element 203.

A wiring 313d is connected to a gate electrode 313 of the amplification transistor 310. The wiring 313d is connected to a source region 321 of the reset transistor 320. Furthermore, the wiring 313d is connected to the FD 221 of the transfer transistor 320 via a contact 221c.

The pixel transistors including the amplification transistor 310 and the reset transistor 320 are covered with an insulating film 350. Accordingly, the insulating film 250 and the insulating film 350 are joined together on the plane 230 on which the stacked body 200 and the stacked body 300 are stuck together.

On the lower surface of the substrate 301, that is, on the side opposite to the side on which the pixel transistors are disposed, wirings D1 to D4 are formed in four layers. The wiring D1 is formed in the lowermost first layer. The wiring D4 is formed in the uppermost fourth layer. Note that the number of wiring layers is not limited to four but can be changed to any number in accordance with design conditions or the like.

The wirings D1 to D4 are covered with an insulating film 360.

The stacked body 400 has a structure in which multiple films including a transistor and others are stacked on a substrate 401. The substrate 401 is a semiconductor substrate such as a silicon substrate. The stacked body 400 is turned upside down and joined onto the wiring D4 in the stacked body 300. In the example in FIG. 24, a junction point 402 between the wiring D4 and a wiring in the stacked body 400 is superimposed on a pixel region in which pixels are disposed.

A plurality of logic transistors Tr disposed on the substrate 401, that is, on the side of the substrate 401 opposite to the side facing the substrate 301 is connected to the wirings in the stacked body 400. The wirings in the stacked body 400 and the logic transistors Tr are covered with an insulating film 450. The wirings in the stacked body 400 and the logic transistors Tr constitute a logic circuit. The logic circuit is a peripheral circuit disposed in the solid-state imaging element 100 to process, for example, the electric signals generated in the photoelectric conversion element 203.

(Example Detailed Configuration of Solid-State Imaging Element)

Figure 25:
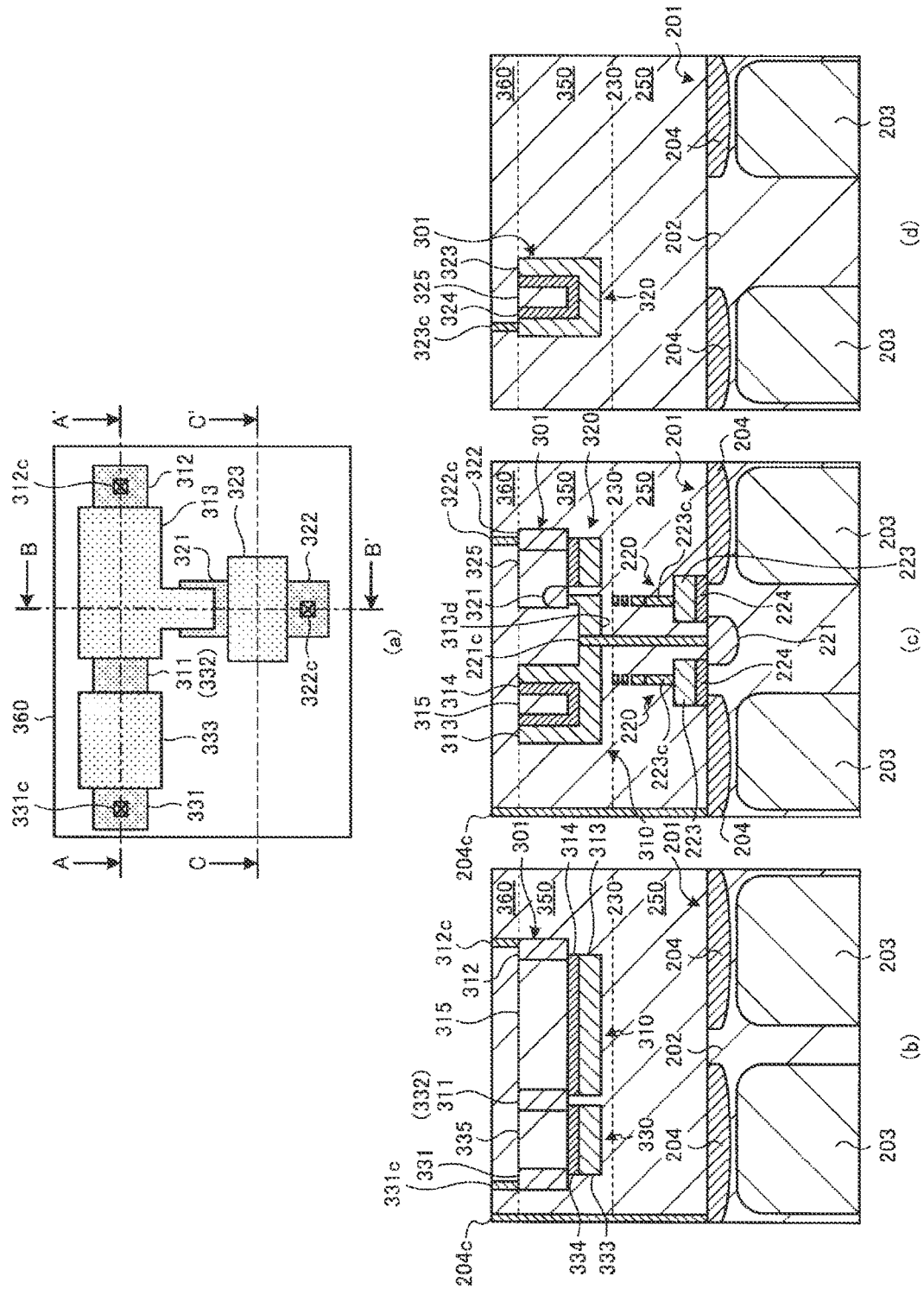
FIG. 25 is a schematic diagram illustrating a region around the positions where stacked bodies of the solid-state imaging element according to the first embodiment of the present disclosure are stuck together.

The following describes an example detailed configuration of the solid-state imaging element 100 of the first embodiment with reference to FIG. 25. FIG. 25 is a schematic diagram illustrating a region around the position where the stacked bodies 200 and 300 of the solid-state imaging element 100 according to the first embodiment of the present disclosure are stuck together. FIG. 25(a) is a top view of the stacked body 300 on the side where the pixel transistors are formed, and FIGS. 25(b) to 25(d) are cross-sectional views showing regions around the position where the stacked bodies 200 and 300 are stuck together. FIG. 25(b) is a cross-sectional view taken along line A-A' in FIG. 25(a), FIG. 25(c) is a cross-sectional view taken along line B-B' in FIG. 25(a), and FIG. 25(d) is a cross-sectional view taken along line C-C' in FIG. 25(a). Note that the insulating film 350 and the contact 221c are omitted in FIG. 25(a). In addition, the position of the contact 223c is shifted in FIG. 25(b).

As illustrated in FIG. 25(c), the solid-state imaging element 100 includes the substrate 201, which is a first semiconductor substrate including the FD 221 that temporarily holds an electric signal output from the photoelectric conversion element 203. The HAD 204 is disposed above the photoelectric conversion element 203. A contact 204c connected to the upper layer wiring is connected to the HAD 204. The contact 204c is grounded via the upper layer wiring to fix the substrate potential of the substrate 201 to 0 V. The FD 221 is the source region of the transfer transistor 220. The transfer transistor 220 includes a gate insulating film 224 disposed on the substrate 201 and a gate electrode 223 disposed on the gate insulating film 224. The contact 223c connected to the upper layer wiring is connected to the gate electrode 223. The contact 223c is connected to the peripheral circuit including the logic transistor Tr via the upper layer wiring and wirings in the stacked body 400. The transfer transistor 220 transfers an electric signal, which is output from the photoelectric conversion element 203, to the amplification transistor 310.

The solid-state imaging element 100 includes the substrate 301, which is a second semiconductor substrate facing the substrate 201. The substrate 301 includes the amplification transistor 310, which is a first transistor, on the side facing the substrate 201. The amplification transistor 310 includes a channel 315 extending along the thickness direction of the substrate 301 and a gate electrode 313, which is a multi-gate extending along the thickness direction of the substrate 301 and sandwiching the channel 315. The channel 315, which includes part of the substrate 301, serves as a current path between a source region 311 and a drain region 312, which are described later, when a voltage is applied to the gate electrode 313. A gate insulating film 314 is interposed between the channel 315 and the gate electrode 313. The amplification transistor 310 is configured as, for example, a tri-gate transistor in which the gate electrode 313 is connected on three sides to the channel 315 via the gate insulating film 314. The amplification transistor 310 amplifies the electric signal transferred from the photoelectric conversion element 203 by the transfer transistor 220 and outputs the amplified electric signal.

As illustrated in FIG. 25(d), the substrate 301 includes the reset transistor 320, which is a second transistor including a source region 322, on the side facing the substrate 201. The reset transistor 320 includes a channel 325 extending along the thickness direction of the substrate 301 and a gate electrode 323, which is a multi-gate extending along the thickness direction of the substrate 301 and sandwiching the channel 325. The channel 325, which includes part of the substrate 301, serves as a current path between a source region 321 and a drain region 322, which are described later, when a voltage is applied to the gate electrode 313. A gate insulating film 324 is interposed between the channel 325 and the gate electrode 323. The reset transistor 320 is configured as, for example, a tri-gate transistor in which the gate electrode 323 is connected on three sides to the channel 325 via the gate insulating film 324. The reset transistor 320 resets (initializes) the potential of the gate electrode 313 of the amplification transistor 310 to the power supply potential. The reset transistor 320 also serves as a transistor that resets the potential of the FD 221.

The gate electrode 323 of the reset transistor 320 is connected to the wirings D1 to D4, which are signal lines transmitting electrical signals from the surface side of the substrate 301 opposite to the surface facing the substrate 201. Specifically, the gate electrode 323 is connected to the wirings D1 to D4 via a contact 323c. The wirings D1 to D4 are connected to the peripheral circuit including the logic transistor Tr via wirings in the stacked body 400 to send and receive electric signals.

As illustrated in FIG. 25(b), the substrate 301 includes a selection transistor 330 on the side facing the substrate 201. The selection transistor 330 includes a channel 335 extending along the thickness direction of the substrate 301 and a gate electrode 333, which is a multi-gate extending along the thickness direction of the substrate 301 and sandwiching the channel 335. The channel 335, which includes part of the substrate 301, serves as a current path between a source region 331 and a drain region 332, which are described later, when a voltage is applied to the gate electrode 313. A gate insulating film 334 is interposed between the channel 335 and the gate electrode 333. The selection transistor 330 is configured as, for example, a tri-gate transistor in which the gate electrode 333 is connected on three sides to the channel 335 via the gate insulating film 334. The selection transistor 330 selects whether or not to transmit an electric signal amplified in the amplification transistor 310 to the wirings D1 to D4 in the upper layer so that the electric signal is processed.

As illustrated in FIG. 25(a), the gate electrode 313 of the amplification transistor 310 and the gate electrode 333 of the selection transistor 330 are disposed in parallel. The gate electrode 333 of the selection transistor 330 and the gate electrode 323 of the reset transistor 320 are disposed to be orthogonal to each other.

As illustrated in FIG. 25(c), the gate electrode 313 of the amplification transistor 310 is connected to the FD 221. Specifically, the solid-state imaging element 100 includes a contact 221c that connects the gate electrode 313 and the FD 221 between their surfaces facing each other. That is, in the example in FIG. 25, the contact 221c containing polysilicon or the like connects the surface of the gate electrode 313 extending along the thickness direction of the substrate 301 toward the substrate 201, the surface being the closest to the substrate 201, and the outermost surface of the surface layer of the substrate 201 where the FD 221 is disposed. In other words, the contact 221c connects the gate electrode 313 and the FD 221 in a shortest distance.

The gate electrode 313 of the amplification transistor 310 is connected to the source region 321 of the reset transistor 320. Specifically, the gate electrode 313 of the amplification transistor 310 extends toward the reset transistor 320 to form the wiring 313d. The gate electrode 313 of the amplification transistor 310 and the source region 321 of the reset transistor 320 are connected by the wiring 313d.

As illustrated in FIG. 25(b), the substrate 301 includes source regions 311 and 331 that extend from one surface side to the other surface side of the substrate 301, and also includes drain regions 312, 322, and 333 that extend from one surface side to the other surface side of the substrate 301. The source region 311 and the drain region 312 have N-type conductivity with a doping concentration of, for example, $1 \times 10^{18}$ cm$^{-3}$ or higher, and are included in the amplification transistor 310. The source region 331 and the drain region 332 have N-type conductivity with a doping concentration of, for example, $1 \times 10^{18}$ cm$^{-3}$ or higher, and are included in the selection transistor 330. The drain region 332 of the selection transistor 330 is connected to the source region 311 of the amplification transistor 310. The drain region 322 has N-type conductivity with a doping concentration of, for example, $1 \times 10^{18}$ cm$^{-3}$ or higher, and is included in the reset transistor 320.

Note here that the source region 321 of the reset transistor 320 also has N-type conductivity. However, the source region 321 of the reset transistor 320 is formed only in the surface layer on the surface side of the substrate 301 facing the substrate 201, without reaching the opposite surface of the substrate 301. The region extending from the FD 221 to reach the source region 321 of the reset transistor 320 via the contact 221c, the gate electrode 313 of the amplification transistor 310, and the wiring 313d is an FD region functioning as a floating diffusion. The source region 321 is made smaller than others in order to avoid an increase in the FD capacitance.

The source regions 311 and 331 are connected to the wirings D1 to D4, which are signal lines transmitting electrical signals from the surface side of the substrate 301 opposite to the surface facing the substrate 201. Specifically, the source region 311 is connected to the wirings D1 to D4 via a contact 311c. The source region 331 is connected to the wirings D1 to D4 via a contact 331c. The wirings D1 to D4 are connected to the peripheral circuit including the logic transistor Tr via wirings in the stacked body 400 to send and receive electric signals.

The drain regions 312, 322, and 333 are connected to the power supply potential from the surface side of the substrate 301 opposite to the surface facing the substrate 201. Specifically, the drain region 312 is connected to the wirings D1 to D4 via a contact 312c. The drain region 322 is connected to the wirings D1 to D4 via a contact 322c. The drain region 332 is connected to the wirings D1 to D4 via a contact 332c. The wirings D1 to D4 are connected to the power supply potential.

(Example Detailed Configuration of Gate Electrode)

As described above, the pixel transistors disposed on the substrate 301 are configured to be, for example, tri-gate transistors. The structure of a tri-gate transistor is described here in more detail with reference to FIG. 26, taking the amplification transistor 310 as an example. The reset transistor 320 and the selection transistor 330 are configured in a similar manner to the amplification transistor 310 as described below.

Figure 26:
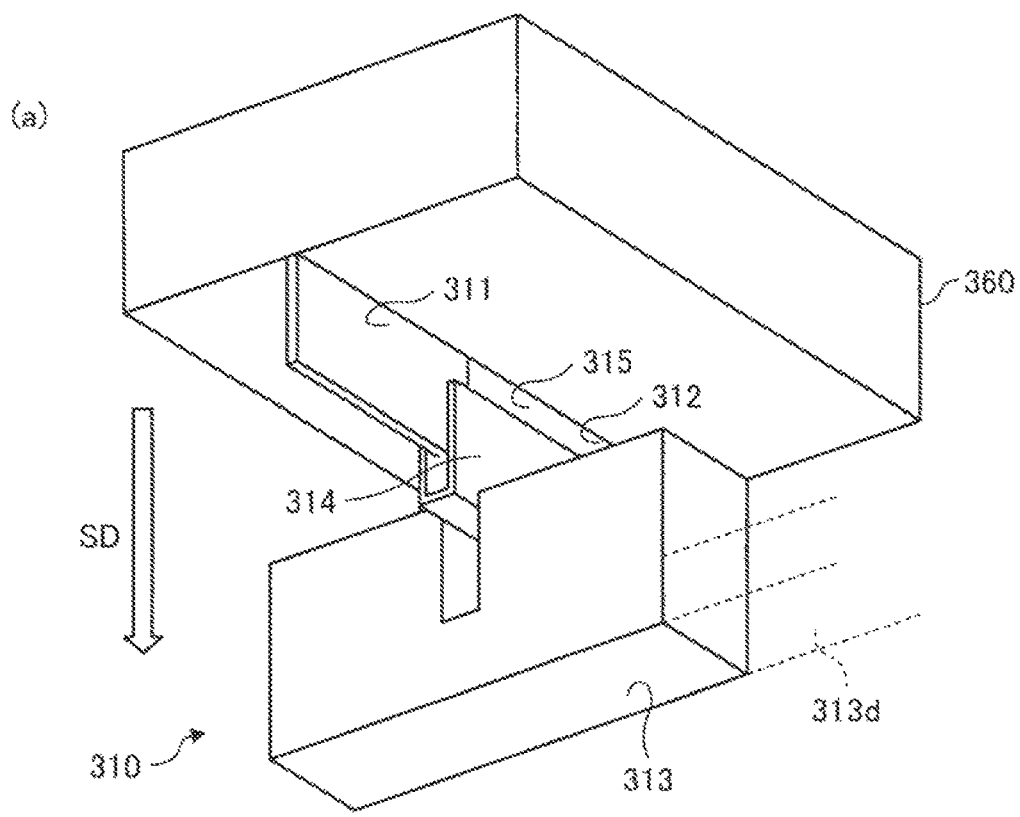
FIG. 26 is a schematic diagram illustrating a configuration of an amplification transistor according to the first embodiment of the present disclosure.
Figure 26:
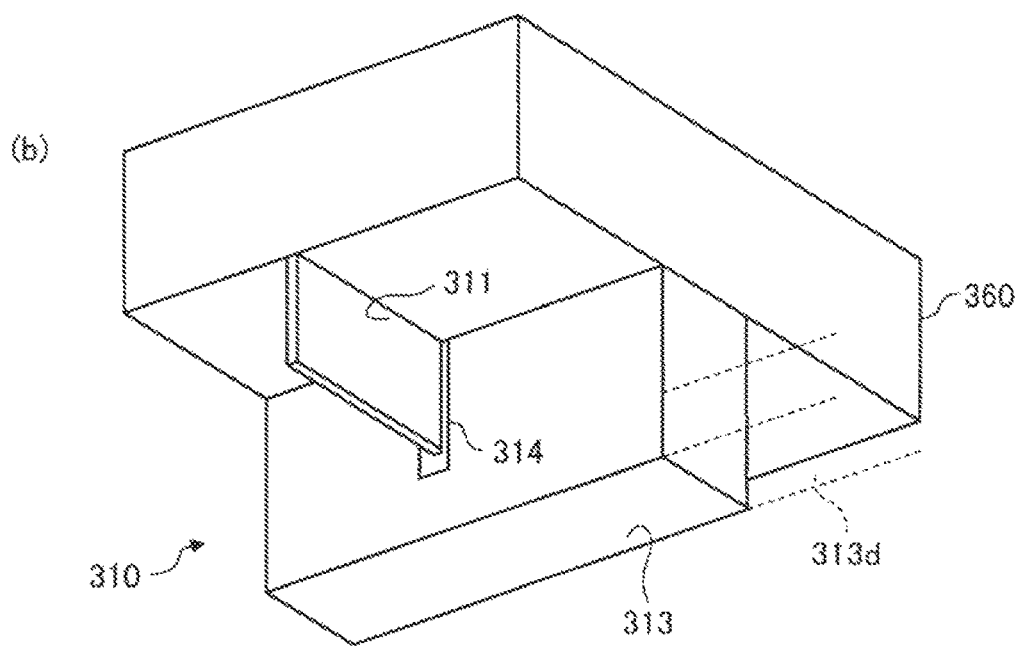

FIG. 26 is a schematic diagram illustrating a configuration of the amplification transistor 310 according to the first embodiment of the present disclosure. FIG. 26(a) is an exploded perspective view of the amplification transistor 310, and FIG. 26(b) is a perspective view of the amplification transistor 310.

As illustrated in FIG. 26, the source region 311, the drain region 312, and the channel 314 sandwiched therebetween are formed into a plate upright along the stacking direction SD of the stacked body 300.

Part of the source region 311, all of the channel 314, and part of the drain region 312 are covered with the gate insulating film 314. The gate insulating film 314 includes, for example, a high-k material such as $Al_2O_3$, $TiO_2$, $Ta_2O_5$, $HfO_2$, HfSiON, $HfSiO_4$, $ZrO_2$, $ZrSiO_4$, $La_2O_3$, or $Y_2O_3$.

The gate insulating film 314 is covered with the gate electrode 313. The gate electrode 313 includes, for example, polysilicon. The amplification transistor 313 may be a metal gate transistor in which the gate electrode 313 includes a metal-based material such as TaCx, W, WNx, or TiN.

In the amplification transistor 310 configured as a tri-gate transistor, the gate width is the sum of the width of the plate-shaped channel (thickness of the plate) and its height× 2.

As described above, the amplification transistor 310 includes the source region 311 of N type, the drain region 312 of N type, and the channel 315 of P type sandwiched between these regions. In addition, the insulating film 360 is disposed directly below the NPN-structured body of the amplification transistor 310. That is, the amplification transistor 310 has a fully depleted silicon-on-insulator (FD-SOI) structure.

(Example Process of Manufacturing Solid-State Imaging Element)

The following describes an example process of manufacturing the solid-state imaging element 100 of the first embodiment with reference to FIGS. 27 to 31. FIGS. 27 to 31 are flow diagrams illustrating an example of a procedure for manufacturing the solid-state imaging element 100 according to the first embodiment of the present disclosure. Note that the figures on the left in FIGS. 27 to 31 are cross-sectional views of the in-process solid-state imaging element 100 taken along line A-A' in FIG. 25(*a*). The figures in the center in FIGS. 27 to 31 are cross-sectional views of the in-process solid-state imaging element 100 taken along line B-B' in FIG. 25(*a*). The figures on the right in FIGS. 27 to 31 are cross-sectional views of the in-process solid-state imaging element 100 taken along line C-C' in FIG. 25(*a*).

Figure 27:
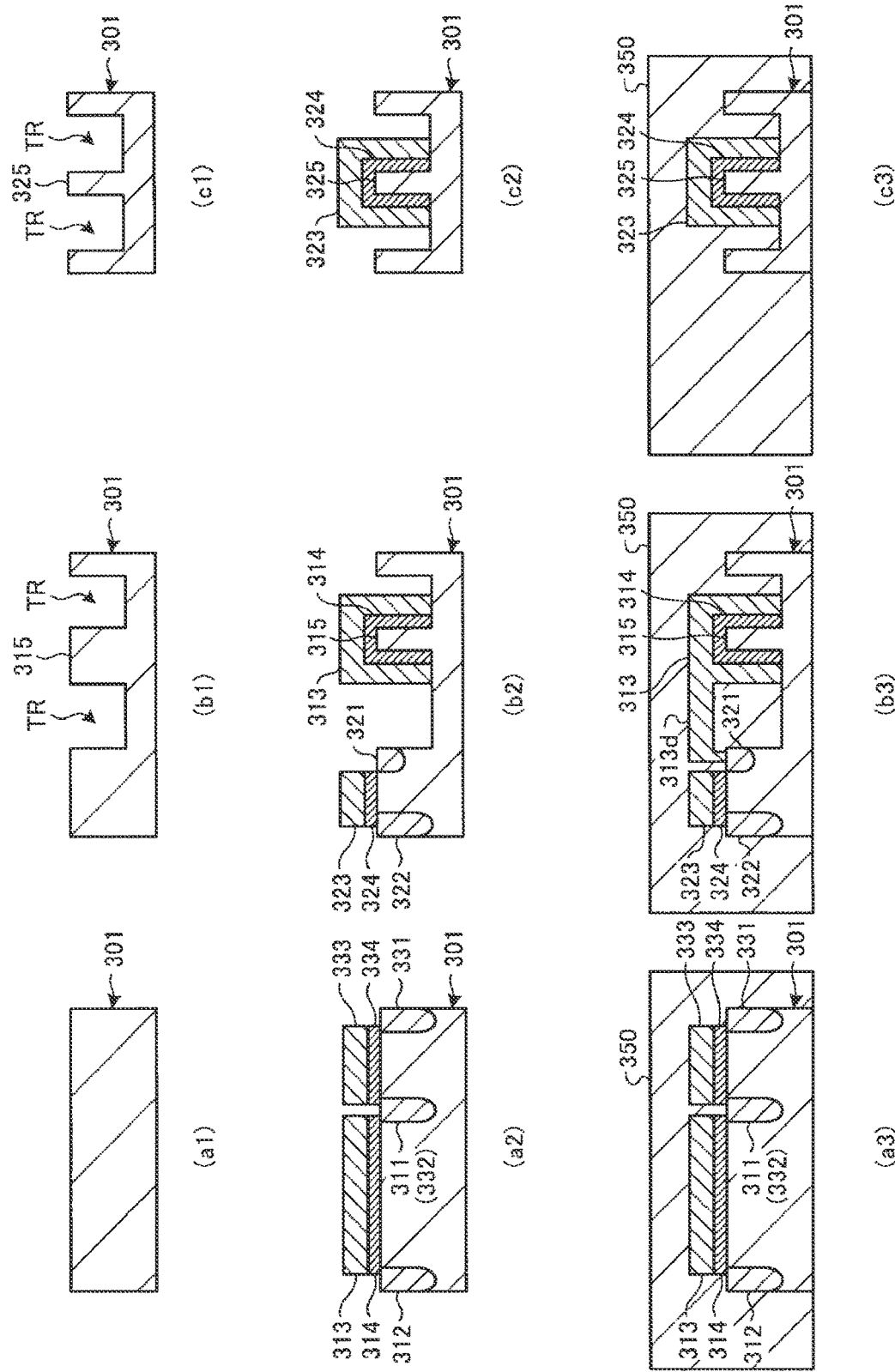
FIG. 27 is a flow diagram illustrating an example of a procedure for manufacturing the solid-state imaging element according to the first embodiment of the present disclosure.

As illustrated in FIGS. 27(*a*1), 27(*b*1), and 27(*c*1), the substrate 301, which is a P-type silicon substrate or the like, is subjected to element isolation, and then the channels 315, 325 are formed by making a trench TR. Although not illustrated, the channel 335 is also formed at the same time.

As illustrated in FIGS. 27(*a*2), 27(*b*2), and 27(*c*2), the gate insulating films 314, 324, and 334 are formed so as to cover the channels 315, 325, and 335. Furthermore, the gate electrodes 313, 323, and 333 are formed so as to cover the gate insulating films 314, 324, and 334.

Then, the source regions of N type 311, 321, and 331 and the drain regions of N type 312, 322, and 332 are formed in the substrate 301 on both sides of the gate electrodes 313, 323, and 333 so as to have a doping concentration of $1 \times 10^{18}$ $cm^{-3}$ or higher. The source regions 311 and 331 and the drain regions 312, 322, and 332 are formed to the depth of the trench TR. The source region 321 is formed to be shallower than the other source regions 311 and 331.

As illustrated in FIGS. 27(*a*3), 27(*b*3), and 27(*c*3), while the insulating film 350 is stacked over the individual components on the substrate 301, the wiring 313*d* connecting the gate electrode 313 and the source region 321 is formed. The insulating film 350 is stacked until the components including the wiring 313*d* are entirely covered.

Figure 28:
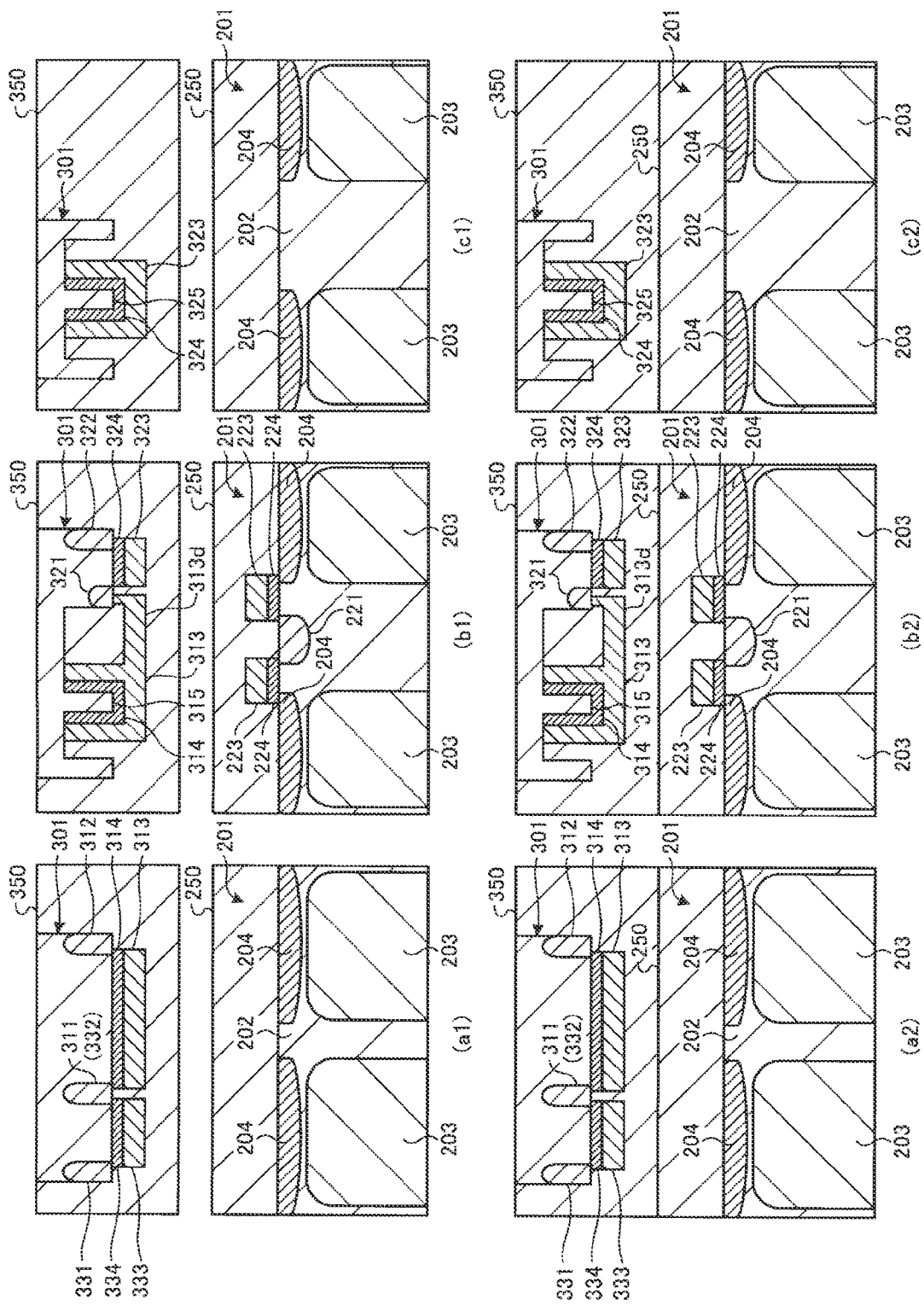
FIG. 28 is a flow diagram illustrating an example of a procedure for manufacturing the solid-state imaging element according to the first embodiment of the present disclosure.

As illustrated in FIGS. 28(*a*1), 28(*b*1), and 28(*c*1), in the substrate 201, which is an N-type silicon substrate or the like, the semiconductor region 202 of P type is formed, the photoelectric conversion element 203, which is an N-type photodiode or the like, is formed, and the HAD 204, which is a semiconductor region of P$^+$ type, is formed.

Furthermore, the gate insulating film 224 is formed on the substrate 201, and the gate electrode 223 is formed on the gate insulating film 224. Then, as an N-type source region, the FD 221 is formed in the substrate 201 near the gate electrode 223.

After that, the insulating film 250 is formed on the substrate 201 so as to cover the individual components. The substrate 301 described above is turned upside down and placed so that the surface on which pixel transistors are formed faces the substrate 201, which has the components formed thereon.

As illustrated in FIGS. 28(*a*2), 28(*b*2), and 28(*c*2), the substrate 201 and the substrate 301 are stuck together. In this process, the insulating film 250 formed on the substrate 201 and the insulating film 350 formed on the substrate 301 are joined together.

As a result, the transfer transistor 220 on the substrate 201 and the pixel transistors on the substrate 301 face each other. In addition, the wiring 313*d* extended from the gate electrode 313 is disposed directly above the FD 221 on the substrate 201.

Figure 29:
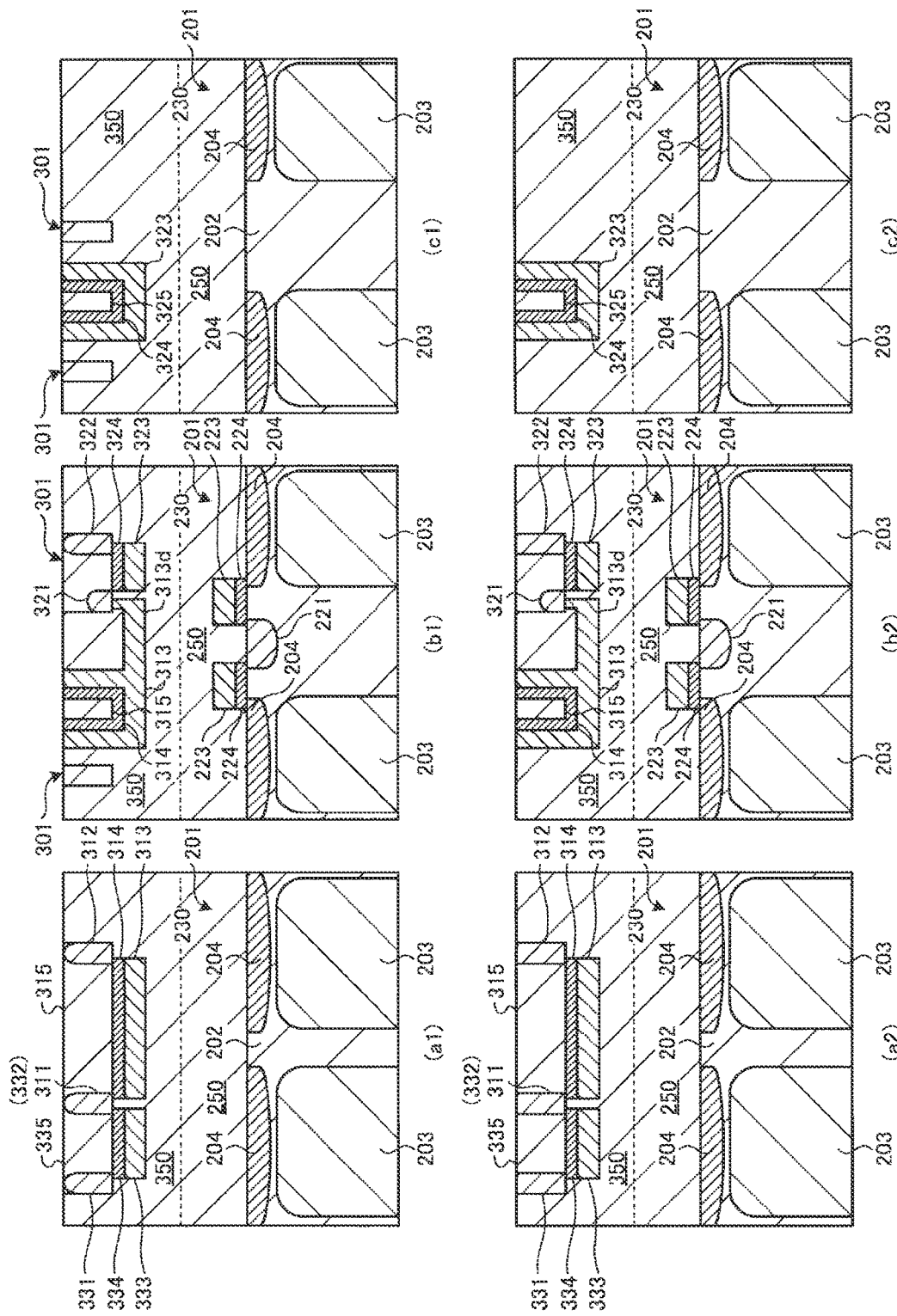
FIG. 29 is a flow diagram illustrating an example of a procedure for manufacturing the solid-state imaging element according to the first embodiment of the present disclosure.

As illustrated in FIGS. 29(*a*1), 29(*b*1), and 29(*c*1), the substrate 301 is made thinner by grinding the surface of the substrate 301 opposite to the side on which the pixel transistors are formed. The substrate 301 is made thinner until, for example, the bulk substrate 301 disappears, the end of each of the channels 315, 325, and 335 on the side opposite to the side covered with the gate electrodes 313, 323, and 333 and the like is exposed, both ends of each of the U-shaped gate insulating films 314, 324, and 334 are exposed, and both ends of each of the U-shaped gate electrodes 313, 323, and 333 are exposed. Note that, however, the bulk substrate 301 may be left. As illustrated in FIGS. 29(*a*1), 29(*b*1), and 29(*c*1), in a case where the bulk substrate 301 is eliminated, each pixel transistor has an FD-SOI structure.

Note that, although the substrate 301 that has been ground partly remains separated around each of the pixel transistors, such a substrate 301 is not illustrated in the following drawings.

From the surface of the substrate 301 opposite to the side on which the pixel transistors are formed as illustrated in FIGS. 29(*a*2), 29(*b*2), and 29(*c*2), ion implantation or the like is carried out at positions corresponding to the source regions 311 and 331 and the drain regions 312, 322, and 332 so as to have a doping concentration of $1 \times 10^{18}$ $cm^{-3}$ or higher. As a result, the source regions 311 and 331 and the drain regions 312, 322, and 332 that extend from one surface side of the substrate 301 to reach the other surface side are obtained.

Figure 30:
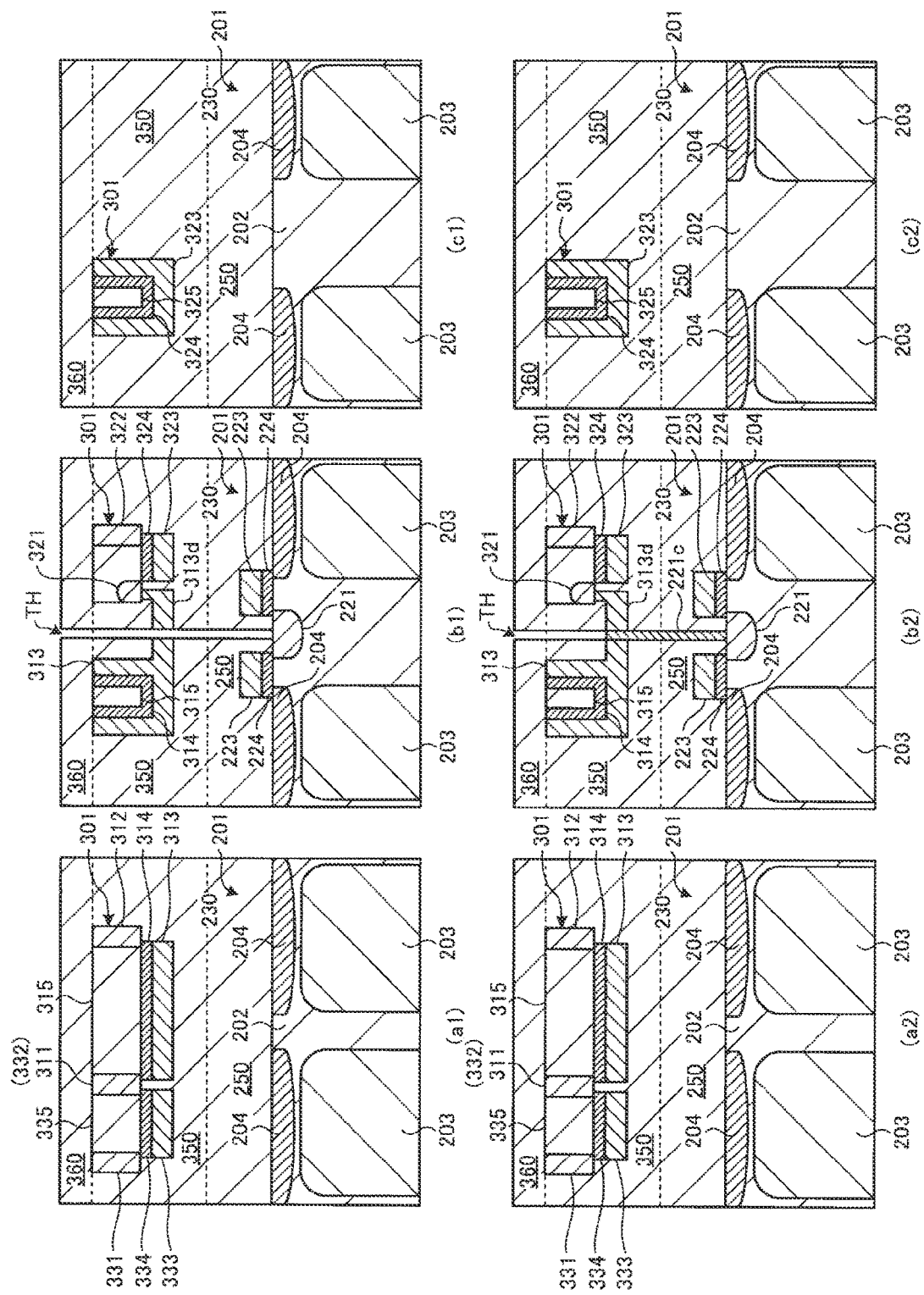
FIG. 30 is a flow diagram illustrating an example of a procedure for manufacturing the solid-state imaging element according to the first embodiment of the present disclosure.

As illustrated in FIGS. 30(*a*1), 30(*b*1), and 30(*c*1), the insulating film 360 is formed on the substrate 301 to cover the individual components. Then, a through hole TH passing through the insulating films 360, 350, and 250 and the wiring 313*d* to reach the FD 221 in the substrate 201 is formed.

As illustrated in FIGS. 30(*a*2), 30(*b*2), and 30(*c*2), the through hole TH is filled with a conductive material such as polysilicon up to the height of the wiring 313*d* to form the contact 221*c* connecting the wiring 313*d* and the FD 221.

Figure 31:
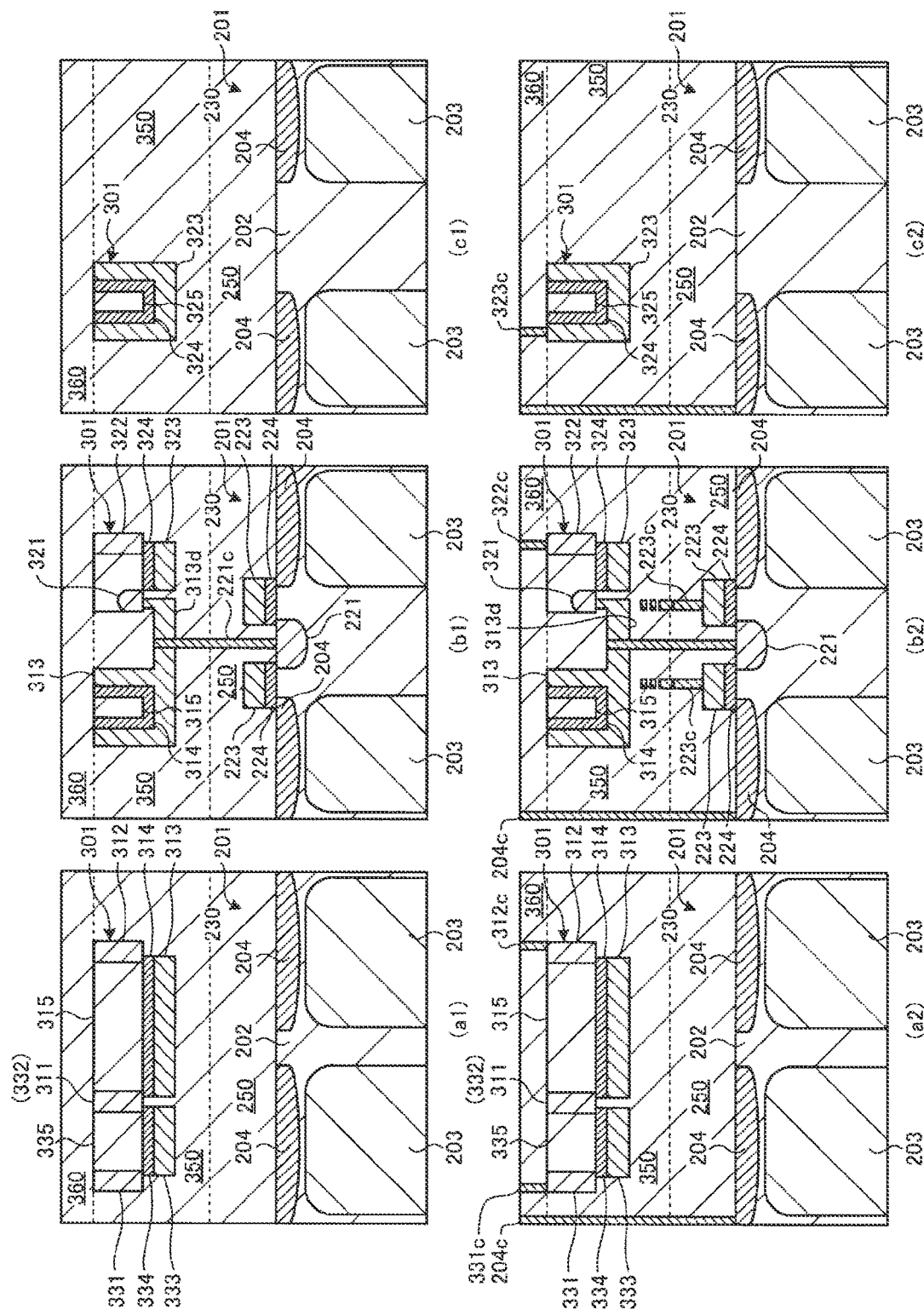
FIG. 31 is a flow diagram illustrating an example of a procedure for manufacturing the solid-state imaging element according to the first embodiment of the present disclosure.

As illustrated in FIGS. 31(*a*1), 31(*b*1), and 31(*c*1), the insulating films 350 and 360 above the wiring 313*d* are backfilled with an insulating material such as SiO$_2$.

As illustrated in FIGS. 31(*a*2), 31(*b*2), and 31(*c*2), the contact 223*c* is formed on the gate electrode 223 and connected to the upper layer wiring. The contact 204*c* is formed on the HAD 204 and connected to the upper layer wiring.

Furthermore, the contact 323*c* is formed on the gate electrode 323 and connected to the wirings D1 to D4. Although not illustrated, the contact 333*c* is also formed on the gate electrode 333 and connected to the wirings D1 to D4.

Furthermore, the contacts 311*c* and 331*c* are formed on the source regions 311 and 331 and connected to the wirings D1 to D4. The contacts 312*c*, 322*c*, and 332*c* are formed on the drain regions 312, 322, and 332 and connected to the wirings D1 to D4.

After that, the stacked body 400 in which the peripheral circuit including the logic transistor Tr, the wirings, and others are formed is stuck onto the stacked body 300. In this process, the insulating film 450 in the stacked body 400 and the insulating film 360 in the stacked body 300 are joined together. In addition, the wiring in the stacked body 400 and the wiring D4 in the stacked body 300 are connected. As a result, the wirings D1 to D4 are appropriately connected to the peripheral circuit, the ground line, the power supply potential, and others in the stacked body 400.

The process of manufacturing the solid-state imaging element 100 of the first embodiment is now finished.

Comparative Example

Figure 32:
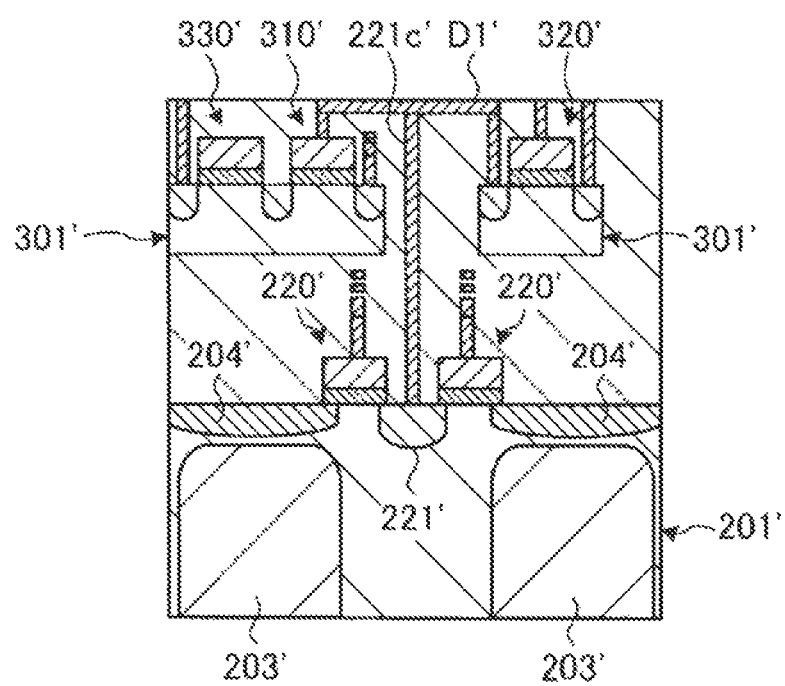
FIG. 32 is a schematic diagram illustrating a solid-state imaging element according to a comparative example of the present disclosure.

With reference to FIG. 32, a comparison is made below between a configuration of a comparative example and the configuration of the first embodiment. FIG. 32 is a schematic diagram illustrating a solid-state imaging element according to the comparative example of the present disclosure.

In the solid-state imaging element according to Patent Document 1, the semiconductor substrate on which a pixel region is formed and the semiconductor substrate on which a logic circuit is formed are joined together. That is, photoelectric conversion elements and pixel transistors are formed on the same semiconductor substrate. However, such a configuration fails to secure a sufficient space for pixel transistors to be disposed. For example, in a case where an amplification transistor among the pixel transistors is small in size, it is difficult to increase the transconductance gm or to reduce noise to a sufficient extent.

Then, a conceivable solution may be, for example, subdividing a substrate into a substrate on which the photoelectric conversion elements are formed and a substrate on which the pixel transistors are formed, and joining these substrates together. Such a configuration is shown in FIG. 32 as a comparative example.

As illustrated in FIG. 32, the solid-state imaging element of the comparative example includes a transfer transistor 220' that includes an FD 221' on a substrate 201' that includes a photoelectric conversion element 203' and an HAD 204'. A substrate 301' is disposed above the substrate 201'. On the upper surface of the substrate 301', that is, on the surface opposite to the substrate 201', an amplification transistor 310', a reset transistor 320', and a selection transistor 330' are disposed. These pixel transistors are planar transistors. In addition, the gate electrode of the amplification transistor 310', the source region of the reset transistor 320', and the FD 221' are connected via the contact 221c' and the wiring D1'.

However, such a configuration makes it necessary to extend the contact 221c' to the level of the wiring D1', resulting in a greater total wiring length. Furthermore, the configuration for connecting the gate electrode of the amplification transistor 310', the source region of the reset transistor 320', and the FD 221' is complicated. Therefore, the capacity of wirings involved in the FD 221' is increased, and the capacitance of the entire FD region is also increased. As a result, the photoelectric conversion efficiency of the photoelectric conversion element 203' is decreased.

In the solid-state imaging element 100 of the first embodiment, each pixel transistor is configured as a tri-gate transistor and is disposed to face the substrate 201. As a result, the gate electrode 313 of the amplification transistor 310 and the FD 221 can be brought closer to each other. Furthermore, the source region 321 of the reset transistor 320 and the FD 221 can be brought closer to each other. Therefore, the length of the entire wirings involved in the FD 221, that is, the lengths of the contact 221c and the wiring 313d can be reduced to improve the photoelectric conversion efficiency of the photoelectric conversion element 203.

In the solid-state imaging element 100 of the first embodiment, each pixel transistor is configured as a tri-gate transistor. Therefore, while the amplification transistor 310 faces the substrate 201, both ends of the U-shaped gate electrode 323 of the reset transistor 320 are allowed to face the wirings D1 to D4. As a result, the gate electrode 323 can be connected to the wirings D1 to D4 from the side of the substrate 301 facing the wirings D1 to D4.

In the solid-state imaging element 100 of the first embodiment, each pixel transistor is configured as a tri-gate transistor. As a result, the gate width of the pixel transistor can be expanded in the direction perpendicular to the surface of the substrate 301 without increasing the area occupied in the substrate 301, thereby further reducing noise and improving the transconductance gm.

In the solid-state imaging element 100 of the first embodiment, each pixel transistor has an FD-SOI structure. As a result, pixel transistors can be miniaturized while the parasitic capacitance can be reduced to obtain high-speed pixel transistors.

The solid-state imaging element 100 of the first embodiment includes the source regions 311 and 331 and the drain regions 312, 322, and 332 distributed all across the thickness direction of the substrate 301. Therefore, while the pixel transistors face the substrate 201, the source regions 311 and 331 and the drain regions 312, 322, and 332 can be connected to the wirings D1 to D4 from the side of the substrate 301 facing the wirings D1 to D4. Therefore, the configuration for connecting the source regions 311 and 331 and the drain regions 312, 322, and 332 to the wirings D1 to D4 is not complicated. Furthermore, since each pixel transistor is a tri-gate transistor, the gate electrodes 313, 323, and 333 have greater control over the channels 315, 325, and 335. Therefore, even when the source regions 311 and 331 and the drain regions 312, 322, and 332 having a high doping concentration are distributed from the lower surface to the upper surface of the substrate 301, a short circuit between the source regions 311, 321, and 331 and the drain regions 312, 322, and 332 can be suppressed.

The above-described configuration allows the solid-state imaging element 100 of the first embodiment to fully take advantage of disposing the photoelectric conversion element 203 and the pixel transistor on the separate substrates 201 and 301. That is, as compared with the case where the photoelectric conversion element and the pixel transistors are disposed on the same substrate, the areas of both the photoelectric conversion element 203 and the pixel transistor can be made larger. Furthermore, the number of pixels per unit area can be increased.

Moreover, in the solid-state imaging element 100 of the first embodiment, the substrate 201 and the substrate 301 are connected via the contact 221c. Furthermore, the substrate 301 and the substrate 401 are connected by the wiring D3 in the substrate 301 and the wiring in the substrate 401. These configurations reduce an area required for connection between substrates, as compared with the case where substrates are connected by a through silicon via (TSV) disposed in a peripheral region of the substrates. As a result, the chip size for the solid-state imaging element 100 can be reduced. Alternatively, the pixel region can be made larger with the same chip size.

In addition, in the solid-state imaging element 100 of the first embodiment, the junction point 402 of the contact 221c and the wiring D3 in the substrate 301 with the wiring in the substrate 401 is disposed within the pixel region. As a result, the chip size can be further reduced or the pixel region can be made larger.

First Modification

Figure 33:
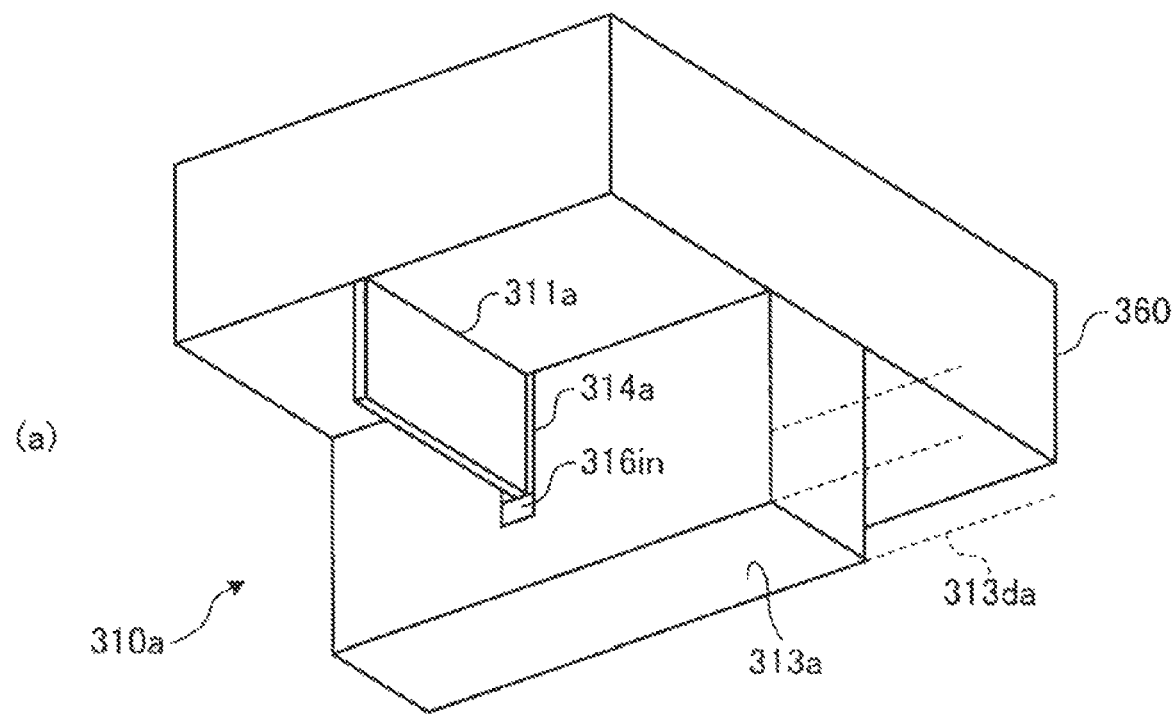
FIG. 33 is a schematic diagram illustrating a configuration of an amplification transistor in a solid-state imaging element according to a first modification of the first embodiment of the present disclosure.
Figure 33:
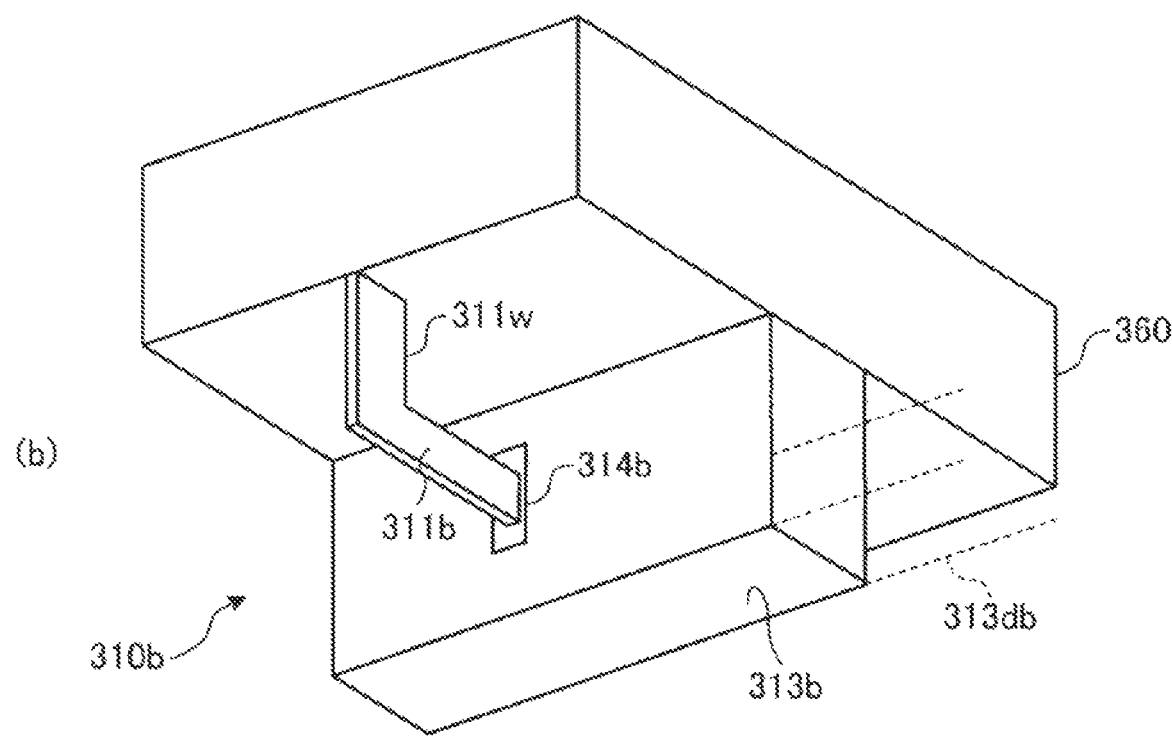

The following describes a solid-state imaging element according to a first modification of the first embodiment with reference to FIG. 33. FIG. 33 is a schematic diagram illustrating a configuration of an amplification transistor in the solid-state imaging element according to the first modification of the first embodiment of the present disclosure. The amplification transistor of the first modification is a multi-gate transistor of a type different from that of the first embodiment. A reset transistor of the first modification and a selection transistor of the first modification are configured in a similar manner to the amplification transistor described below.

As illustrated in FIG. 33(a), an amplification transistor 310a of the first modification is configured as a double-gate transistor in which a gate electrode 313a is connected to a channel on two sides via a gate insulating film 314a. That is, the amplification transistor 310a includes a source region 311a of N type, an N-type drain region (not illustrated), and a P-type channel sandwiched therebetween (not illustrated).

Both side surfaces of part of the source region 311a, both side surfaces of the entire channel, and both side surfaces of part of the drain region are covered with the gate insulating film 314a. The gate insulating film 314a includes a high-k material or the like as in the first embodiment. The lower end of part of the source region 311a, the lower end of the entire channel, and the lower end of part of the drain region in the figure are covered with an insulating film 316in.

The gate insulating film 314a and the insulating film 316in are covered with the gate electrode 313a. From the gate electrode 313a, a wiring 313da is extended to be connected to the source region of the reset transistor or the like. As in the first embodiment, the gate electrode 313a and the wiring 313da include polysilicon or a metal-based material or the like.

In the amplification transistor 310a configured as a double-gate transistor, the gate width is twice the height of the plate-shaped channel.

The amplification transistor 310a of the first modification can also be configured as a transistor having an FD-SOI structure in which the insulating film 360 is disposed directly below the NPN-structured body.

As illustrated in FIG. 33(b), an amplification transistor 310b of the first modification is configured as an all-around transistor having a gate-all-around (GAA) structure in which a gate electrode 313b is connected on four sides to a channel via a gate insulating film 314b. That is, the amplification transistor 310b includes a source region 311b of N type, an N-type drain region (not illustrated), and a P-type channel sandwiched therebetween (not illustrated).

The source region 311b, the channel, and the drain region are in a shape of a plate upright with respect to the insulating film 360. The source region 311b includes a wing portion 311w that is bent in a V shape and is in contact with the insulating film 360. The drain region includes a wing portion (not illustrated) that is bent in a V shape and is in contact with the insulating film 360.

The perimeter of part of the source region 311b, the perimeter of the entire channel, and the perimeter of part of the drain region are covered with the gate insulating film 314b. The gate insulating film 314b includes a high-k material or the like as in the first embodiment.

The gate insulating film 314b is covered with the gate electrode 313b. From the gate electrode 313b, a wiring 313db is extended to be connected to the source region of the reset transistor or the like. As in the first embodiment, the gate electrode 313b and the wiring 313db include polysilicon or a metal-based material or the like.

In the amplification transistor 310b configured as an all-around transistor, the length of the perimeter of the plate-shaped channel is the gate width.

The amplification transistor 310b of the first modification can also be configured as a transistor having an FD-SOI structure in which the insulating film 360 is disposed directly below the NPN-structured body.

As examples of the pixel transistor, the foregoing has shown a tri-gate transistor in the first embodiment and a double-gate transistor and an all-around transistor in the first modification; however, configurations of the pixel transistor are not limited thereto. Any type of the pixel transistor may be selected from various types of multi-gate transistors.

As a result, it is made possible to form a pixel transistor that can take a contact to both the substrate on which the photoelectric conversion element is formed and the wiring on the upper layer above the pixel transistor.

As a result, the pixel transistor is also allowed to have greater control over the channel. Therefore, it is made possible to form a source region and a drain region that can take a contact to both the substrate on which the photoelectric conversion element is formed and the wiring on the upper layer above the pixel transistor, while suppressing a short circuit between the source region and the drain region.

Second Modification

Figure 34:
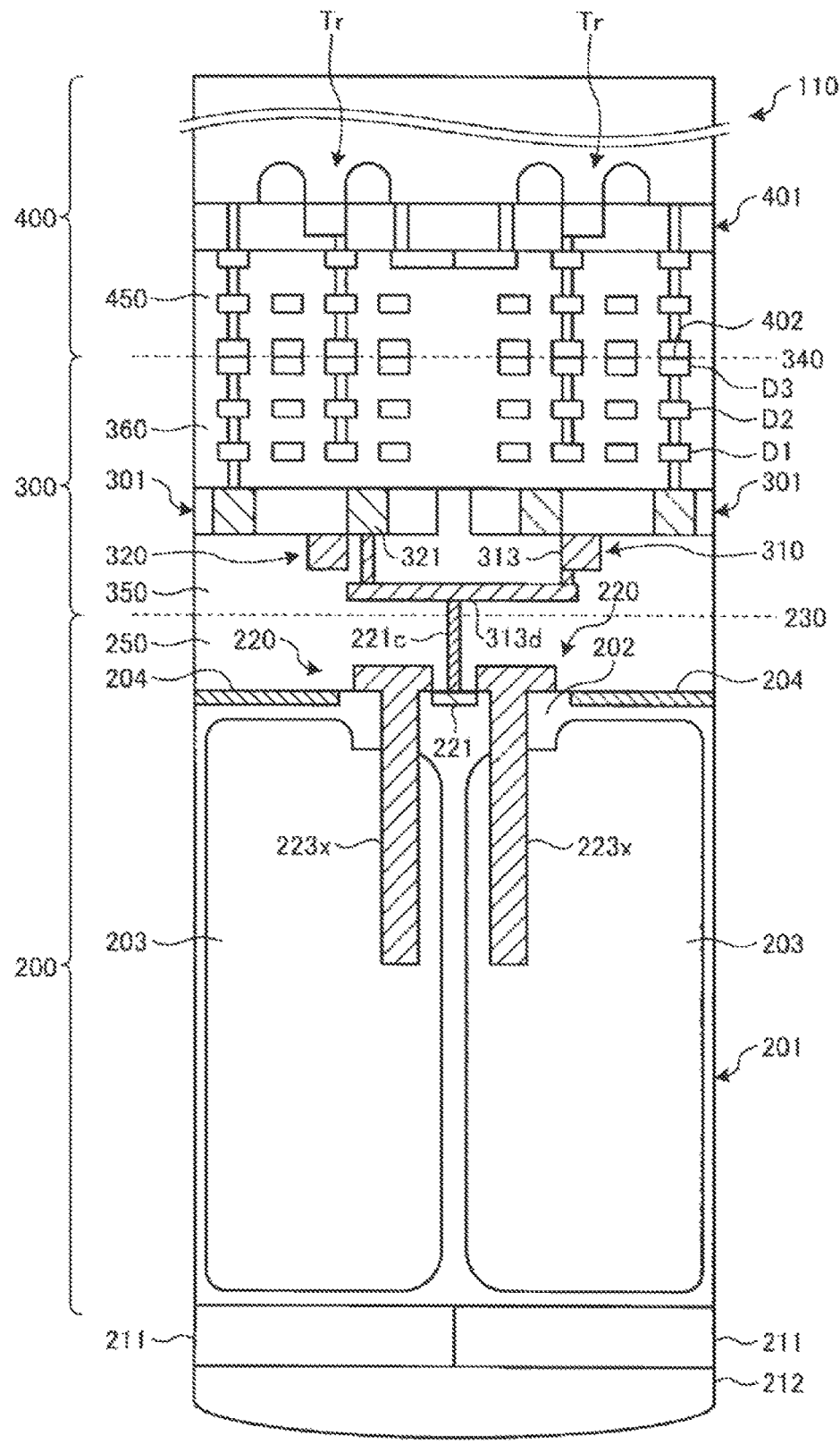
FIG. 34 is a diagram illustrating part of a cross section of a solid-state imaging element according to a second modification of the first embodiment of the present disclosure.

The following describes a solid-state imaging element 110 according to a second modification of the first embodiment with reference to FIG. 34. FIG. 34 is a diagram illustrating part of a cross section of the solid-state imaging element 110 according to the second modification of the first embodiment of the present disclosure.

As illustrated in FIG. 34, in the solid-state imaging element 110 of the second modification, a gate electrode 223x of the transfer transistor 220 is extended to reach the photodiode 203. That is, the transfer transistor 220 may include the gate electrode 223x formed to be a vertical transfer gate.

Third Modification

Figure 35:
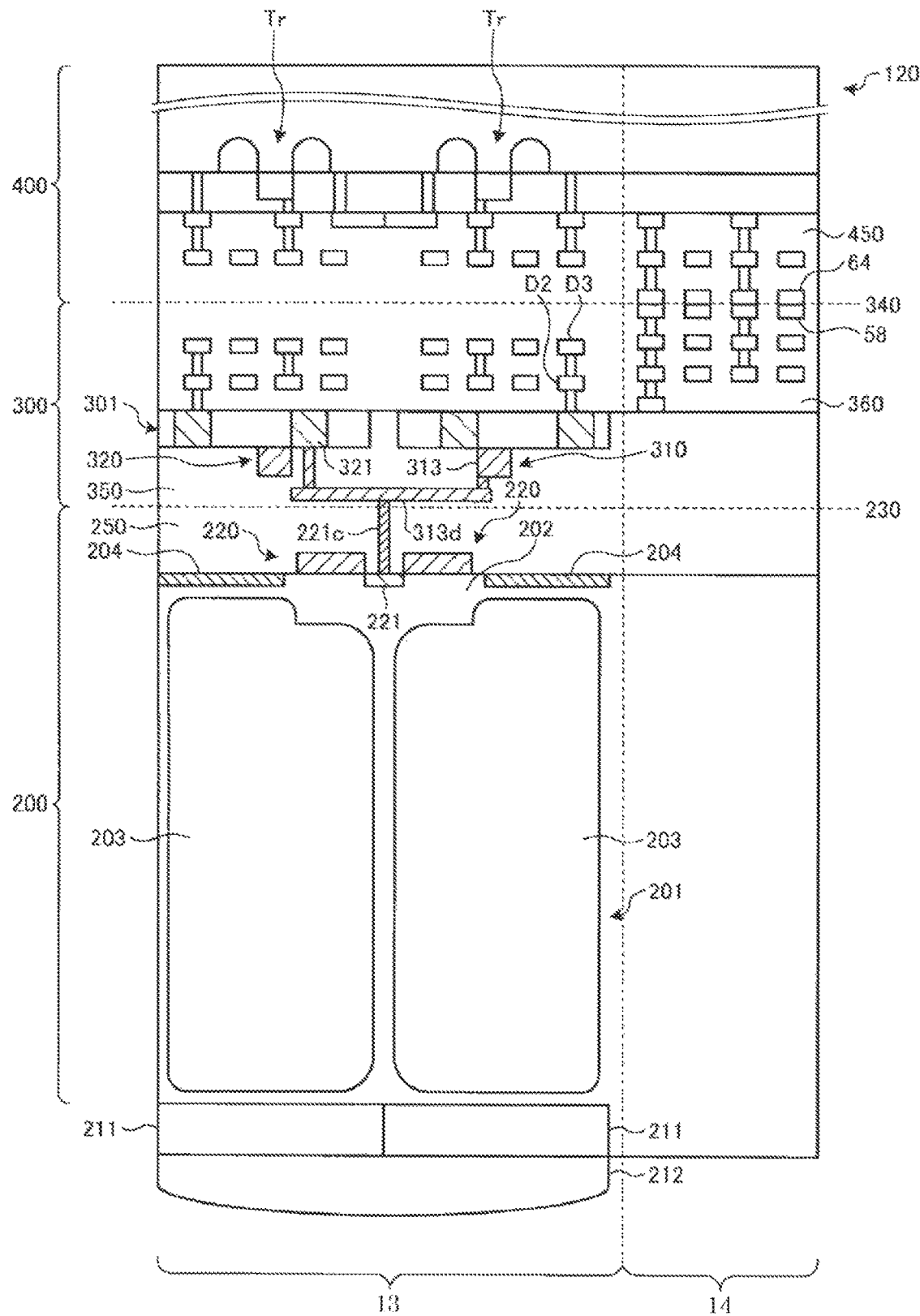
FIG. 35 is a diagram illustrating part of a cross section of a solid-state imaging element according to a third modification of the first embodiment of the present disclosure.

The following describes a solid-state imaging element 120 according to a third modification of the first embodiment with reference to FIG. 35. FIG. 35 is a diagram illustrating part of a cross section of the solid-state imaging element 120 according to the third modification of the first embodiment of the present disclosure.

As illustrated in FIG. 35, in the solid-state imaging element 120 of the third modification, the stacked body 300 and the stacked body 400 are electrically connected in a region opposed to a peripheral region 14 of the stacked body 200. The peripheral region 14, which corresponds to the frame region of the stacked body 200, is provided on a peripheral edge of the pixel region 13. The stacked body 300 includes a plurality of pad electrodes 58 in a region opposed to the peripheral region 14, and the stacked body 400 includes a plurality of pad electrodes 64 in a region opposed to the peripheral region 14. The stacked body 300 and the stacked body 400 are electrically connected to each other by joining the pad electrodes 58 and 64 provided in a region opposed to the peripheral region 14.

In this way, the stacked body 300 and the stacked body 400 are connected by joining the pad electrodes 58 and 64. Therefore, as compared with the case where two stacked bodies are connected by, for example, a TSV disposed in a peripheral region of the stacked bodies, the chip size can be made smaller or the pixel region can be made larger.

Second Embodiment

Figure 36:
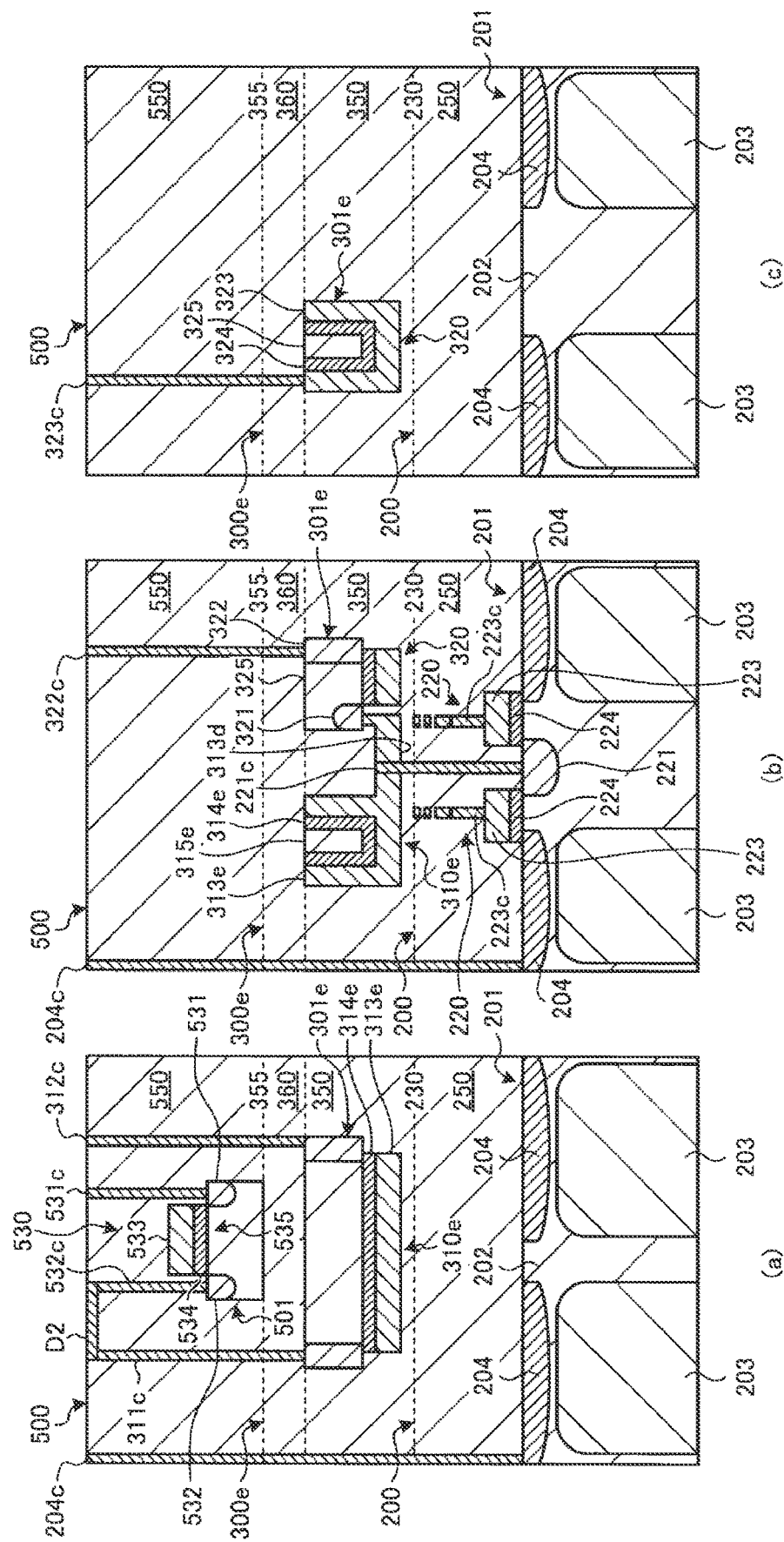
FIG. 36 is a schematic diagram illustrating a region around the positions where stacked bodies of a solid-state imaging element according to a second embodiment of the present disclosure are stuck together.

A solid-state imaging element of a second embodiment will now be described with reference to FIG. 36. FIG. 36 is a schematic diagram illustrating a region around the position where stacked bodies of the solid-state imaging element according to the second embodiment of the present disclosure are stuck together. The solid-state imaging element of the second embodiment is different from the solid-state imaging element of the above-described first embodiment in that a selection transistor 530 is disposed on a substrate 501, which is different from the substrate on which an amplification transistor 310e and others are disposed.

Note that FIG. 36(a) is a cross-sectional view taken along line A-A' in FIG. 25(a), which is the cited drawing, FIG. 36(b) is a cross-sectional view taken along line B-B' in FIG. 25(a), and FIG. 36(c) is a cross-sectional view taken along line C-C' in FIG. 25(a).

As illustrated in FIG. 36, the solid-state imaging element of the second embodiment includes the stacked body 200, a stacked body 300e stuck on the stacked body 200, and a stacked body 500 stuck on the stacked body 300e.

The substrate 301e on the stacked body 300e does not have any selection transistor. That is, the substrate 301e, which is a P-type silicon substrate or the like, includes the amplification transistor 310e and the reset transistor 320.

The amplification transistor 310e is, for example, a tri-gate transistor that includes a source region 311e of N type, a drain region 312e of N type, a channel 315e of P type, a gate insulating film 314e, and a gate electrode 313e. However, the amplification transistor 310e may be another multi-gate transistor such as a double-gate transistor or an all-around gate transistor. The amplification transistor 310e is formed to be larger than, for example, the amplification transistor 310 of the first embodiment by the size of the selection transistor absent on the substrate 301e.

The solid-state imaging element of the second embodiment includes the substrate 501, which is a third semiconductor substrate disposed on the side opposite to the substrate 201, which is the first semiconductor substrate, so as to face the substrate 301e, which is the second semiconductor substrate. That is, the stacked body 300e and the stacked body 500 including the substrate 501 are joined together on a plane 355 between the insulating film 360 covering the substrate 301e and the insulating film 550 covering the substrate 501.

The substrate 501, which is a P-type silicon substrate or the like, includes the selection transistor 530 that selects whether or not to transmit the electric signal amplified in the amplification transistor 510e to the wirings D1 to D4 serving as signal lines. The selection transistor 530 is disposed on the surface opposite to the surface facing the substrate 301e. The selection transistor 530, which includes, for example, a source region 531, a channel 535, and a drain region 532 that are disposed on the surface layer of the substrate 501, is formed to be a planar transistor that includes a gate insulating film 534 on the substrate 501 and a gate electrode 533 on the gate insulating film 534.

The drain region 532 of the selection transistor 530 is connected to the source region 311e of the amplification transistor 510 via a contact 532c, the wiring D2, and the contact 311c. The source region 531 of the selection transistor 530 is connected to the upper layer wiring via a contact 531c.

In the solid-state imaging element of the second embodiment, the selection transistor 530 is disposed on the substrate 501, which is a substrate separate from the substrate 301e. As a result, the amplification transistor 310e on the substrate 301e can be made much larger, whereby noise can be further reduced and transconductance gm can be further improved.

Note that, the selection transistor 530 is a planar transistor in the configuration of the second embodiment, but this is not restrictive. The selection transistor may be configured as a multi-gate transistor such as a tri-gate transistor, as in the first embodiment and others. In this case, the source region and the drain region of the selection transistor can be distributed all across the thickness direction of the substrate on which the selection transistor is formed. Therefore, the drain region and the source region 311e of the amplification transistor 310e can be connected between the facing surfaces. Furthermore, the source region and the upper layer wiring can be connected between the facing surfaces. The selection transistor may be orientated upward or downward for the connection.

Third Embodiment

Figure 37:
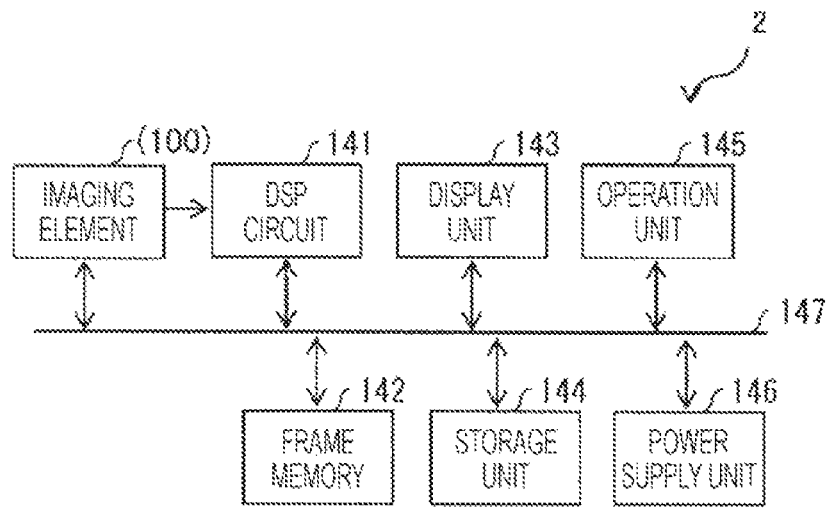
FIG. 37 is a diagram illustrating an example of a schematic configuration of an imaging system including the above-described solid-state imaging element.

FIG. 37 is a diagram illustrating an example of a schematic configuration of an imaging system 2 that includes any of the solid-state imaging elements of the first and second embodiments and modifications thereof. Accordingly, any of the solid-state imaging elements of the first and second embodiments and modifications thereof can be disposed in the imaging system 2. The following description takes the imaging system 2 that includes the solid-state imaging element 100 of the first embodiment as an example.

The imaging system 2 serving as a video recording apparatus is, for example, an imaging apparatus such as a digital still camera or a video camera, or an electronic device such as a portable terminal apparatus like a smart phone or a tablet-type terminal. The imaging system 2 includes, for example, the solid-state imaging element 100 of the first embodiment, a DSP circuit 141, a frame memory 142, a display unit 143, a storage unit 144, an operation unit 145, and a power supply unit 146. In the imaging system 2, the solid-state imaging element 100, the DSP circuit 141, the frame memory 142, the display unit 143, the storage unit 144, the operation unit 145, and the power supply unit 146 are connected to one another via a bus line 147.

The solid-state imaging element 100 outputs image data in accordance with incident light. The DSP circuit 141 is a signal processing circuit that processes image data, which is a signal output from the solid-state imaging element 100. The frame memory 142 temporarily holds, on a frame basis, the image data subjected to the processing in the DSP circuit 141. The display unit 143, which includes, for example, a panel-type display device such as a liquid crystal panel or an organic electro luminescence (EL) panel, displays a moving image or a still image captured by the solid-state imaging element 100. The storage unit 144 records the image data containing a moving image or a still image captured by the solid-state imaging element 100 on a recording medium such as a semiconductor memory or a hard disk. The operation unit 145 issues operation commands for various functions of the imaging system 2 in accordance with a user operation. The power supply unit 146 appropriately provides various power sources serving as operating power sources for the solid-state imaging element 100, the DSP circuit 141, the frame memory 142, the display unit 143, the storage unit 144, and the operation unit 145 to these supply targets.

The following describes an imaging procedure carried out in the imaging system 2.

Figure 38:
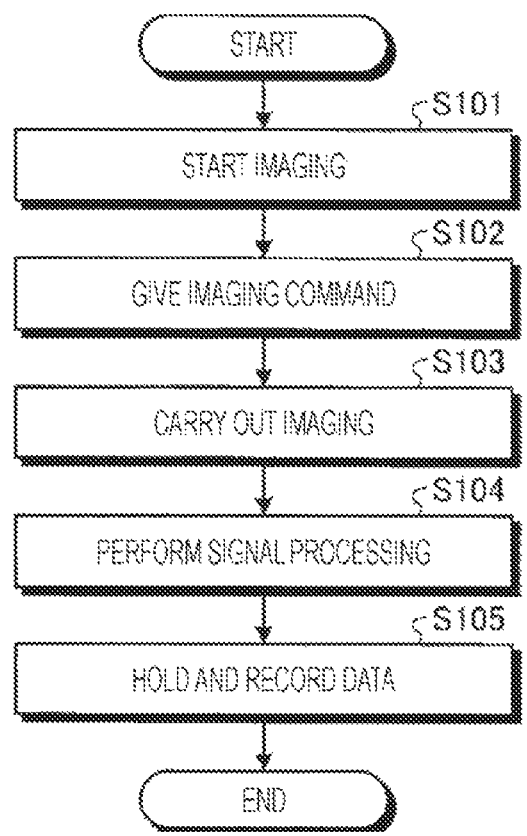
FIG. 38 is a diagram illustrating an example of an imaging procedure carried out in the imaging system in FIG. 37.

FIG. 38 shows an example flowchart for imaging operations in the imaging system 2. The imaging system 2 accepts the start of imaging caused by an operation or the like of the operation unit 145 by the user (step S101). Then, the operation unit 145 sends an imaging command to the imaging element 1 (step S102). Upon receipt of the imaging command, a system control circuit (see, for example, the system control circuit 36 in FIG. 1) of the imaging element 100 carries out imaging based on a predetermined imaging method (step S103).

The solid-state imaging element 100 outputs the image data obtained by imaging to the DSP circuit 141. The image data here refers to the data representing pixel signals for all the pixels as generated on the basis of the electric charge temporarily held in the floating diffusion FD. The DSP circuit 141 performs predetermined signal processing such as noise reduction on the basis of the image data input from the solid-state imaging element 100 (step S104). The DSP circuit 141 causes the frame memory 142 to hold the image data subjected to the predetermined signal processing, and the frame memory 142 causes the storage unit 144 to store the image data (step S105). In this way, imaging is carried out in the imaging system 2.

Since the imaging system 2 includes the smaller-sized or higher-definition solid-state imaging element 100, the smaller-sized or higher-definition imaging system 2 can be provided.

Modifications

Figure 39:
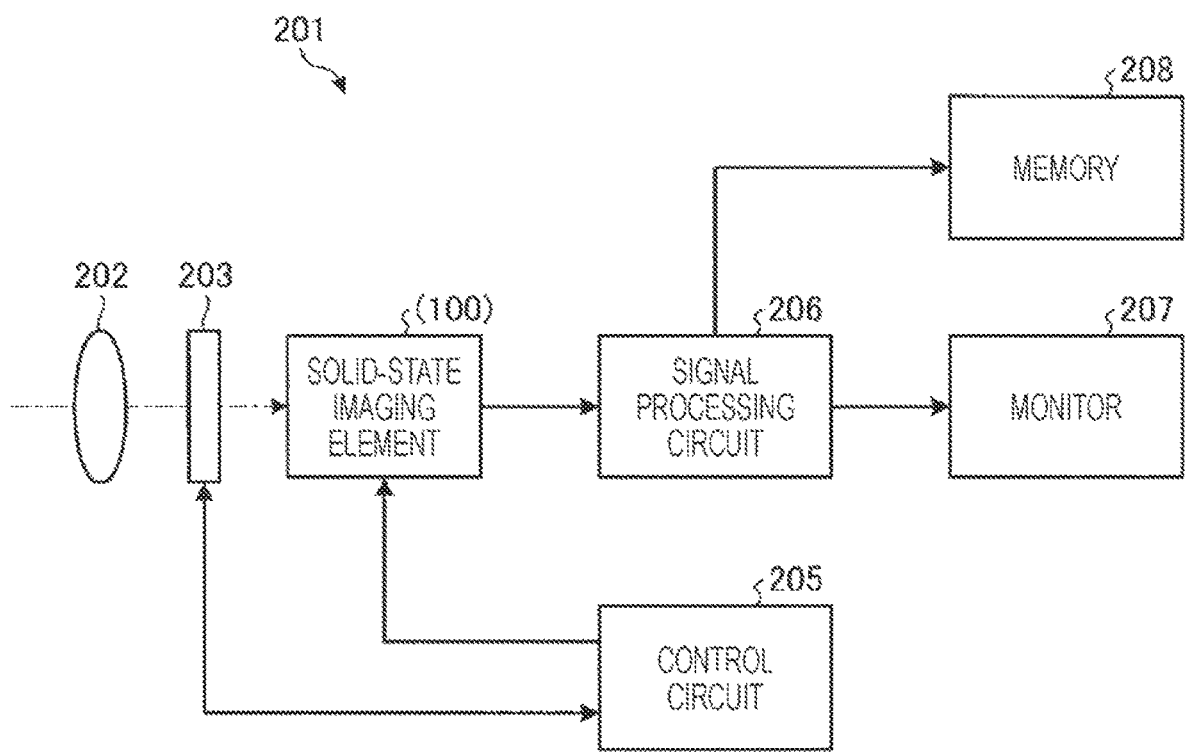
FIG. 39 is a diagram illustrating an example of a schematic configuration of an imaging system according to a modification including the above-described solid-state imaging element.

FIG. 39 is a diagram illustrating an example of a schematic configuration of an imaging system 201 according to a modification including any of the solid-state imaging elements of the first and second embodiments and modifications thereof. That is, the imaging system 201 is a modification of the imaging system 2 described above. The following description takes the imaging system 201 that includes the solid-state imaging element 100 of the first embodiment as an example.

As shown in FIG. 39, the imaging apparatus 201 includes an optical system 202, a shutter device 203, the solid-state imaging element 100, a control circuit 205, a signal processing circuit 206, a monitor 207, and a memory 208, and is capable of capturing still images and moving images.

The optical system 202, which includes one or more lenses, guides the light (incident light) from a subject to the solid-state imaging element 100 to form an image on a light receiving surface of the solid-state imaging element 100.

The shutter device 203, which is disposed between the optical system 202 and the solid-state imaging element 100, controls the time period when the light is incident on the solid-state imaging element 100 and the time period when the light is shielded, under the control of the control circuit 205.

The solid-state imaging element 100 accumulates signal charge for a certain period of time in accordance with the light to be turned into an image formed on the light receiving surface via the optical system 202 and the shutter device 203. The signal charge accumulated in the solid-state imaging element 100 is transferred in accordance with a drive signal (timing signal) supplied from the control circuit 205.

The control circuit 205 drives the solid-state imaging element 100 and the shutter device 203 by outputting drive signals for controlling the transfer operation of the solid-state imaging element 100 and the shuttering operation of the shutter device 203.

The signal processing circuit 206 performs various types of signal processing on the signal charge output from the solid-state imaging element 100. The image (image data) obtained through the signal processing performed by the signal processing circuit 206 is supplied to and displayed on the monitor 207 or supplied to and stored (recorded) in the memory 208.

The imaging system 201 configured as above is also capable of imaging on every pixel with low noise by applying the solid-state imaging element 100 thereto.

Application Example 1

The technology according to the present disclosure can be applied to various products. For example, the technology according to the present disclosure may be implemented in a device provided in any type of mobile object selected from an automobile, an electric vehicle, a hybrid electric vehicle, a motorcycle, a bicycle, a personal mobility, an airplane, a drone, a ship, a robot, and the like.

Figure 40:
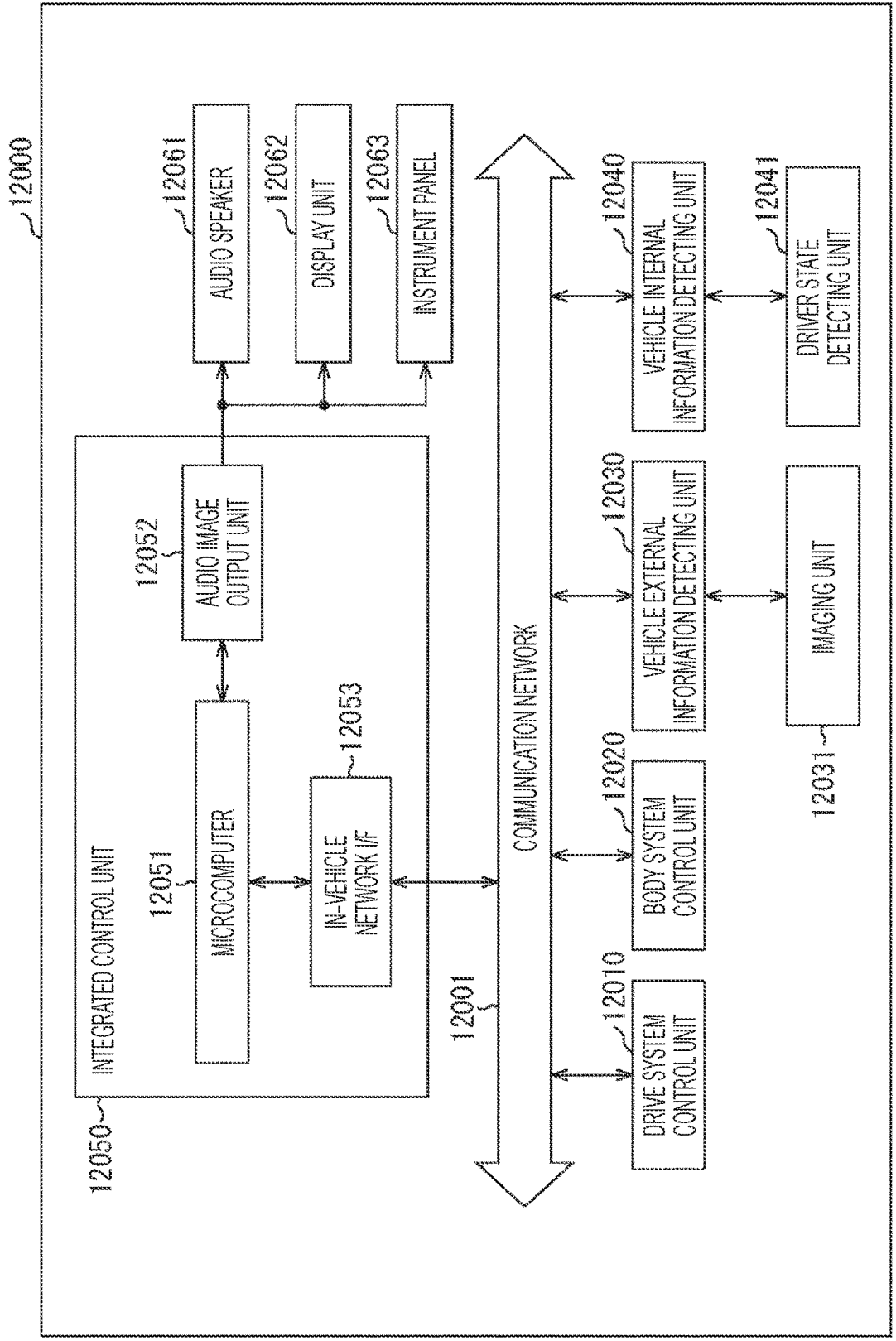
FIG. 40 is a block diagram illustrating an example of a schematic configuration of a vehicle control system.

FIG. 40 is a block diagram illustrating a schematic configuration example of a vehicle control system, which is an example of a mobile body control system to which the technology according to the present disclosure can be applied.

The vehicle control system 12000 includes a plurality of electronic control units connected via a communication network 12001. In the example illustrated in FIG. 40, the vehicle control system 12000 includes a drive system control unit 12010, a body system control unit 12020, a vehicle external information detecting unit 12030, a vehicle internal information detecting unit 12040, and an integrated control unit 12050. In addition, as a functional configuration of the integrated control unit 12050, a microcomputer 12051, an audio image output unit 12052, and an in-vehicle network interface (I/F) 12053 are illustrated.

The drive system control unit 12010 controls operations of devices related to the drive system of the vehicle in accordance with various programs. For example, the drive system control unit 12010 functions as a control device for a driving force generation device for generating a driving force for an internal combustion engine, a driving motor, or the like, of the vehicle, a driving force transmission mechanism for transmitting a driving force to a wheel, a steering mechanism for adjusting a steering angle of the vehicle, a braking device for generating a braking force of the vehicle, and the like.

The body system control unit 12020 controls operations of various devices provided in the vehicle body in accordance with various programs. For example, the body system control unit 12020 functions as a control device for a keyless entry system, a smart key system, a power window device, or for various lamps such as a head lamp, a back lamp, a brake lamp, a blinker, a fog lamp, or the like. In this case, radio waves transmitted from a mobile device that substitutes for a key or signals of various switches may be input to the body system control unit 12020. The body system control unit 12020 accepts the radio waves or signals that have been input, and controls the door lock device, the power window device, the lamps, and the like of the vehicle.

The vehicle external information detecting unit 12030 detects information regarding the outside of the vehicle in which the vehicle control system 12000 is installed. For example, an imaging unit 12031 is connected to the vehicle external information detecting unit 12030. The vehicle external information detecting unit 12030 causes the imaging unit 12031 to capture an image of the outside of the vehicle and receives the captured image. On the basis of the received image, the vehicle external information detecting unit 12030 may perform a process of detecting an object, such as a person, a vehicle, an obstacle, a sign, or a character on a road surface, or a process of detecting a distance.

The imaging unit 12031 is an optical sensor that receives light and outputs an electric signal corresponding to the amount of the light received. The imaging unit 12031 can output electric signals representing an image, and also can output electric signals representing information regarding distance measurement. Furthermore, the light to be received by the imaging unit 12031 may be visible light or invisible light such as infrared light.

The vehicle internal information detecting unit 12040 detects information regarding the inside of the vehicle. For example, a driver state detecting unit 12041 that detects the state of the driver is connected to the vehicle internal information detecting unit 12040. The driver state detecting unit 12041 may include, for example, a camera that captures images of the driver. On the basis of the detection information that is input from the driver state detecting unit 12041, the vehicle internal information detecting unit 12040 may calculate the degree of fatigue or the degree of concentration of the driver or may determine whether or not the driver is dozing.

The microcomputer 12051 is capable of calculating a control target value for the driving force generation device, the steering mechanism, or the braking device on the basis of the information regarding the inside or outside of the vehicle as acquired by the vehicle external information detecting unit 12030 or the vehicle internal information detecting unit 12040, and of outputting a control command to the drive system control unit 12010. For example, the microcomputer 12051 is capable of performing cooperative control for fulfilling functions of advanced driver assistance systems (ADAS) including collision avoidance or shock mitigation of the vehicle, following travel based on an inter-vehicle distance, vehicle-speed maintained traveling, vehicle collision warning, vehicle lane departure warning, and the like.

Furthermore, the microcomputer 12051 is capable of performing cooperative control for automated driving and the like in which the vehicle autonomously travels without relying on driver's operations, by controlling the driving force generation device, the steering mechanism, the braking device, or the like on the basis of the information regarding surroundings of the vehicle as acquired by the vehicle external information detecting unit 12030 or the vehicle internal information detecting unit 12040.

Furthermore, the microcomputer 12051 is capable of outputting a control command to the body system control unit 12020 on the basis of the information regarding the outside of the vehicle as acquired by the vehicle external information detecting unit 12030. For example, the microcomputer 12051 is capable of performing cooperative control to prevent dazzling by, for example, controlling the headlamps in accordance with the position of a preceding vehicle or oncoming vehicle detected by the vehicle external information detecting unit 12030 to switch from the high beam to the low beam.

The audio image output unit 12052 transmits an output signal, which is at least one of a sound or an image, to an output device that can visually or auditorily give notification of information to an occupant of the vehicle or to the outside of the vehicle. In the example in FIG. 40, an audio speaker 12061, a display unit 12062, and an instrument panel 12063 are illustrated as the output device. The display unit 12062 may include, for example, at least one of an on-board display or a head-up display.

Figure 41:
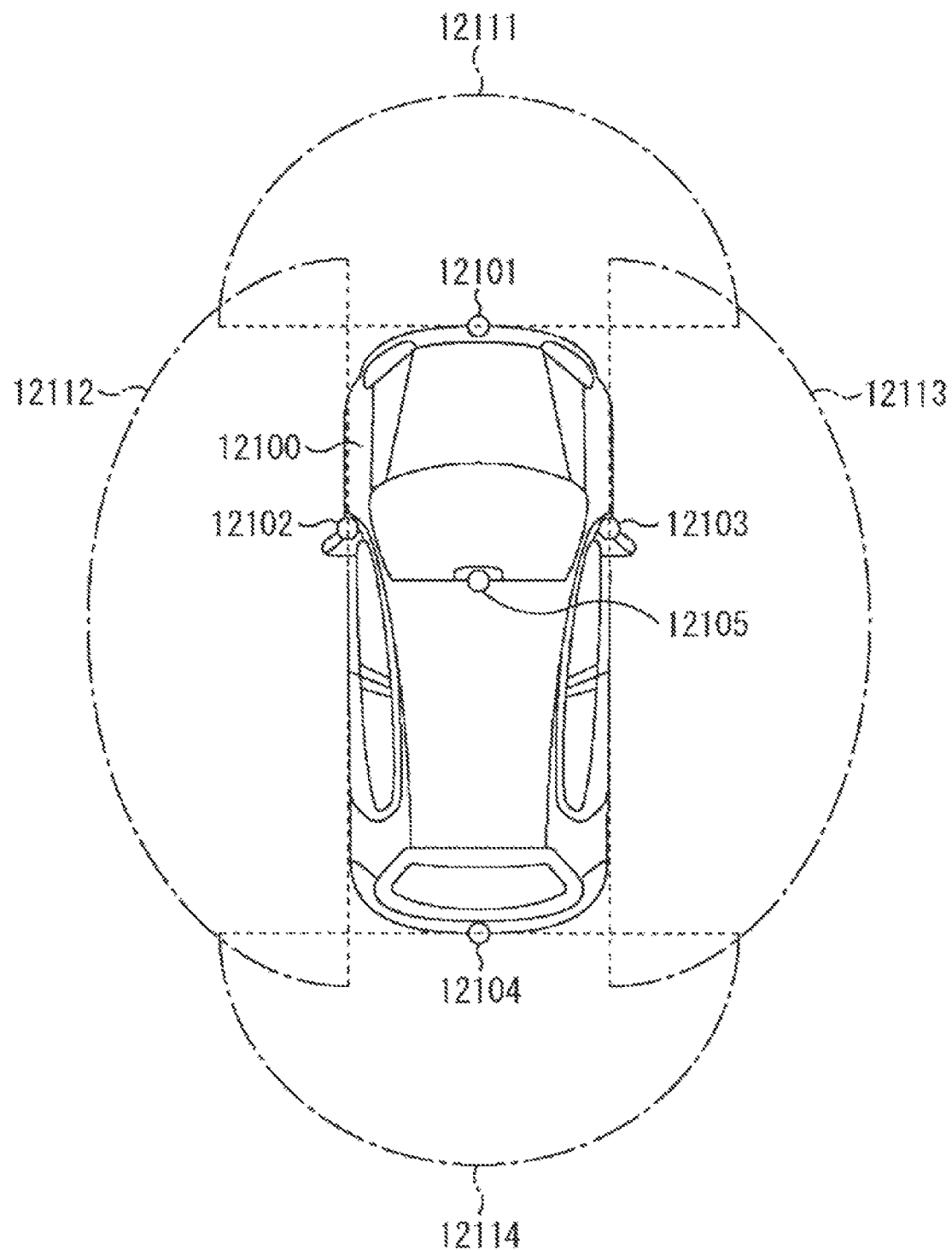
FIG. 41 is an explanatory diagram illustrating an example of the positions where an imaging unit and a vehicle external information detecting unit are installed.

FIG. 41 is diagram showing example positions at which the imaging unit 12031 is disposed.

In FIG. 41, the vehicle 12100 includes imaging units 12101, 12102, 12103, 12104, and 12105 as the imaging unit 12031.

The imaging units 12101 to 12105 are disposed in, for example, a front nose, a side mirror, a rear bumper, a back door, an upper portion of a windshield in a vehicle interior, and the like of the vehicle 12100. The imaging unit 12101 disposed in the front nose and the imaging unit 12105 disposed in an upper portion of the windshield in the vehicle interior mainly acquire images of a region in front of the vehicle 12100. The imaging units 12102 and 12103 disposed in the side mirrors mainly acquire images of a region on either side of the vehicle 12100. The imaging unit 12104 disposed in the rear bumper or the back door mainly acquires images of a region on the back of the vehicle 12100. Images of a front region acquired by the imaging units 12101 and 12105 are mainly used for detecting a preceding vehicle, a pedestrian, an obstacle, a traffic signal, a traffic sign, a lane, or the like.

Note that FIG. 41 shows an example of imaging ranges of the imaging units 12101 to 12104. An imaging range 12111 indicates an imaging range of the imaging unit 12101 disposed in the front nose, imaging ranges 12112 and 12113 indicate imaging ranges of the imaging units 12102 and 12103, respectively, disposed in the side mirrors, and an imaging range 12114 indicates an imaging range of the imaging unit 12104 disposed in the rear bumper or the back door. For example, pieces of image data captured by the imaging units 12101 to 12104 are superimposed so that a bird's-eye image of the vehicle 12100 seen from above can be obtained.

At least one of the imaging units 12101 to 12104 may have a function of acquiring distance information. For example, at least one of the imaging units 12101 to 12104 may be a stereo camera including a plurality of imaging elements or may be an imaging element having pixels to detect a phase difference.

For example, by obtaining a distance to each of solid objects in the imaging ranges 12111 to 12114 and a temporal change in the distance, that is, relative speed to the vehicle 12100, on the basis of the distance information acquired from the imaging units 12101 to 12104, the microcomputer 12051 can extract a solid object that is on the traveling route of the vehicle 12100, positioned closest to the vehicle 12100, and traveling at a predetermined speed, for example, equal to or higher than 0 km/h, in a direction substantially the same as the direction in which the vehicle 12100 is traveling, as a preceding vehicle. Moreover, the microcomputer 12051 can set a distance between vehicles to be secured beforehand in front of the preceding vehicle and perform automatic brake control including following stop control, automatic acceleration control including following start control, and the like. In this way, cooperative control can be performed for automated driving and the like by which the vehicle autonomously travels without relying on driver's operations.

For example, on the basis of the distance information acquired from the imaging units 12101 to 12104, the microcomputer 12051 can classify solid object data regarding solid objects into two-wheeled vehicle, regular vehicle, large vehicle, pedestrian, and other solid objects such as a utility pole, to extract data, and can use the extracted data to automatically avoid an obstacle. For example, the microcomputer 12051 identifies an obstacle around the vehicle 12100 either as an obstacle that can be visually recognized by the driver of the vehicle 12100 or as an obstacle that is difficult for the driver to visually recognize. Then, the microcomputer 12051 determines a collision risk indicating the degree of risk of collision with each obstacle and, when the collision risk is equal to or higher than a predetermined value and the vehicle can possibly collide with the obstacle, the microcomputer 12051 can assist driving for collision avoidance by outputting a warning to the driver via the audio speaker 12061 or the display unit 12062 or by performing forced deceleration or avoidance steering via the drive system control unit 12010.

At least one of the imaging units 12101 to 12104 may be an infrared camera that detects infrared light. For example, the microcomputer 12051 can recognize a pedestrian by determining whether or not a pedestrian is present in images captured by the imaging units 12101 to 12104. Recognition of a pedestrian is performed by, for example, a procedure of extracting feature points in images captured by the imaging units 12101 to 12104 as an infrared camera and a procedure of performing a pattern matching process on a series of feature points indicating the contour of an object to determine whether or not the object is a pedestrian. When the microcomputer 12051 determines that a pedestrian is present in images captured by the imaging units 12101 to 12104 and recognizes the pedestrian, the audio image output unit 12052 causes the display unit 12062 to display a superimposed rectangular outline to emphasize the recognized pedestrian. Furthermore, the audio image output unit 12052 may cause the display unit 12062 to display an icon or the like indicating the pedestrian at a desired position.

The foregoing has described an example of the mobile body control system to which the technology according to the present disclosure may be applied. The technology according to the present disclosure may be applied to the imaging unit 12031 among the above-described components. Specifically, the solid-state imaging element according to any of the above-described first and second embodiments and modifications thereof can be applied to the imaging unit 12031. Applying the technology according to the present disclosure to the imaging unit 12031 provides high-definition and low-noise captured images. Therefore, the mobile body control system can perform control with high precision using the captured images.

Application Example 2

Figure 42:
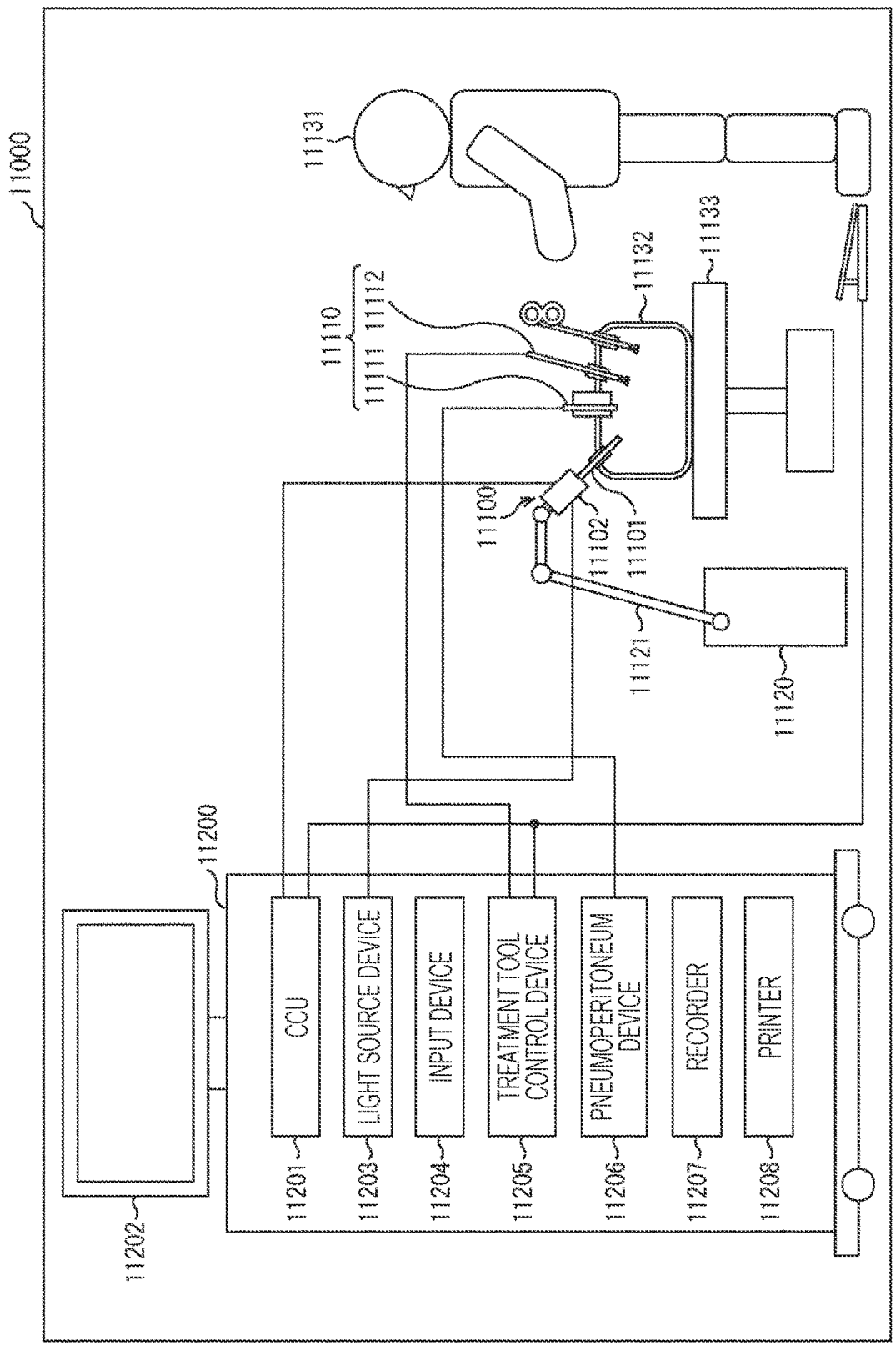
FIG. 42 is a diagram illustrating an example of a schematic configuration of an endoscopic surgery system.

FIG. 42 is a diagram illustrating a schematic configuration example of an endoscopic surgery system to which the technology according to the present disclosure can be applied.

FIG. 42 shows that an operator 11131 such as a surgeon is performing surgery on a patient 11132 on an examination table 11133 using an endoscopic surgery system 11000. As illustrated in the figure, the endoscopic surgery system 11000 includes an endoscope 11100, other surgical tools 11110 such as a pneumoperitoneum tube 11111 and an energy treatment tool 11112, a support arm device 11120 that supports the endoscope 11100, and a cart 11200 containing various devices for endoscopic surgery.

The endoscope 11100 includes a lens barrel 11101 whose tip is to be inserted into a body cavity of the patient 11132 by a predetermined length and a camera head 11102 connected to the base end of the lens barrel 11101. In the illustrated example, the endoscope 11100 is formed to be a so-called rigid scope having the lens barrel 11101 being rigid, but the endoscope 11100 may be formed to be a so-called flexible scope having a flexible lens barrel.

The tip of the lens barrel 11101 is provided with an opening into which an objective lens is fitted. A light source device 11203 is connected to the endoscope 11100. The light generated by the light source device 11203 is guided to the tip of the lens barrel 11101 by a light guide extending inside the lens barrel 11101, and is shed on the observation target in the body cavity of the patient 11132 via the objective lens.

Note that the endoscope 11100 may be a forward-viewing endoscope, an oblique-viewing endoscope, or a side-viewing endoscope.

The camera head 11102 contains an optical system and any of the solid-state imaging elements according to the above-described first and second embodiments and modifications thereof. The light reflected from the observation target, that is, the observation light, is condensed by the optical system onto the solid-state imaging element. The solid-state imaging element performs photoelectric conversion on the observation light to generate an electric signal corresponding to the observation light, that is, an image signal corresponding to the observation image. The image signal, which is treated as RAW data, is sent to a camera control unit (CCU) 11201.

The CCU 11201, which includes a central processing unit (CPU), a graphics processing unit (GPU), and the like, comprehensively controls operations of the endoscope 11100 and a display device 11202. Moreover, the CCU 11201 receives an image signal from the camera head 11102 and performs various types of image processing on the image signal for displaying an image based on the image signal, such as development processing (demosaicing).

Under the control of the CCU 11201, the display device 11202 displays an image based on the image signal that has undergone image processing by the CCU 11201.

The light source device 11203, which includes a light source such as a light emitting diode (LED), supplies irradiation light to the endoscope 11100 when a surgical site is imaged.

An input device 11204 is an input interface for the endoscopic surgery system 11000. The user can input various types of information and instructions to the endoscopic surgery system 11000 via the input device 11204. For example, the user inputs an instruction or the like to change imaging conditions such as the type of irradiation light, magnification, and focal length provided by the endoscope 11100.

The treatment tool control device 11205 controls driving of the energy treatment tool 11112 for cauterizing or incising a tissue, blocking a blood vessel, or the like. For the purpose of securing a field of view of the endoscope 11100 and securing a working space for the operator 11131, the pneumoperitoneum device 11206 sends gas into the body cavity of the patient 11132 via the pneumoperitoneum tube 11111 to inflate the body cavity. The recorder 11207 is a device capable of recording various types of information regarding the surgery. The printer 11208 is a device capable of printing various types of information regarding the surgery in various forms such as text, images, and graphs.

Note that the light source device 11203 that supplies irradiation light to the endoscope 11100 when the surgical site is imaged may include a white light source that includes, for example, an LED, a laser light source, or a combination thereof. In a case where the white light source includes a combination of RGB laser light sources, the output intensity of each wavelength in each color and the output timing can be controlled with high accuracy. Therefore, the white balance of a captured image can be adjusted in the light source device 11203. Furthermore, in this case, images corresponding to R, G, and B can be captured by time division by irradiating the observation target with laser light beams from their corresponding RGB laser light sources by time division and controlling driving of the solid-state imaging element in the camera head 11102 in synchronization with the irradiation timing. By using this method, a color image can be obtained without providing the solid-state imaging element with a color filter.

In addition, the light source device 11203 may be controlled to be driven so as to change the intensity of the output light at predetermined time intervals. By acquiring images by time division and combining the images through controlled driving of the solid-state imaging element in the camera head 11102 in synchronization with the timing when the light intensity is changed, a high dynamic-range image can be generated without so-called blown-out highlights or blocked-up shadows.

Furthermore, the light source device 11203 may be configured to be capable of supplying light of a predetermined wavelength band suitable for special light observation. Special light observation includes, for example, carrying out so-called narrow band imaging, which uses dependency of a body tissue on wavelengths for light absorption. In narrow band imaging, the light having a narrower band than white light, which is the incident light for usual observations, is shed on a body tissue to image a certain tissue, such as blood vessels in a mucous membrane surface layer, with high contrast. Special light observation may also include fluorescence observation in which an image is obtained by fluorescence generated by emitting excitation light. Fluorescence observation may include, for example, auto-fluorescence observation in which a body tissue is irradiated with excitation light to observe fluorescence produced in the body tissue, or obtaining a fluorescence image by locally injecting a reagent such as indocyanine green (ICG) into a body tissue while irradiating the body tissue with the excitation light corresponding to the fluorescence wavelength of the reagent. The light source device 11203 may be configured to be capable of supplying at least one of the narrow band light or the excitation light suitable for such special light observation.

Figure 43:
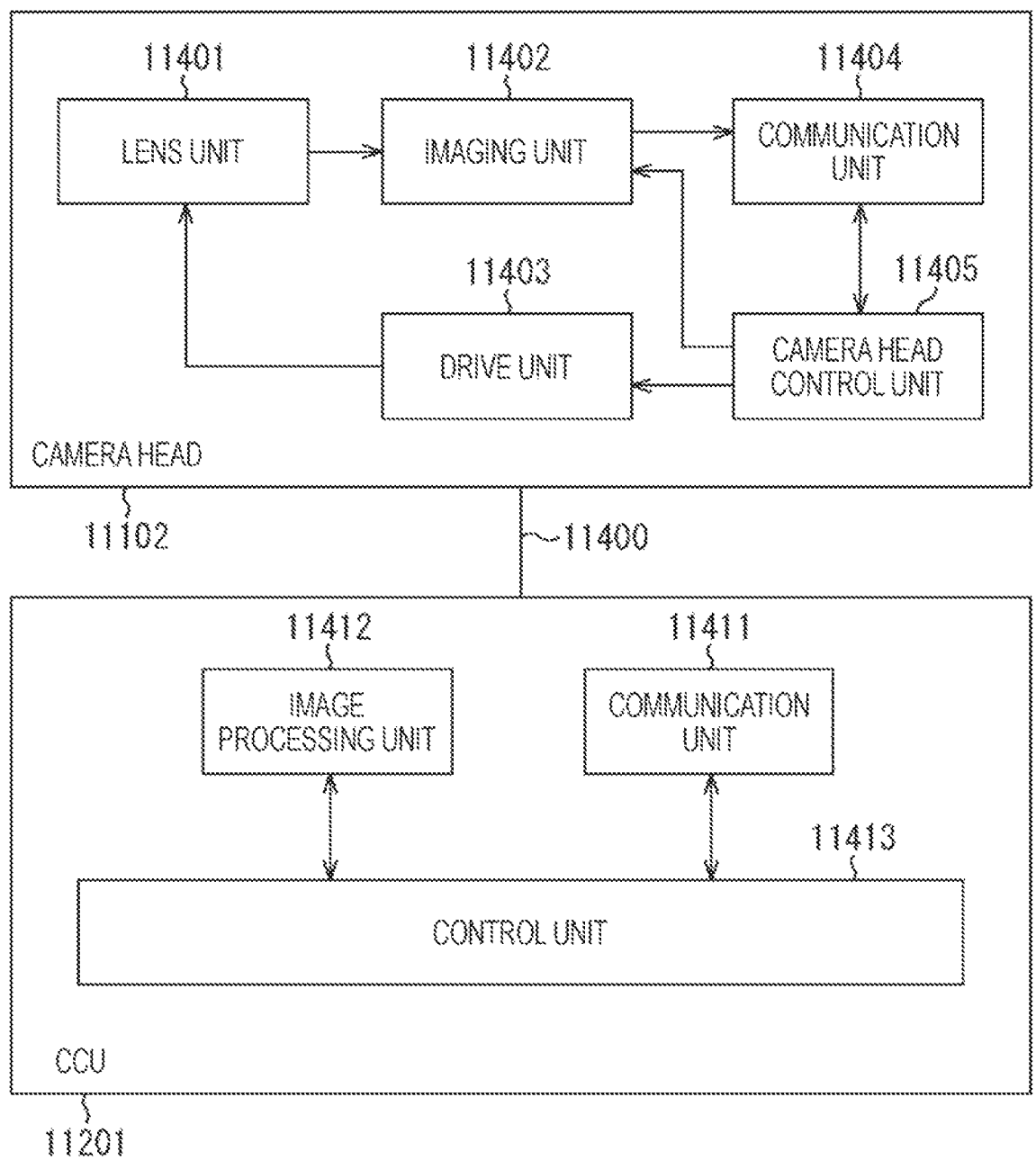
FIG. 43 is a block diagram illustrating an example of function configurations of a camera head and a CCU.

FIG. 43 is a block diagram illustrating an example of functional configurations of the camera head 11102 and the CCU 11201 shown in FIG. 42.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicatively connected to each other by a transmission cable 11400.

The lens unit 11401 is an optical system provided in a portion connected to the lens barrel 11101. The observation light taken from the tip of the lens barrel 11101 is guided to the camera head 11102 and enters the lens unit 11401. The lens unit 11401 includes a plurality of combined lenses including a zoom lens and a focus lens.

The imaging unit 11402 includes a solid-state imaging element. The solid-state imaging element included in the imaging unit 11402 may be one element of so-called single-plate type or a plurality of elements of so-called multi-plate type. In a case where the imaging unit 11402 includes multi-plate type solid-state imaging elements, the individual solid-state imaging elements may generate image signals respectively corresponding to R, G, and B and the image signals may be combined so that a color image can be obtained. Alternatively, the imaging unit 11402 may include a pair of solid-state imaging elements for acquiring an image signal for the right eye and an image signal for the left eye to support three-dimensional (3D) display. The 3D display allows the operator 11131 to more accurately know the depth of a living tissue in a surgical site. Note that, in a case where the imaging unit 11402 includes multi-plate type solid-state imaging elements, a plurality of the lens units 11401 may be provided corresponding to the individual solid-state imaging elements.

In addition, the imaging unit 11402 may not necessarily be provided in the camera head 11102. For example, the imaging unit 11402 may be provided inside the lens barrel 11101 immediately behind the objective lens.

The drive unit 11403, which includes an actuator, causes the zoom lens and the focus lens in the lens unit 11401 to move by a predetermined distance along the optical axis under the control of the camera head control unit 11405. As a result, the magnification and focus of an image captured by the imaging unit 11402 may be appropriately adjusted.

The communication unit 11404 includes a communication device for sending and receiving various types of information to and from the CCU 11201. The communication unit 11404 sends the image signal obtained from the imaging unit 11402 and treated as RAW data to the CCU 11201 via the transmission cable 11400.

Furthermore, the communication unit 11404 receives control signals for controlling driving of the camera head 11102 from the CCU 11201 and supplies the control signals to the camera head control unit 11405. Such control signals include, for example, information regarding imaging conditions such as information indicating that a frame rate of captured images is specified, information indicating that an exposure value applied during imaging is specified, and information indicating that magnification and focus of a captured image are specified.

Note that the above-mentioned imaging conditions including frame rate, exposure value, magnification, and focus may be specified by the user as appropriate, or may be automatically set by the control unit 11413 in the CCU 11201 on the basis of the acquired image signals. In the latter case, the endoscope 11100 should include the so-called auto exposure (AE) function, auto focus (AF) function, and auto white balance (AWB) function.

The camera head control unit 11405 controls driving of the camera head 11102 on the basis of control signals received from the CCU 11201 via the communication unit 11404.

The communication unit 11411 includes a communication device for sending and receiving various types of information to and from the camera head 11102. The communication unit 11411 receives an image signal sent from the camera head 11102 via the transmission cable 11400.

Furthermore, the communication unit 11411 sends a control signal for controlling driving of the camera head 11102 to the camera head 11102. Image signals and control signals can be transmitted by electric communication, optical communication, or the like.

The image processing unit 11412 performs various types of image processing on an image signal, which is RAW data sent from the camera head 11102.

The control unit 11413 performs various types of control related to imaging of a surgical site or the like by the endoscope 11100 and display of a captured image obtained by imaging the surgical site or the like. For example, the control unit 11413 generates a control signal for controlling driving of the camera head 11102.

In addition, the control unit 11413 causes the display device 11202 to display a captured image showing the surgical site or the like, on the basis of the image signal that has undergone image processing by the image processing unit 11412. During the process, the control unit 11413 may recognize various objects in the captured image using various image recognition techniques. For example, the control unit 11413 can recognize the surgical tool 11110 such as forceps, a specific site in a living body, bleeding, a mist produced when the energy treatment tool 11112 is used, and the like, by detecting edge shapes, colors, and the like of objects included in the captured image. When causing the display device 11202 to display the captured image, the control unit 11413 may use the recognition result to cause various types of surgery assisting information to be superimposed on the image of the surgical site. With the surgery assisting information superimposed on the display and presented to the operator 11131, the operator 11131 bears less burden and can reliably proceed with the surgery.

The transmission cable 11400 connecting the camera head 11102 and the CCU 11201 is an electric signal cable supporting electric signal communication, an optical fiber supporting optical communication, or a composite cable thereof.

In the example illustrated here, the transmission cable 11400 is used for wired communication; however, communication between the camera head 11102 and the CCU 11201 may be carried out wirelessly.

The foregoing has described an example of the endoscopic surgery system to which the technology according to the present disclosure may be applied. The technology according to the present disclosure may be applied to the imaging unit 11402 provided in the camera head 11102 of the endoscope 11100 among the above-described components. By applying the technology according to the present disclosure to the imaging unit 11402, the imaging unit 11402 can be made smaller in size or have higher definition and therefore, the endoscope 11100 being small-sized or having high definition can be provided.

Other Embodiments

Note that the effects described herein are examples only and are not restrictive, and other effects may be provided.

Furthermore, the present technology may have the following configurations.

(1)

A solid-state imaging element including:
  a first semiconductor substrate that includes a floating diffusion that temporarily holds an electric signal output from a photoelectric conversion element; and
  a second semiconductor substrate that faces the first semiconductor substrate, in which
  the second semiconductor substrate includes a first transistor disposed on a side facing the first semiconductor substrate, the first transistor including:
    a channel extending along a thickness direction of the second semiconductor substrate; and
    a multi-gate extending along the thickness direction of the second semiconductor substrate and sandwiching the channel, and
  the multi-gate of the first transistor is connected to the floating diffusion.

(2)

The solid-state imaging element according to (1), further including:
  a contact that connects a surface of the multi-gate and a surface of the floating diffusion, the surface of the multi-gate facing the surface of the floating diffusion.

(3)

The solid-state imaging element according to (1) or (2), in which
  the second semiconductor substrate includes a second transistor disposed on a side facing the first semiconductor substrate, the second transistor including a source region, and
  the multi-gate of the first transistor is connected to the source region of the second transistor.

(4)

The solid-state imaging element according to any one of (1) to (3), in which
  the second semiconductor substrate includes:
    a source region that extends from one surface side of the second semiconductor substrate and reaches another surface side of the second semiconductor substrate; and
    a drain region that extends from one surface side of the second semiconductor substrate and reaches another surface side of the second semiconductor substrate, and
  the source region is connected to a signal line that transmits the electric signal from a surface side of the second semiconductor substrate, the surface side being opposite to a surface facing the first semiconductor substrate, and
  the drain region is connected to a power supply potential from a surface side of the second semiconductor substrate, the surface side being opposite to the surface facing the first semiconductor substrate.

(5)

The solid-state imaging element according to (1) or (2), in which
  the second semiconductor substrate includes a second transistor disposed on a side facing the first semiconductor substrate, the second transistor including:
    a channel extending along a thickness direction of the second semiconductor substrate; and
    a multi-gate extending along the thickness direction of the second semiconductor substrate and sandwiching the channel, and
  the multi-gate of the second transistor is connected to a signal line that transmits the electric signal from a surface side of the second semiconductor substrate, the surface side being opposite to a surface facing the first semiconductor substrate.

(6)

The solid-state imaging element according to (5), in which
  the first transistor is an amplification transistor that amplifies the electric signal that is output from the photoelectric conversion element, and
  the second transistor is a reset transistor that resets a potential of the multi-gate of the amplification transistor to a power supply potential.

(7)

The solid-state imaging element according to (6), in which
  the second semiconductor substrate includes a selection transistor that selects whether or not to transmit the electric signal amplified in the amplification transistor to the signal line.

(8)

The solid-state imaging element according to (6), further including:
  a third semiconductor substrate disposed on a side opposite to the first semiconductor substrate, the third semiconductor substrate facing the second semiconductor substrate, in which the third semiconductor substrate includes a selection transistor that selects whether or not to transmit the electric signal amplified in the amplification transistor to the signal line.

(9)

The solid-state imaging element according to any one of (6) to (8), in which the first semiconductor substrate includes a transfer transistor that transfers the electric signal to the amplification transistor, the electric signal being output from the photoelectric conversion element.

(10)

A video recording apparatus including:

a solid-state imaging element;

an optical system that takes incident light from a subject to form an image on an imaging area of the solid-state imaging element; and a signal processing circuit that performs processing on an output signal from the solid-state imaging element, in which the solid-state imaging element includes:

a first semiconductor substrate that includes a floating diffusion that temporarily holds an electric signal output from a photoelectric conversion element; and a second semiconductor substrate that faces the first semiconductor substrate, the second semiconductor substrate includes a first transistor disposed on a side facing the first semiconductor substrate, the first transistor including:

a channel extending along a thickness direction of the second semiconductor substrate; and a multi-gate extending along the thickness direction of the second semiconductor substrate and sandwiching the channel, and the multi-gate of the first transistor is connected to the floating diffusion.

REFERENCE SIGNS LIST

100 Solid-state imaging element
200, 300, 400 Stacked body
201, 301, 401 Substrate
203 Photoelectric conversion element
204 HAD
220 Transfer transistor
221 FD
221c, 312c, 322c, 323c, 331c Contact
310 Amplification transistor
311, 321, 331 Source region
312, 322, 332 Drain region
313 Gate electrode
313d Wiring
320 Reset transistor
330 Selection transistor

What is claimed is:

1. A solid-state imaging element, comprising:
a first semiconductor substrate that includes a floating diffusion that temporarily holds an electric signal output from a photoelectric conversion element; and
a second semiconductor substrate that faces the first semiconductor substrate, wherein
the second semiconductor substrate includes:
a first transistor disposed on a side facing the first semiconductor substrate, the first transistor including:
a first channel extending along a thickness direction of the second semiconductor substrate; and
a first multi-gate extending along the thickness direction of the second semiconductor substrate and sandwiching the first channel, wherein a first contact is connected to the first multi-gate at the side facing the first semiconductor substrate; and
a second transistor disposed on the side facing the first semiconductor substrate, the second transistor including:
a second channel extending along the thickness direction of the second semiconductor substrate; and
a second multi-gate extending along the thickness direction of the second semiconductor substrate and sandwiching the second channel, wherein a second contact is connected to the second multi-gate at a side opposite the side facing the first semiconductor substrate.

2. The solid-state imaging element according to claim 1, wherein the first contact connects a surface of the first multi-gate and a surface of the floating diffusion, the surface of the first multi-gate facing the surface of the floating diffusion.

3. The solid-state imaging element according to claim 1, wherein
the first multi-gate of the first transistor is connected to a source region of the second transistor.

4. The solid-state imaging element according to claim 1, wherein
the second semiconductor substrate includes:
a source region of the first transistor that extends from one surface side of the second semiconductor substrate and reaches another surface side of the second semiconductor substrate; and
a drain region of the first transistor that extends from one surface side of the second semiconductor substrate and reaches another surface side of the second semiconductor substrate, and
the source region of the first transistor is connected to a signal line that transmits the electric signal from a surface side of the second semiconductor substrate, the surface side being opposite to a surface facing the first semiconductor substrate, and
the drain region of the first transistor is connected to a power supply potential from a surface side of the second semiconductor substrate, the surface side being opposite to the surface facing the first semiconductor substrate.

5. The solid-state imaging element according to claim 1, wherein
that the second contact transmits an electric signal from a surface side of the second semiconductor substrate, the surface side being opposite to a surface facing the first semiconductor substrate.

6. The solid-state imaging element according to claim 5, wherein
the first transistor is an amplification transistor that amplifies the electric signal that is output from the photoelectric conversion element, and
the second transistor is a reset transistor that resets a potential of the multi-gate of the amplification transistor to a power supply potential.

7. The solid-state imaging element according to claim 6, wherein
the second semiconductor substrate includes a selection transistor that selects whether or not to transmit the electric signal amplified in the amplification transistor to a signal line.

8. The solid-state imaging element according to claim 6, further comprising:
a third semiconductor substrate disposed on a side opposite to the first semiconductor substrate, the third semiconductor substrate facing the second semiconductor substrate, wherein
the third semiconductor substrate includes a selection transistor that selects whether or not to transmit the electric signal amplified in the amplification transistor to a signal line.

9. The solid-state imaging element according to claim 6, wherein
the first semiconductor substrate includes a transfer transistor that transfers the electric signal to the amplification transistor, the electric signal being output from the photoelectric conversion element.

10. The solid-state imaging element according to claim 1, wherein the first channel includes a part of the second semiconductor substrate.

11. The solid-state imaging element according to claim 10, wherein a first gate insulating film is interposed between the first channel and the first multi-gate.

12. The solid-state imaging element according to claim 11, wherein the first multi-gate is connected on three sides to the first channel via the first gate insulating film.

13. The solid-state imaging element according to claim 10, wherein the second channel includes a part of the second semiconductor substrate.

14. The solid-state imaging element according to claim 13, wherein a second gate insulating film is interposed between the second channel and the second multi-gate.

15. The solid-state imaging element according to claim 14, wherein the second multi-gate is connected on three sides to the second channel via the second gate insulating film.

16. The solid-state imaging element according to claim 1, wherein the first multi-gate is connected to a source region of the second transistor.

17. The solid-state imaging element according to claim 16, wherein the first multi-gate extends towards the second transistor to form a wiring connecting the first multi-gate and the source region of the second transistor.

18. The solid-state imaging element according to claim 1, wherein the first transistor is configured as a tri-gate transistor.

19. The solid-state imaging element according to claim 18, wherein the second transistor is configured as a tri-gate transistor.

20. A video recording apparatus comprising:
a solid-state imaging element;
an optical system that takes incident light from a subject to form an image on an imaging area of the solid-state imaging element; and
a signal processing circuit that performs processing on an output signal from the solid-state imaging element, wherein
the solid-state imaging element includes:
a first semiconductor substrate that includes a floating diffusion that temporarily holds an electric signal output from a photoelectric conversion element; and
a second semiconductor substrate that faces the first semiconductor substrate,
the second semiconductor substrate includes a first transistor disposed on a side facing the first semiconductor substrate, the first transistor including:
a first channel extending along a thickness direction of the second semiconductor substrate; and
a first multi-gate extending along the thickness direction of the second semiconductor substrate and sandwiching the first channel, wherein a first contact is connected to the first multi-gate at the side facing the first semiconductor substrate; and
the second semiconductor substrate includes a second transistor disposed on the side facing the first semiconductor substrate, the second transistor including:
a second channel extending along the thickness direction of the second semiconductor substrate; and
a second multi-gate extending along the thickness direction of the second semiconductor substrate and sandwiching the second channel, wherein a second contact is connected to the second multi-gate at a side opposite the side facing the first semiconductor substrate.

* * * * *